United States Patent
Yamazaki et al.

(10) Patent No.: US 11,018,161 B2
(45) Date of Patent: May 25, 2021

(54) DISPLAY DEVICE AND MANUFACTURING METHOD THEREOF

(71) Applicant: Semiconductor Energy Laboratory Co., Ltd., Atsugi (JP)

(72) Inventors: Shunpei Yamazaki, Setagaya (JP); Kei Takahashi, Isehara (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 13 days.

(21) Appl. No.: 16/471,962

(22) PCT Filed: Jan. 5, 2018

(86) PCT No.: PCT/IB2018/050073
§ 371 (c)(1),
(2) Date: Jun. 20, 2019

(87) PCT Pub. No.: WO2018/130920
PCT Pub. Date: Jul. 19, 2018

(65) Prior Publication Data
US 2020/0127011 A1    Apr. 23, 2020

(30) Foreign Application Priority Data

Jan. 16, 2017 (JP) .............................. JP2017-004905
Jan. 27, 2017 (JP) .............................. JP2017-012927

(51) Int. Cl.
*H01L 27/12*    (2006.01)
*H01L 29/24*    (2006.01)
(Continued)

(52) U.S. Cl.
CPC .......... *H01L 27/124* (2013.01); *G02F 1/1368* (2013.01); *G02F 1/136286* (2013.01);
(Continued)

(58) Field of Classification Search
CPC ..................................................... H01L 27/124
See application file for complete search history.

(56) References Cited

U.S. PATENT DOCUMENTS 6,127,998 A    10/2000    Ichikawa et al.
8,395,153 B2    3/2013    Yamazaki et al.
(Continued)

FOREIGN PATENT DOCUMENTS

CN    102116982 A    7/2011
DE    112010006031    8/2013
(Continued)

OTHER PUBLICATIONS

International Search Report (Application No. PCT/IB2018/050073) dated Apr. 3, 2018.
(Continued)

*Primary Examiner* — Omar F Mojaddedi
(74) *Attorney, Agent, or Firm* — Robinson Intellectual Property Law Office; Eric J. Robinson

(57) ABSTRACT

A display device that is suitable for increasing its size is provided.
The display device includes first to third wirings, a first transistor, first to third conductive layers, and a first pixel electrode; the first wiring extends in a first direction and intersects with the second and the third wirings; the second and the third wirings each extend in a second direction intersecting with the first direction; a gate of the first transistor is electrically connected to the first wiring; one of a source and a drain of the first transistor is electrically connected to the second wiring through the first to the third conductive layers; the second conductive layer includes a region overlapping with the third wiring; the first conductive layer, the third conductive layer, and the first pixel electrode contain the same material; the first wiring and the second conductive layer contain the same material; the first wiring (Continued)

is supplied with a selection signal; and the second and the third wirings are supplied with different signals.

14 Claims, 43 Drawing Sheets

(51) Int. Cl.
  H01L 29/786    (2006.01)
  G09G 3/36     (2006.01)
  H01L 29/66    (2006.01)
  G02F 1/1368   (2006.01)
  G02F 1/1343   (2006.01)
  G02F 1/1362   (2006.01)
  G02F 1/133    (2006.01)
  G09G 3/20     (2006.01)

(52) U.S. Cl.
  CPC ...... *H01L 27/1222* (2013.01); *H01L 27/1225* (2013.01); *H01L 27/1259* (2013.01); *H01L 29/24* (2013.01); *H01L 29/7869* (2013.01); *H01L 29/78666* (2013.01); *H01L 29/78675* (2013.01); *G02F 2202/10* (2013.01); *G02F 2202/103* (2013.01); *G02F 2202/104* (2013.01); *G09G 3/3648* (2013.01); *G09G 3/3688* (2013.01)

(56) References Cited

U.S. PATENT DOCUMENTS

| | | | |
|---|---|---|---|
| 8,599,347 B2 | 12/2013 | Arasawa et al. | |
| 8,654,270 B2 | 2/2014 | Nakajima et al. | |
| 9,166,054 B2 | 10/2015 | Yamazaki | |
| 9,401,247 B2 | 7/2016 | Tajima et al. | |
| 2006/0267909 A1 | 11/2006 | Hsu et al. | |
| 2007/0030233 A1 | 2/2007 | Chai et al. | |
| 2007/0132684 A1 | 6/2007 | Baek et al. | |
| 2007/0206011 A1 | 9/2007 | Han et al. | |
| 2008/0068524 A1 | 3/2008 | Kim | |
| 2011/0156992 A1 | 6/2011 | Moon et al. | |
| 2011/0241526 A1 | 10/2011 | Huang et al. | |
| 2011/0299003 A1 | 12/2011 | Arasawa et al. | |
| 2012/0050657 A1 | 3/2012 | Lin et al. | |
| 2012/0268481 A1 | 10/2012 | Niioka et al. | |
| 2012/0274869 A1 | 11/2012 | Chen et al. | |
| 2012/0319106 A1* | 12/2012 | Yamazaki | H01L 27/124 257/43 |
| 2013/0069921 A1 | 3/2013 | Saitoh | |
| 2013/0070002 A1 | 3/2013 | Hisada et al. | |
| 2013/0093986 A1 | 4/2013 | Kesho et al. | |
| 2015/0035741 A1 | 2/2015 | Lee et al. | |
| 2015/0042914 A1 | 2/2015 | Cho et al. | |
| 2015/0301372 A1 | 10/2015 | Mori | |
| 2016/0026050 A1* | 1/2016 | Lin | G02F 1/136286 349/43 |
| 2016/0225330 A1 | 8/2016 | Park et al. | |
| 2017/0011680 A1* | 1/2017 | Miyata | G09G 3/3614 |
| 2017/0045794 A1 | 2/2017 | Lin et al. | |
| 2018/0196322 A1 | 7/2018 | Yamazaki et al. | |
| 2018/0203319 A1 | 7/2018 | Yamazaki et al. | |
| 2018/0204532 A1 | 7/2018 | Kobayashi et al. | |
| 2018/0226034 A1 | 8/2018 | Takahashi | |
| 2018/0240421 A1 | 8/2018 | Yamazaki et al. | |

FOREIGN PATENT DOCUMENTS

| | | |
|---|---|---|
| JP | 2001-053283 A | 2/2001 |
| JP | 2009-175564 A | 8/2009 |
| JP | 2012-014168 A | 1/2012 |
| KR | 2011-0133421 A | 12/2011 |
| TW | 201209493 | 3/2012 |
| WO | WO-2012/068749 | 5/2012 |

OTHER PUBLICATIONS

Written Opinion (Application No. PCT/IB2018/050073) dated Apr. 3, 2018.

* cited by examiner

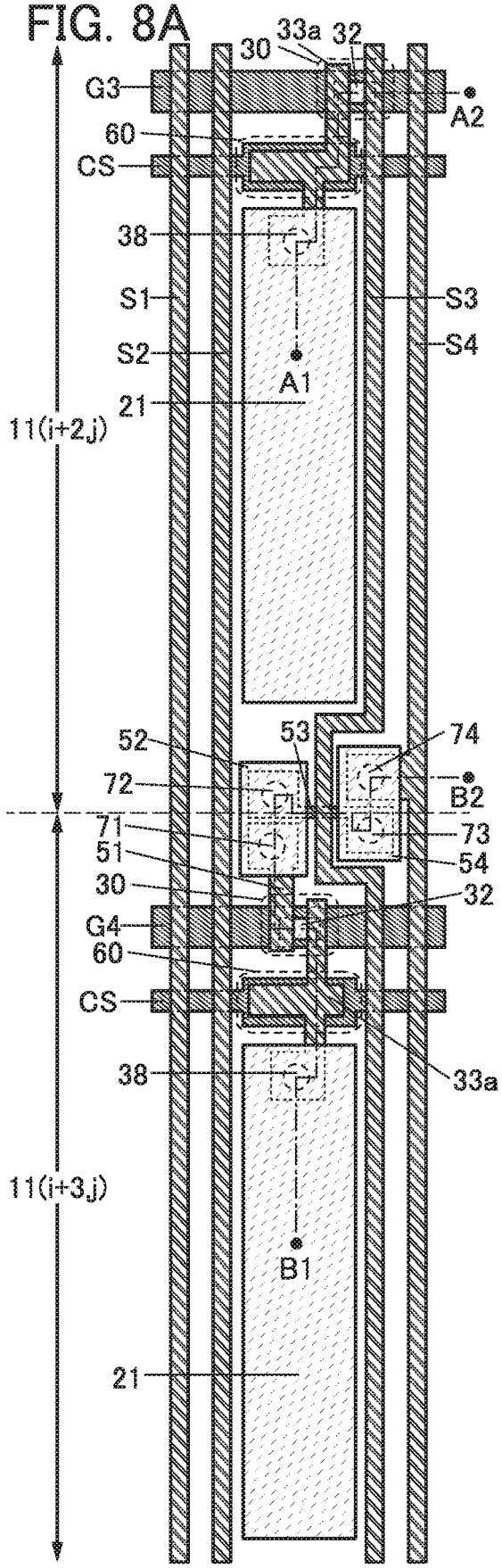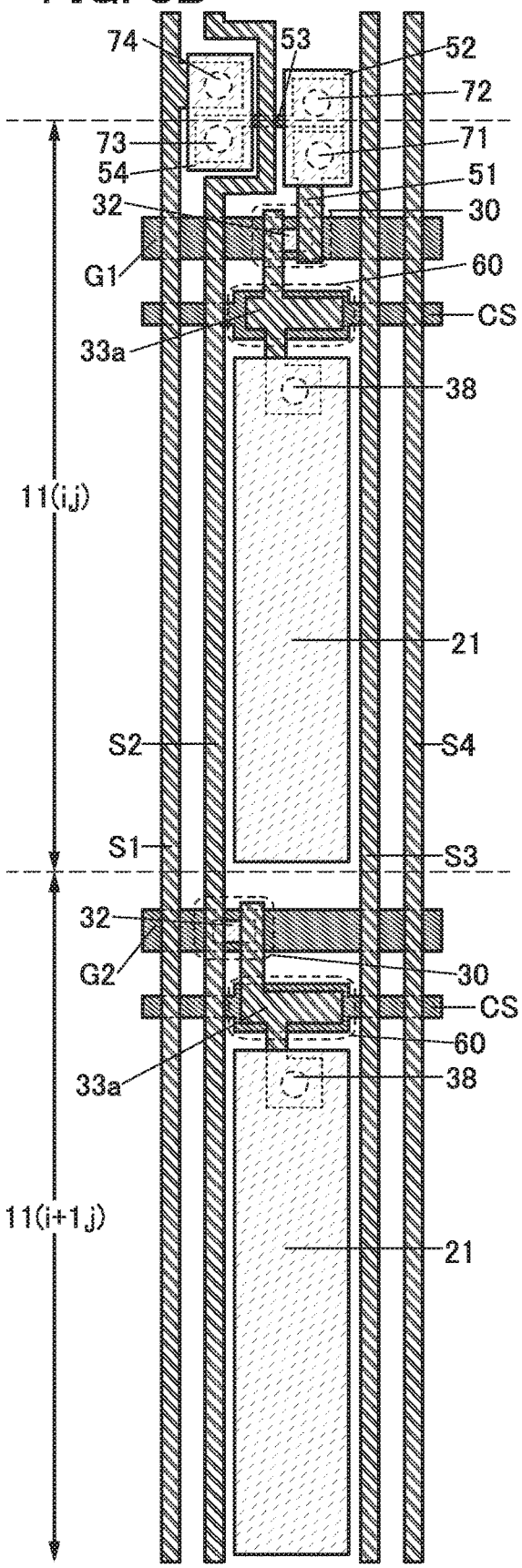

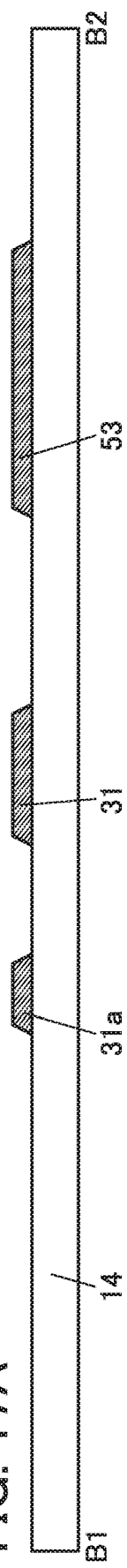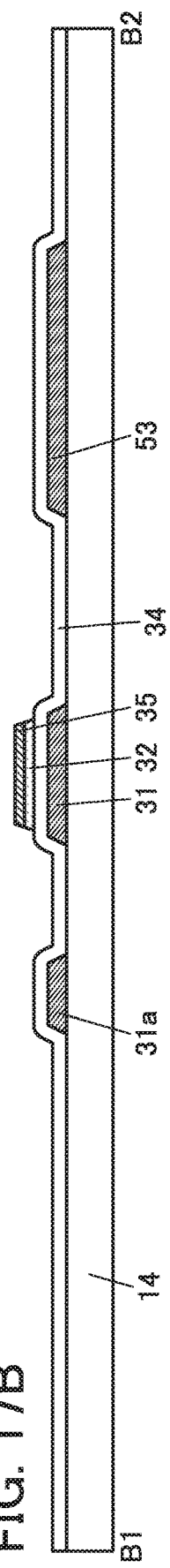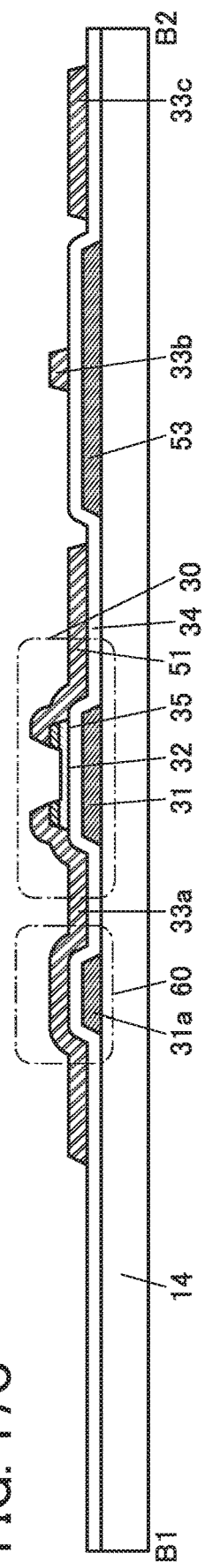

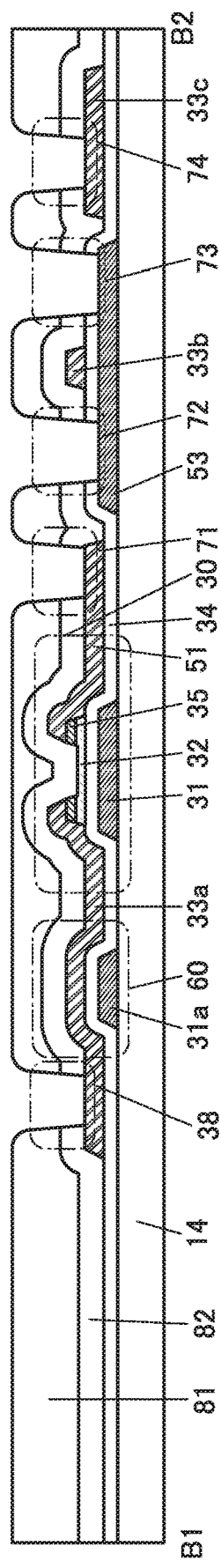
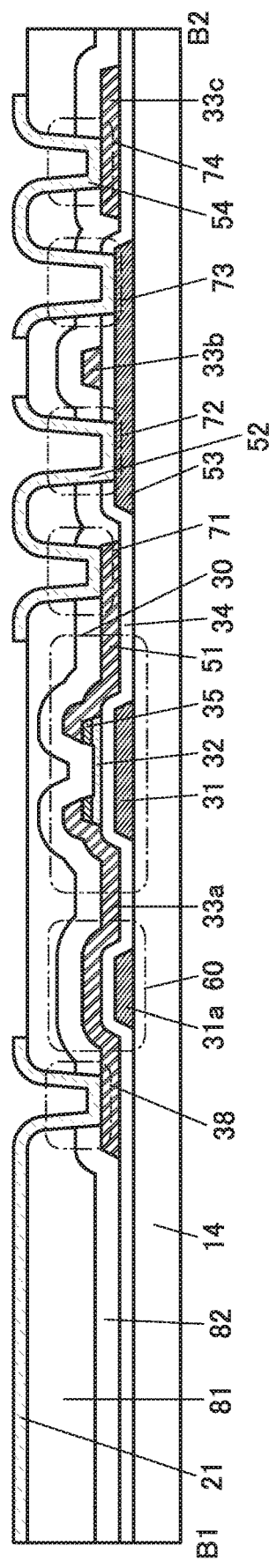
FIG. 18A
FIG. 18B

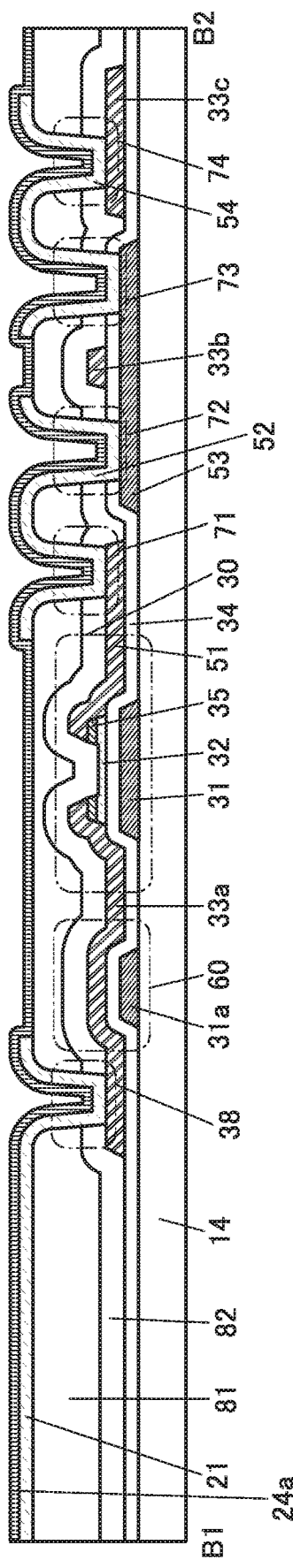
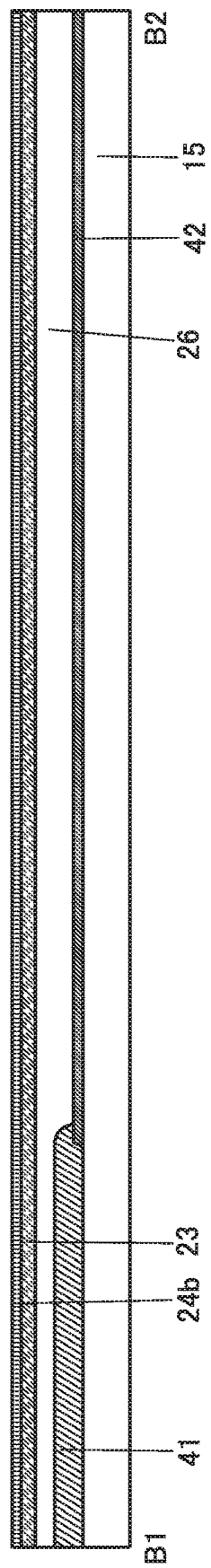
FIG. 19A
FIG. 19B

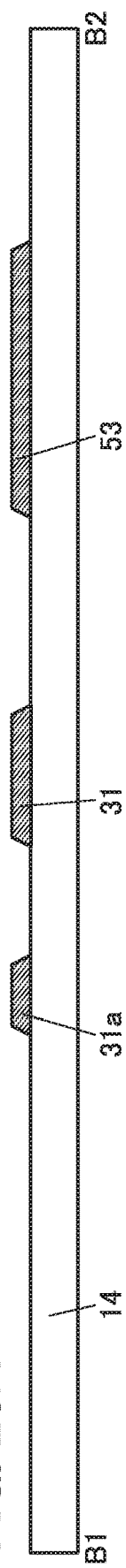
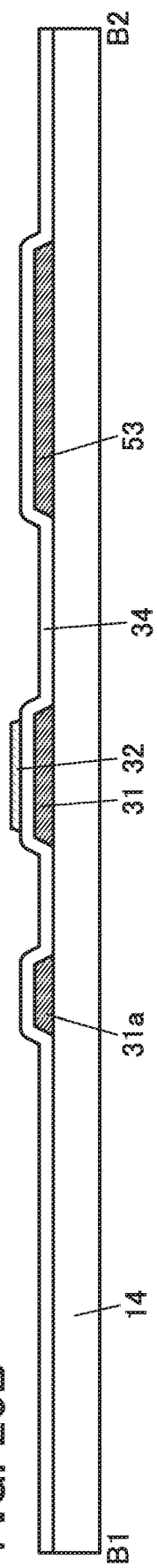
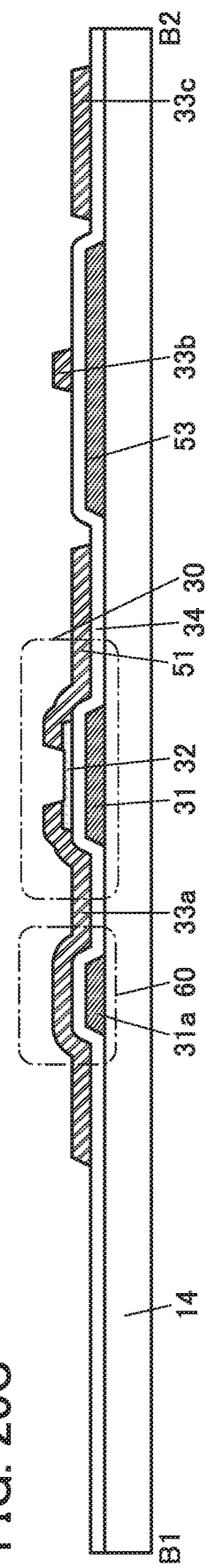

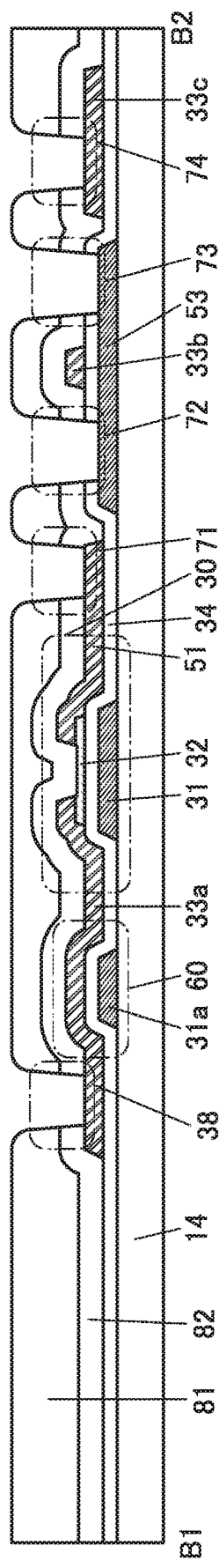
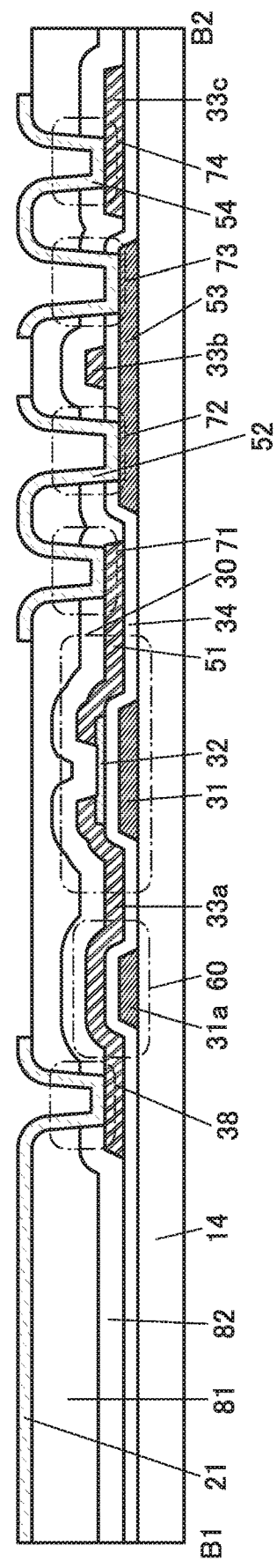

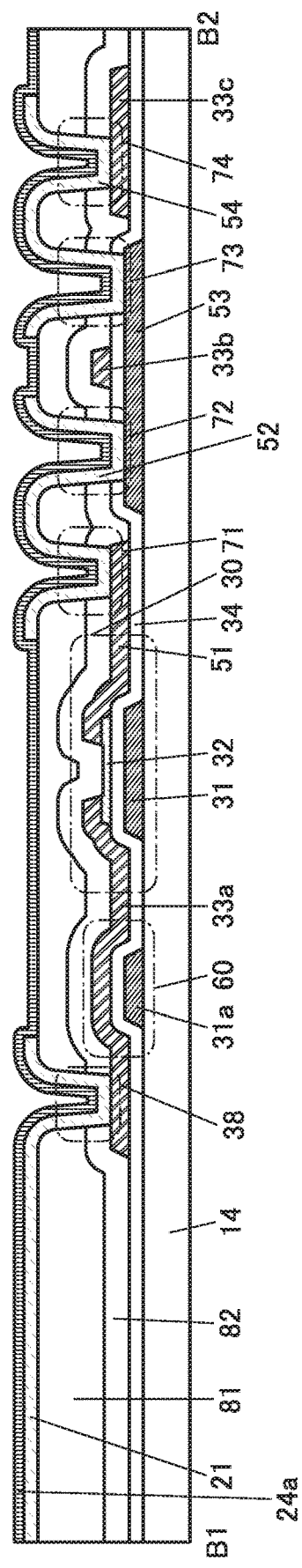
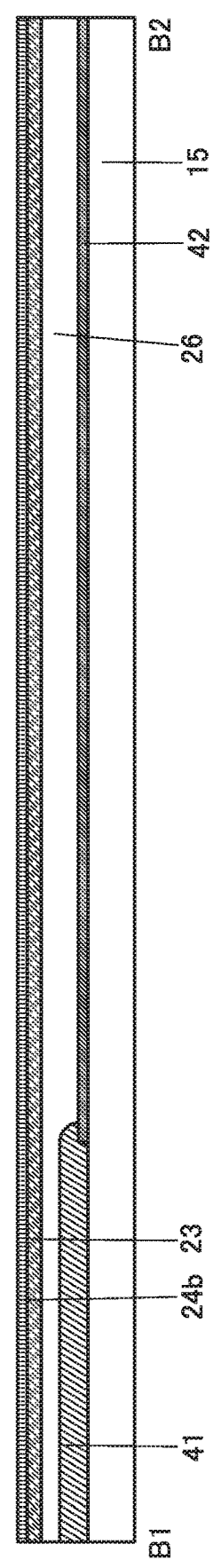
FIG. 22A
FIG. 22B

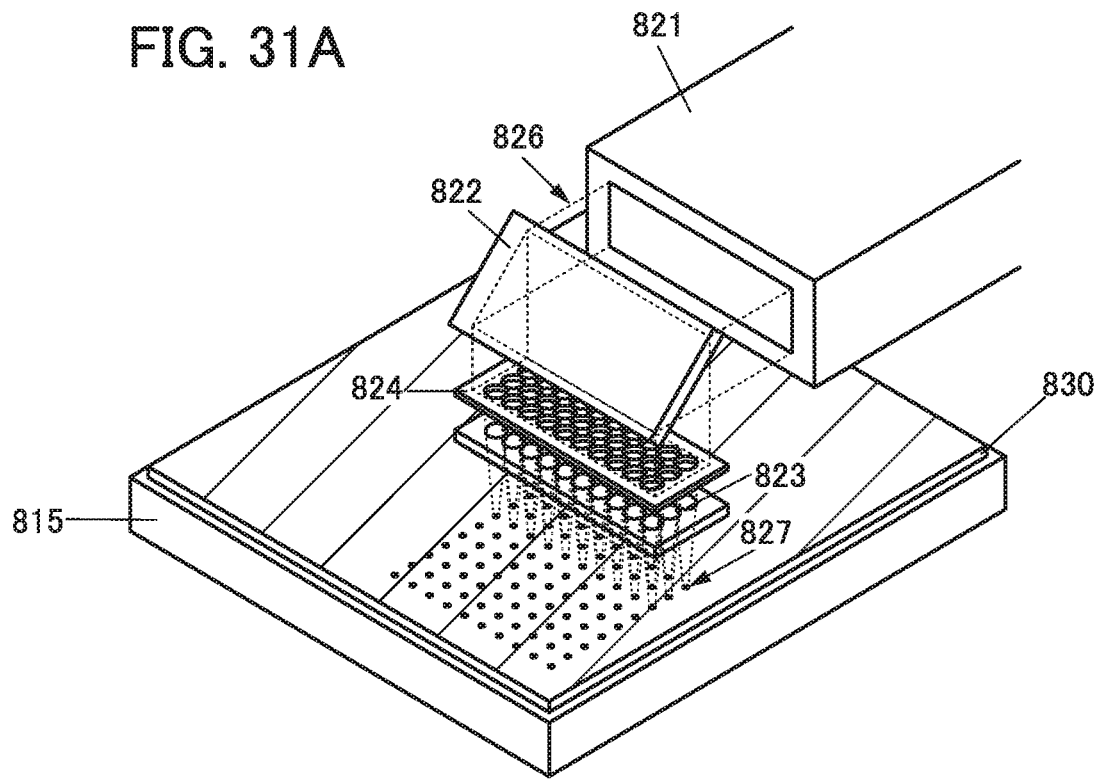
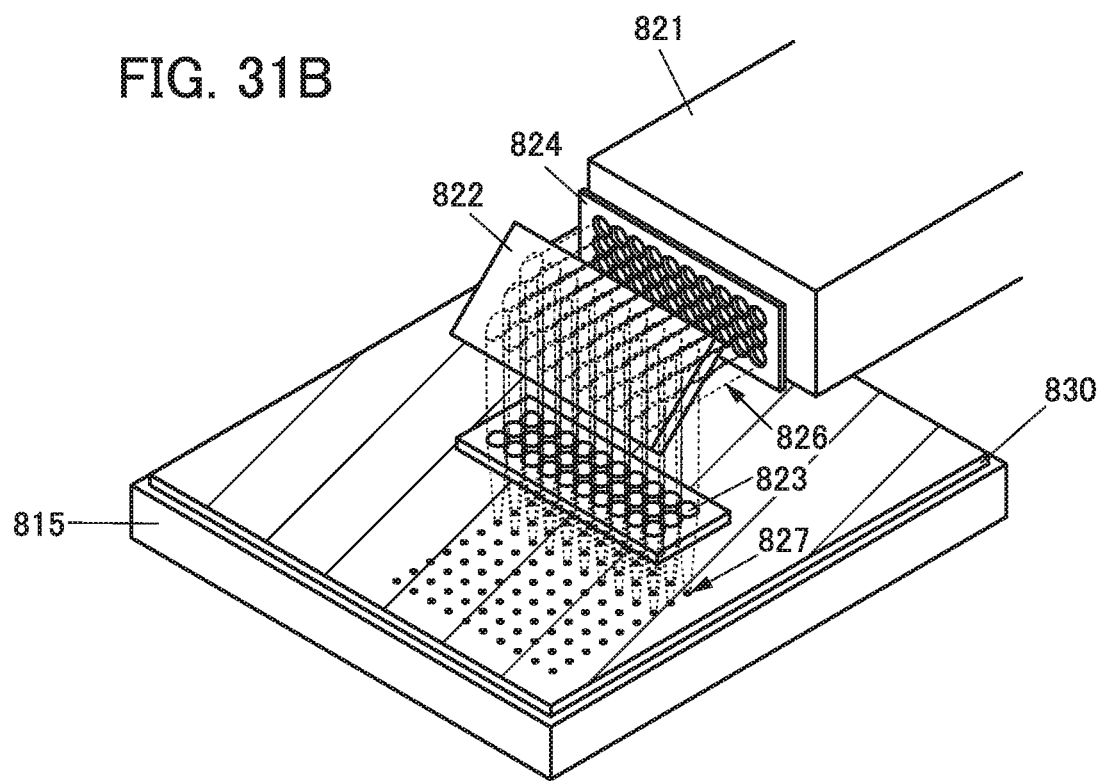

DISPLAY DEVICE AND MANUFACTURING METHOD THEREOF

TECHNICAL FIELD

One embodiment of the present invention relates to a display device and a manufacturing method thereof.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device generally means a device that can function by utilizing semiconductor characteristics. A transistor, a semiconductor circuit, an arithmetic device, a memory device, and the like are embodiments of the semiconductor device. In addition, an imaging device, an electro-optical device, a power generation device (including a thin film solar cell, an organic thin film solar cell, and the like), and an electronic appliance may include a semiconductor device.

BACKGROUND ART

In recent years, a high-resolution display device has been demanded. For example, full high-definition (the number of pixels is 1920×1080) has been in the mainstream of home-use television devices (also referred to as televisions or television receivers), while display devices having high resolution such as 4K (the number of pixels is 3840×2160) or 8K (the number of pixels is 7680×4320) have been developed.

A liquid crystal display device is known as one of display devices. A transmissive liquid crystal display device adjusts the amount of light from a backlight to be transmitted and shows contrast to display an image by utilizing optical modulation action of a liquid crystal.

A thin film transistor whose channel formation region is formed using a semiconductor film that is formed over a substrate having an insulating surface is known as a kind of field-effect transistors. Patent Document 1 discloses a technique in which amorphous silicon is used for a semiconductor film that is used in a channel formation region of a thin film transistor. For example, in the case of a liquid crystal display device, a thin film transistor is used as a switching transistor in each pixel.

PRIOR ART DOCUMENT

Patent Document

[Patent Document 1] Japanese Published Patent Application No. 2001-053283

SUMMARY OF THE INVENTION

Problems to be Solved by the Invention

In the case of a display device such as a television device or a monitor device, the higher the resolution is or the larger the screen size is, the more significant an increase in the load of a transistor or the like included in the display device becomes. This might make operation at a high driving frequency difficult particularly in the case where the field-effect mobility of the transistor is low.

An object of one embodiment of the present invention is to provide a high-resolution display device and a manufacturing method thereof. Another object is to provide a display device that is suitable for increasing in size and a manufacturing method thereof. Another object is to provide an inexpensive display device and a manufacturing method thereof. Another object is to provide a display device with high productivity and a manufacturing method thereof. Another object is to provide a highly reliable display device and a manufacturing method thereof. Another object is to provide a display device using amorphous silicon or the like and a manufacturing method thereof. Another object is to provide a display device using a metal oxide or the like and a manufacturing method thereof. Another object is to provide a novel display device and a manufacturing method thereof.

Note that the description of these objects does not disturb the existence of other objects. Note that in one embodiment of the present invention, there is no need to achieve all the objects. Note that objects other than these can be derived from the description of the specification, the drawings, the claims, and the like.

Means for Solving the Problems

One embodiment of the present invention is a display device including a first wiring, a second wiring, a third wiring, a first transistor, a first conductive layer, a second conductive layer, a third conductive layer, and a first pixel electrode; in the display device, the first wiring extends in a first direction and intersects with the second wiring and the third wiring, the second wiring and the third wiring each extend in a second direction intersecting with the first direction, a gate of the first transistor is electrically connected to the first wiring, one of a source and a drain of the first transistor is electrically connected to the second wiring through the first conductive layer, the second conductive layer, and the third conductive layer, the second conductive layer includes a region overlapping with the third wiring, the first conductive layer, the third conductive layer, and the first pixel electrode contain the same material, the first wiring and the second conductive layer contain the same material, the first wiring is supplied with a selection signal, and the second wiring and the third wiring are supplied with different signals.

Alternatively, in the above embodiment, the second wiring and the third wiring may be electrically connected to a first source driver and a second source driver.

Alternatively, in the above embodiment, a fourth wiring, a fifth wiring, a sixth wiring, a second transistor, a fourth conductive layer, a fifth conductive layer, a sixth conductive layer, and a second pixel electrode may be included; the fourth wiring may extend in the first direction and intersect with the second wiring, the third wiring, the fifth wiring, and the sixth wiring, the fifth wiring and the sixth wiring may each extend in the second direction intersecting with the first direction, a gate of the second transistor may be electrically connected to the fourth wiring, one of a source and a drain of the second transistor may be electrically connected to the fifth wiring through the fourth conductive layer, the fifth conductive layer, and the sixth conductive layer, the fifth conductive layer may include a region overlapping with the sixth wiring, the fourth conductive layer, the sixth conductive layer, and the second pixel electrode may contain the same material, the fourth wiring and the fifth conductive layer may include the same material, the fourth wiring and the first wiring may be supplied with the same selection signal, and the second wiring, the third wiring, the fifth wiring, and the sixth wiring may be supplied with different signals.

Alternatively, in the above embodiment, the fifth wiring and the sixth wiring may be electrically connected to a first source driver and a second source driver.

Alternatively, in the above embodiment, the first transistor may include a first semiconductor layer, the second transistor may include a second semiconductor layer, and the first semiconductor layer and the second semiconductor layer may each include a portion positioned between the third wiring and the sixth wiring.

Alternatively, in the above embodiment, the first semiconductor layer and the second semiconductor layer may each contain amorphous silicon.

Alternatively, in the above embodiment, the first semiconductor layer and the second semiconductor layer may each contain microcrystalline silicon or polycrystalline silicon.

Alternatively, in the above embodiment, the first semiconductor layer and the second semiconductor layer may each contain a metal oxide.

Alternatively, in the above embodiment, the metal oxide may contain indium, zinc, and M (M is aluminum, titanium, gallium, germanium, yttrium, zirconium, lanthanum, cerium, tin, neodymium, or hafnium).

Alternatively, one embodiment of the present invention is a manufacturing method of a display device; the manufacturing method of a display device includes a step of forming a gate line and a first conductive layer; a step of forming a first insulating layer; a step of forming a semiconductor layer; a step of forming a first source line, a second source line, and a second conductive layer and a third conductive layer each including a region in contact with the semiconductor layer; a step of forming a second insulating layer; a step of forming, in the second insulating layer, a first opening portion reaching the second conductive layer, a second opening portion reaching the third conductive layer, and a third opening portion reaching the second source line, and forming, in the first insulating layer and the second insulating layer, a fourth opening portion and a fifth opening portion each reaching the first conductive layer with the first source line therebetween; and a step of forming a pixel electrode electrically connected to the second conductive layer through the first opening portion, forming a fourth conductive layer electrically connected to the third conductive layer through the second opening portion and electrically connected to the first conductive layer through the fourth opening portion, and forming a fifth conductive layer electrically connected to the second source line through the third opening portion and electrically connected to the first conductive layer through the fifth opening portion.

Effect of the Invention

According to one embodiment of the present invention, a high-resolution display device and a manufacturing method thereof can be provided. Alternatively, a display device that is suitable for increasing in size and a manufacturing method thereof can be provided. Alternatively, an inexpensive display device and a manufacturing method thereof can be provided. Alternatively, a display device with high productivity and a manufacturing method thereof can be provided. Alternatively, a highly reliable display device and a manufacturing method thereof can be provided. Alternatively, a display device using amorphous silicon or the like and a manufacturing method thereof can be provided. Alternatively, a display device using a metal oxide or the like and a manufacturing method thereof can be provided. Alternatively, a novel display device and a manufacturing method thereof can be provided.

Note that the description of these effects does not disturb the existence of other effects. Note that one embodiment of the present invention does not necessarily have all these effects. Note that effects other than these can be derived from the description of the specification, the drawings, the claims, and the like.

BRIEF DESCRIPTION OF DRAWINGS

FIG. 8 A structure example of a display device.
FIG. 17 An example of a manufacturing method of a display device.
FIG. 18 An example of a manufacturing method of a display device.
FIG. 19 An example of a manufacturing method of a display device.
FIG. 20 An example of a manufacturing method of a display device.
FIG. 21 An example of a manufacturing method of a display device.
FIG. 22 An example of a manufacturing method of a display device.
FIG. 31 Examples of a laser irradiation method.

MODE FOR CARRYING OUT THE INVENTION

Figure 1:
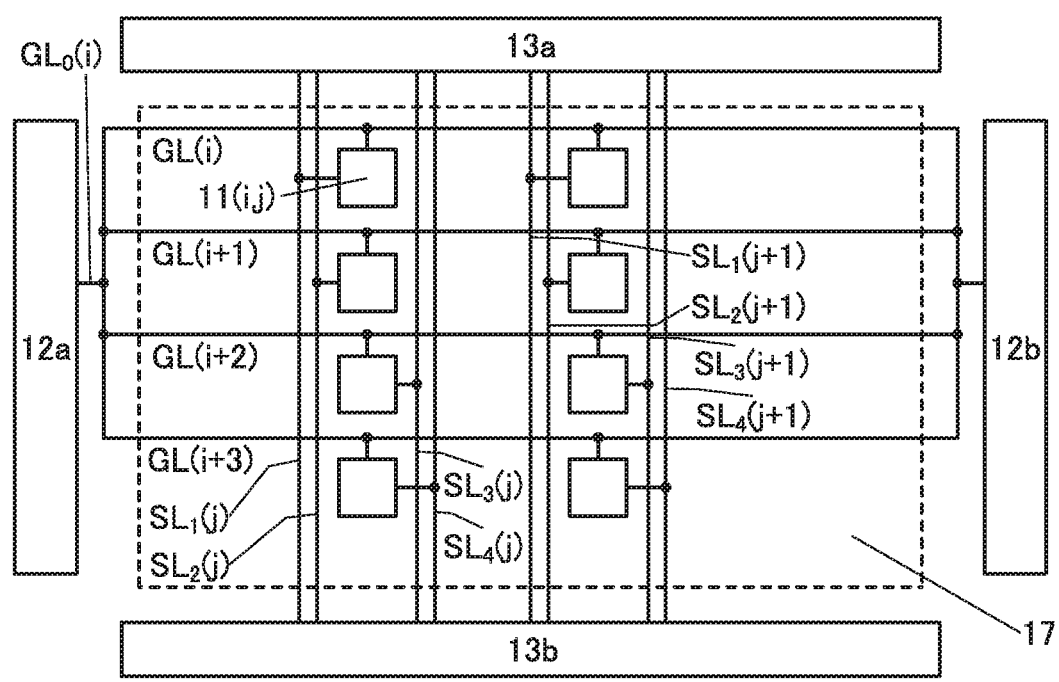
FIG. 1 A structure example of a display device.

Embodiments will be described in detail with reference to the drawings. Note that the present invention is not limited to the following description, and it will be readily understood by those skilled in the art that modes and details of the present invention can be modified in various ways without departing from the spirit and scope. Thus, the present invention should not be construed as being limited to the description in the following embodiments.

Note that in the structures of the invention described below, the same reference numerals are used, in different drawings, for the same portions or portions having similar functions, and description thereof is omitted. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number.

A transistor is a kind of semiconductor element and can achieve amplification of current or voltage, switching operation for controlling conduction or non-conduction, or the like. A transistor in this specification includes an IGFET (Insulated Gate Field Effect Transistor) and a thin film transistor (TFT).

Furthermore, functions of a "source" and a "drain" might be switched when a transistor of opposite polarity is employed, a direction of current flow is changed in circuit operation, or the like. Therefore, the terms "source" and "drain" can be switched in this specification.

In this specification and the like, the terms "source", "drain", and "gate" can be replaced with "source electrode", "drain electrode", and "gate electrode", respectively, in some cases.

In this specification and the like, "electrically connected" includes the case where components are connected through an "object having any electric function". Here, there is no particular limitation on the "object having any electric function" as long as electric signals can be transmitted and received between the connected components. Examples of an "object having any electric function" are a switching element such as a transistor, a resistor, a coil, a capacitor, and an element with a variety of functions as well as an electrode and a wiring.

In this specification and the like, a display panel that is one embodiment of the display device has a function of displaying (outputting) an image or the like on (to) a display surface. Hence, the display panel is one embodiment of an output device.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display panel module or a display module, or simply as a display panel or the like in some cases.

In this specification and the like, a touch sensor has a function of sensing contact, press, approach, or the like of an object such as a finger or a stylus. In addition, the touch sensor may have a function of sensing the positional information. Therefore, the touch sensor is one embodiment of an input device. For example, the touch sensor can include one or more sensor elements.

In this specification and the like, a substrate provided with a touch sensor is referred to as a touch sensor panel or simply as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply as a touch sensor or the like in some cases.

Note that in this specification and the like, a touch panel that is one embodiment of the display device has a function of displaying (outputting) an image or the like on (to) a display surface and a function as a touch sensor capable of sensing contact, press, approach, or the like of an object such as a finger or a stylus with, on, or to the display surface. Therefore, the touch panel is one embodiment of an input/output device.

A touch panel can also be referred to as, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel or on a surface thereof.

In this specification and the like, a structure in which a connector such as an FPC or a TCP is attached to a substrate of a touch panel, or a structure in which an IC is mounted on a substrate by a COG method or the like is referred to as a touch panel module or a display module, or simply as a touch panel or the like in some cases.

Embodiment 1

In this embodiment, a display device of one embodiment of the present invention is described.

One embodiment of the present invention is a display device including a display portion where a plurality of pixels are arranged in a matrix. In the display portion, a plurality of wirings to which a selection signal is supplied (also referred to as gate lines or scan lines) and a plurality of wirings to which a signal to be written to a pixel (also referred to as a video signal or the like) is supplied (also referred to as source lines, signal lines, data lines, or the like) are provided. Here, the gate lines are provided parallel to one another, the source lines are provided parallel to one another, and the gate lines and the source lines intersect with each other.

One pixel includes at least one transistor and one display element. The display element includes a conductive layer having a function as a pixel electrode, and the conductive layer is electrically connected to one of a source and a drain of the transistor. A gate of the transistor is electrically connected to a gate line, and the other of the source and the drain is electrically connected to a source line.

Here, a direction in which the gate lines extend is called a row direction or a first direction, and a direction in which the source lines extend is called a column direction or a second direction.

Here, three or more adjacent gate lines are preferably supplied with the same selection signal. That is, selection periods of these gate lines are preferably the same. In particular, four gate lines are preferably regarded as a group, in which case the structure of a driver circuit can be simplified.

In the case where the same selection signal is supplied to four gate lines, four pixels which are adjacent to each other in the column direction are concurrently selected. Thus, a structure in which different source lines are connected to the four pixels is employed. That is, a structure in which four source lines are arranged for each column is employed.

With the structure in which four source lines are arranged for each column, one horizontal period can be longer than the conventional one. For example, in the case where four gate lines are supplied with the same selection signal, the length of one horizontal period can be quadrupled. Furthermore, since the parasitic capacitance between the source lines can be reduced, the load of the source lines can be reduced. Thus, even an extremely high-resolution display device with a resolution of 4K, 8K, or the like can be operated with use of a transistor with a low field-effect mobility. Needless to say, the structure of one embodiment of the present invention even enables the operation of a display device with a resolution exceeding 8K (for example, 10K, 12K, or 16K). The above-described structure can also be applied to a large display device with a diagonal screen size of 50 inches or larger, 60 inches or larger, or 70 inches or larger.

In the case where the structure in which four source lines are arranged for each column is employed, two source lines can be arranged on the left side of a pixel and two source lines can be arranged on the right side of the pixel. In other words, a source line can be provided on each of the outer left, inner left, inner right, and outer right sides of the pixel. In this structure, a source of a transistor which is electrically connected to the source line on the outer left side of the pixel intersects with the source line on the inner left side of the pixel. Also in this structure, a source of a transistor which is electrically connected to the source line on the outer right side of the pixel intersects with the source line on the inner right side of the pixel. In one embodiment of the present invention, a short-circuit between the source of the transistor which is electrically connected to the source line on the outer left side of the pixel and the source line on the inner left side of the pixel is suppressed with use of a conductive layer that can be formed in the same step as a pixel electrode and a conductive layer that can be formed in the same step as the gate of the transistor. Also in one embodiment of the present invention, a short-circuit between the source of the transistor which is electrically connected to the source line on the outer right side of the pixel and the source line on the inner right side of the pixel is suppressed with use of the conductive layer that can be formed in the same step as the pixel electrode and the conductive layer that can be formed in the same step as the gate of the transistor. Thus, even in the case of the structure in which four source lines are arranged for each column, an increase in the number of steps, specifically, the number of photolithography steps, from that in the case of the structure in which one or two source lines are arranged for each column can be suppressed. In other words, an increase in the number of photomasks can be suppressed. Accordingly, an increase in the manufacturing cost of the display device can be suppressed.

More specific examples of the display device are described below with reference to drawings.

[Structure Example of Display Device]

FIG. 1 is a block diagram of a display device 10 of one embodiment of the present invention. The display device 10 includes a display portion 17, a gate driver 12a, a gate driver 12b, a source driver 13a, and a source driver 13b. In the display portion 17, pixels 11 are arranged in matrix. Note that in this specification and the like, the pixel 11 in the i-th row and the j-th column is referred to as a pixel 11(i, j).

FIG. 1 shows an example in which the gate driver 12a and the gate driver 12b are provided to face each other with the display portion 17 therebetween. A plurality of wirings $GL_0$ are connected to the gate driver 12a and the gate driver 12b. In FIG. 1, a wiring $GL_0(i)$ is illustrated. The wiring $GL_0(i)$ is electrically connected to four wirings (a wiring GL(i), a wiring GL(i+1), a wiring GL(i+2), and a wiring GL(i+3)). Accordingly, these four wirings are supplied with the same selection signal. Note that the wiring $GL_0$ and the wirings GL function as gate lines.

The gate driver 12a and the gate driver 12b have a function of supplying the same selection signal to the same wiring $GL_0$. Accordingly, the charge and discharge time of the wiring $GL_0$ can be shorter than that in the case of the display device 10 including only one gate driver. Thus, even an extremely high-resolution display device with a resolution of 4K, 8K, or the like can be operated with use of a transistor with a low field-effect mobility. In addition, the display device of one embodiment of the present invention can also be applied to a large display device with a diagonal screen size of 50 inches or larger, 60 inches or larger, or 70 inches or larger.

FIG. 1 shows an example in which the source driver 13a and the source driver 13b are provided with the display portion 17 therebetween. A plurality of wirings are connected to the source driver 13a and the source driver 13b. Four wirings are provided for one pixel column. FIG. 1 illustrates four wirings (a wiring $SL_1(j)$, a wiring $SL_2(j)$, a wiring $SL_3(j)$, and a wiring $SL_4(j)$) for the j-th pixel column and four wirings (a wiring $SL_1(j+1)$, a wiring $SL_2(j+1)$, a wiring $SL_3(j+1)$, and a wiring $SL_4(j+1)$) for the (j+1)-th pixel column. Different signals can be supplied to different wirings. For example, different signals can be supplied to the wiring $SL_1(j)$, the wiring $SL_2(j)$, the wiring $SL_3(j)$, and the wiring $SL_4(j)$. Note that the wirings SL (the wirings $SL_1$, the wirings $SL_2$, the wirings $SL_3$, and the wirings $SL_4$) function as source lines.

The source driver 13a and the source driver 13b have a function of supplying the same signal to the same wiring SL. Accordingly, the charge and discharge time of the wiring SL can be shorter than that in the case of the display device 10 including only one source driver. Thus, even an extremely high-resolution display device with a resolution of 4K, 8K, or the like can be operated with use of a transistor with a low field-effect mobility. In addition, the display device of one embodiment of the present invention can also be applied to a large display device with a diagonal screen size of 50 inches or larger, 60 inches or larger, or 70 inches or larger.

One pixel 11 is a pixel corresponding to one color. Therefore, in the case where color display is performed by utilizing color mixture of light emitted from a plurality of pixels, the pixel 11 can be called a sub-pixel.

Furthermore, a plurality of pixels arranged in one column in the column direction are preferably pixels emitting light of the same color. In the case where liquid crystal elements are used as display elements, the pixels arranged in one column in the column direction are provided with coloring layers that transmit light of the same color to overlap with the liquid crystal elements.

Here, in the case where a transistor with a low field-effect mobility is used, a display portion of a display device can be divided into a plurality of display regions and driven. However, in the case of the above method, a boundary portion between the divided display regions might be visually recognized because of, for example, variation in characteristics of driver circuits, which decreases the visibility in some cases. In addition, image processing or the like for dividing in advance image data to be input is necessary; thus, a large-scale image processing device that can operate at a high speed is required.

By contrast, the display device of one embodiment of the present invention can be driven without dividing the display portion into a plurality of display regions even in the case where a transistor with a relatively low field-effect mobility is used.

Figure 2:
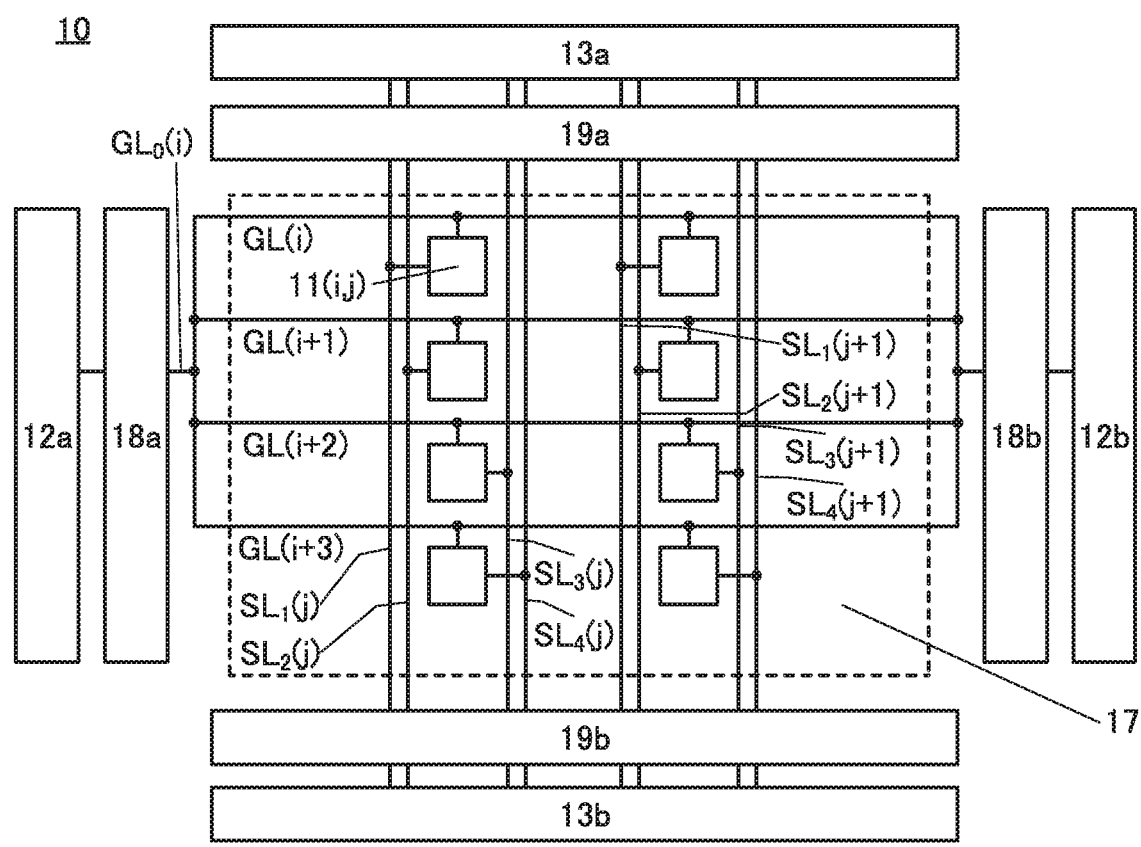
FIG. 2 A structure example of a display device.

A protective circuit may be provided in the display device 10. FIG. 2 is a block diagram showing the case where a protective circuit 18a, a protective circuit 18b, a protective circuit 19a, and a protective circuit 19b are provided in the display device 10 having the structure in FIG. 1. The protective circuit 18a and the protective circuit 18b are electrically connected to the wirings $GL_0$. The protective circuit 19a and the protective circuit 19b are electrically connected to the wirings $SL_1$, the wirings $SL_2$, the wirings $SL_3$, and the wirings $SL_4$.

The protective circuit 18a can be provided on the gate driver 12a side, and the protective circuit 18b can be provided on the gate driver 12b side. In other words, the protective circuit 18a and the protective circuit 18b can be provided to face each other with the display portion 17 therebetween. The protective circuit 19a can be provided on the source driver 13a side, and the protective circuit 19b can be provided on the source driver 13b side. In other words, the protective circuit 19a and the protective circuit 19b can be provided to face each other with the display portion 17 therebetween.

With the protective circuits provided in the display device 10, the pixels 11 can be protected from noise, surge, electrostatic discharge, and the like. This leads to higher reliability of the display device 10.

Figure 3:
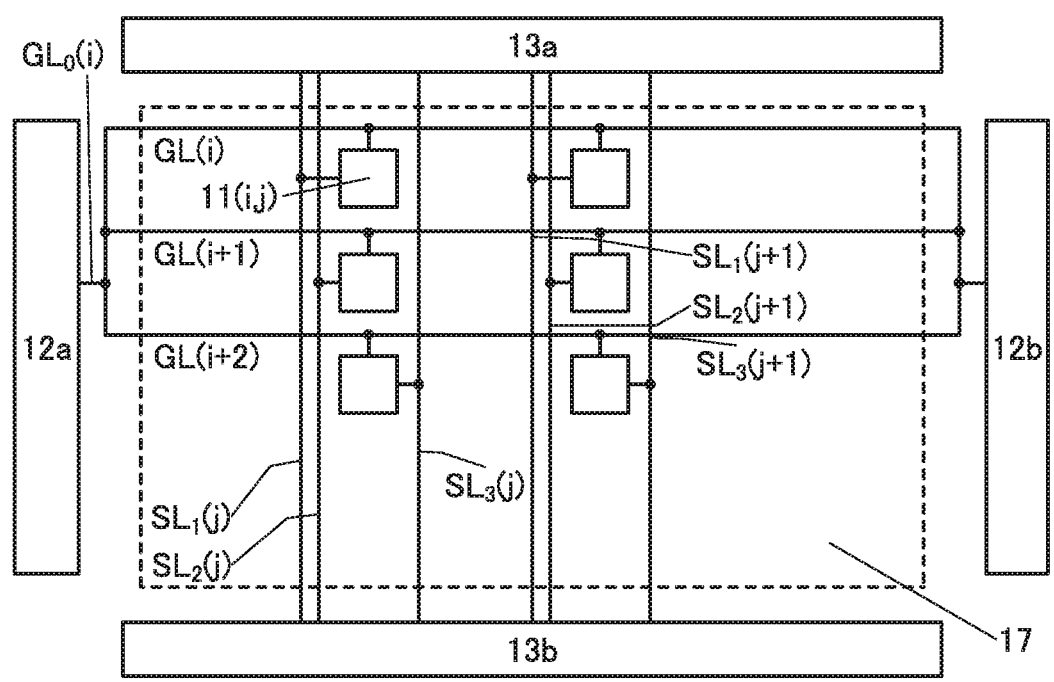
FIG. 3 A structure example of a display device.

Although four source lines are provided for one pixel column in FIG. 1, one embodiment of the present invention is not limited to this. FIG. 3 illustrates a structure in which three source lines (the wiring $SL_1$, the wiring $SL_2$, and the wiring $SL_3$) are provided for one pixel column. In the display device 10 having the structure, the wiring $GL_0$(i) is electrically connected to three wirings (the wiring GL(i), the wiring GL(i+1), and the wiring GL(i+2)), and the same selection signal is supplied to these three wirings. Note that five or more source lines may be provided for one pixel column in one embodiment of the present invention.

Although two gate drivers and two source drivers are placed in the example in FIG. 1, a structure in which the number of gate drivers and/or source drivers is one may be employed.

Figure 4:
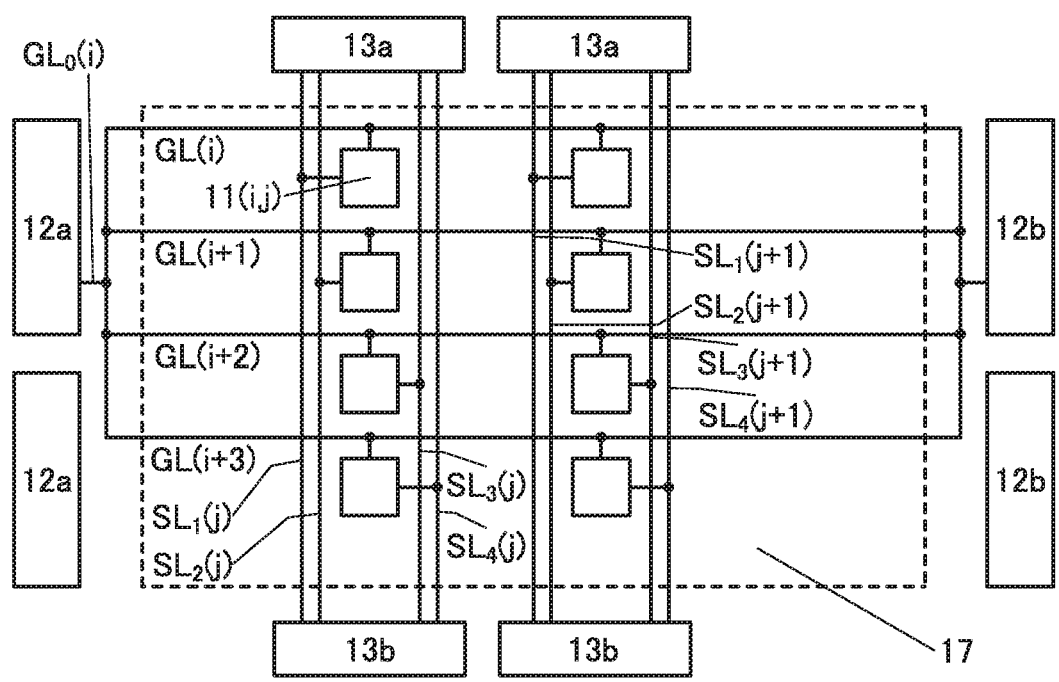
FIG. 4 A structure example of a display device.

FIG. 4 shows an example in which one source driver 13a and one source driver 13b are provided for each pixel column. In other words, the source drivers 13a equal in number to the pixel columns are provided along one side of the rectangular display portion 17, and the source drivers 13b equal in number to the pixel columns are provided to face the source drivers 13a with the display portion 17 therebetween. In the example in FIG. 4, one gate driver 12a and one gate driver 12b are provided for each wiring $GL_0$. In other words, the gate drivers 12a whose number is obtained by dividing the number of pixel rows by 4 are provided along one side of the rectangular display portion 17, and the gate drivers 12b whose number is obtained by dividing the number of pixel rows by 4 are provided to face the gate drivers 12a with the display portion 17 therebetween. With such a structure, display unevenness due to a potential drop caused by wiring resistance can be suppressed even in a large display device.

Figure 5:
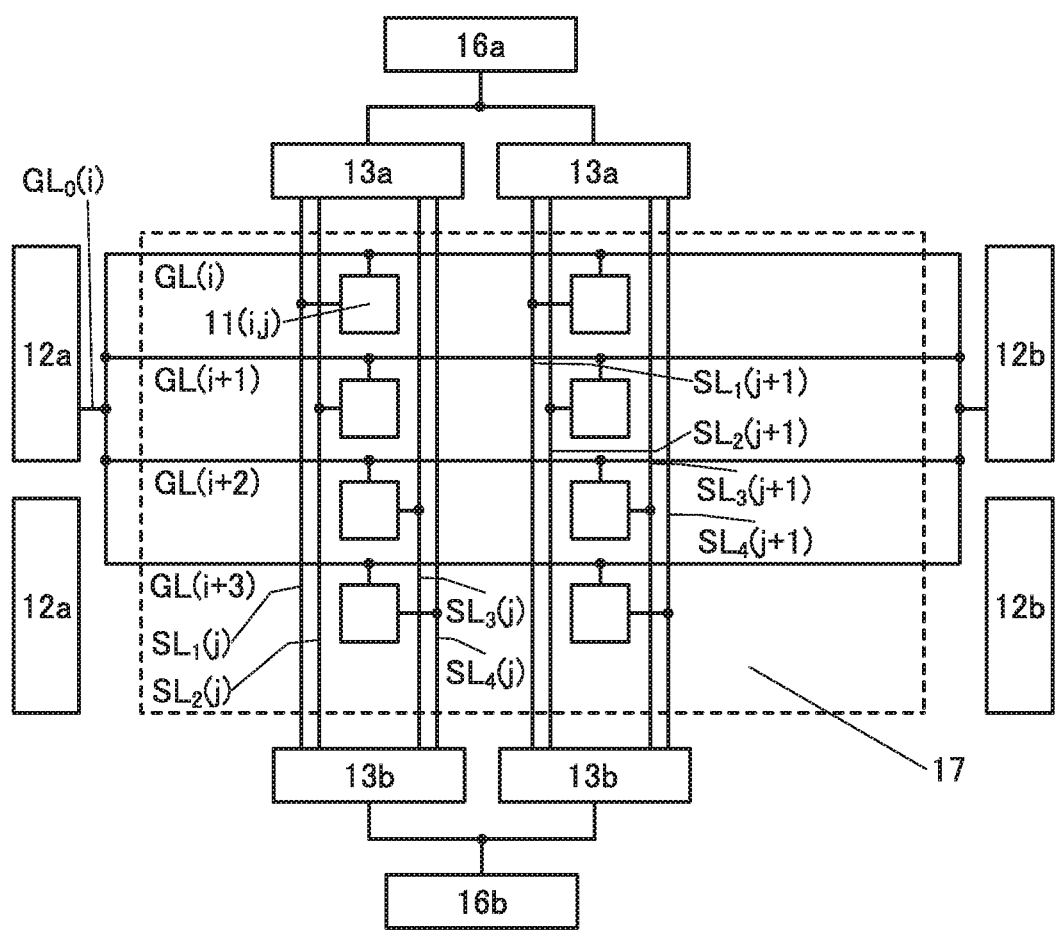
FIG. 5 A structure example of a display device.

In the display device 10, a reference voltage generation circuit can be provided. The reference voltage generation circuit has a function of generating a reference voltage of signals supplied by the source drivers. The reference voltage generation circuit can be a gamma reference generation circuit, for example. FIG. 5 shows the case where a reference voltage generation circuit 16a having a function of supplying a reference voltage to the source drivers 13a and a reference voltage generation circuit 16b having a function of supplying a reference voltage to the source drivers 13b are provided in the display device 10 having the structure illustrated in FIG. 4. The display device 10 having the structure illustrated in FIG. 5 can improve the accuracy of a voltage of a signal generated by each source driver 13a and the accuracy of a voltage of a signal generated by each source driver 13b.

Figure 6:
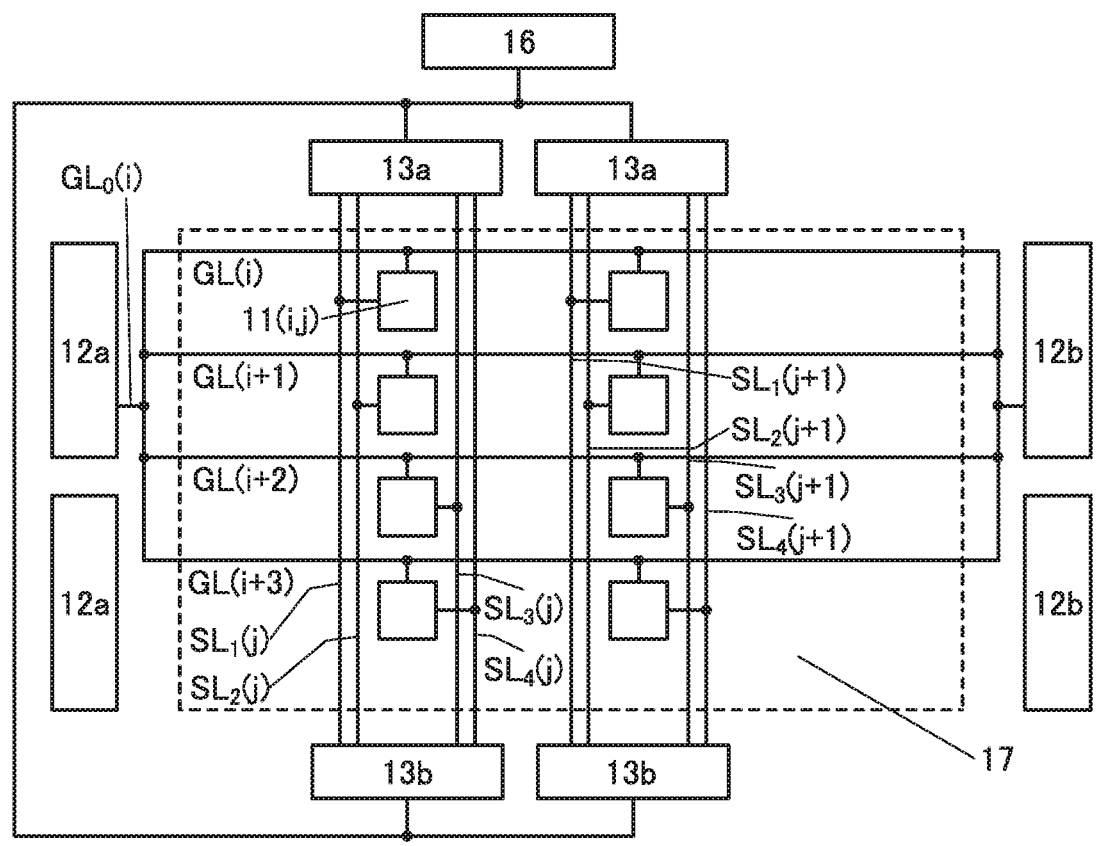
FIG. 6 A structure example of a display device.

FIG. 6 shows the case where a reference voltage generation circuit 16 having a function of supplying a reference voltage to the source drivers 13a and the source drivers 13b is provided in the display device 10 having the structure illustrated in FIG. 4. The display device 10 even having the structure illustrated in FIG. 6 can improve the accuracy of a voltage of a signal generated by each source driver 13a and the accuracy of a voltage of a signal generated by each source driver 13b.

[Structure Example of Pixel]

A structure example of the pixels arranged in the display portion 17 of the display device 10 is described below.

Figure 7:
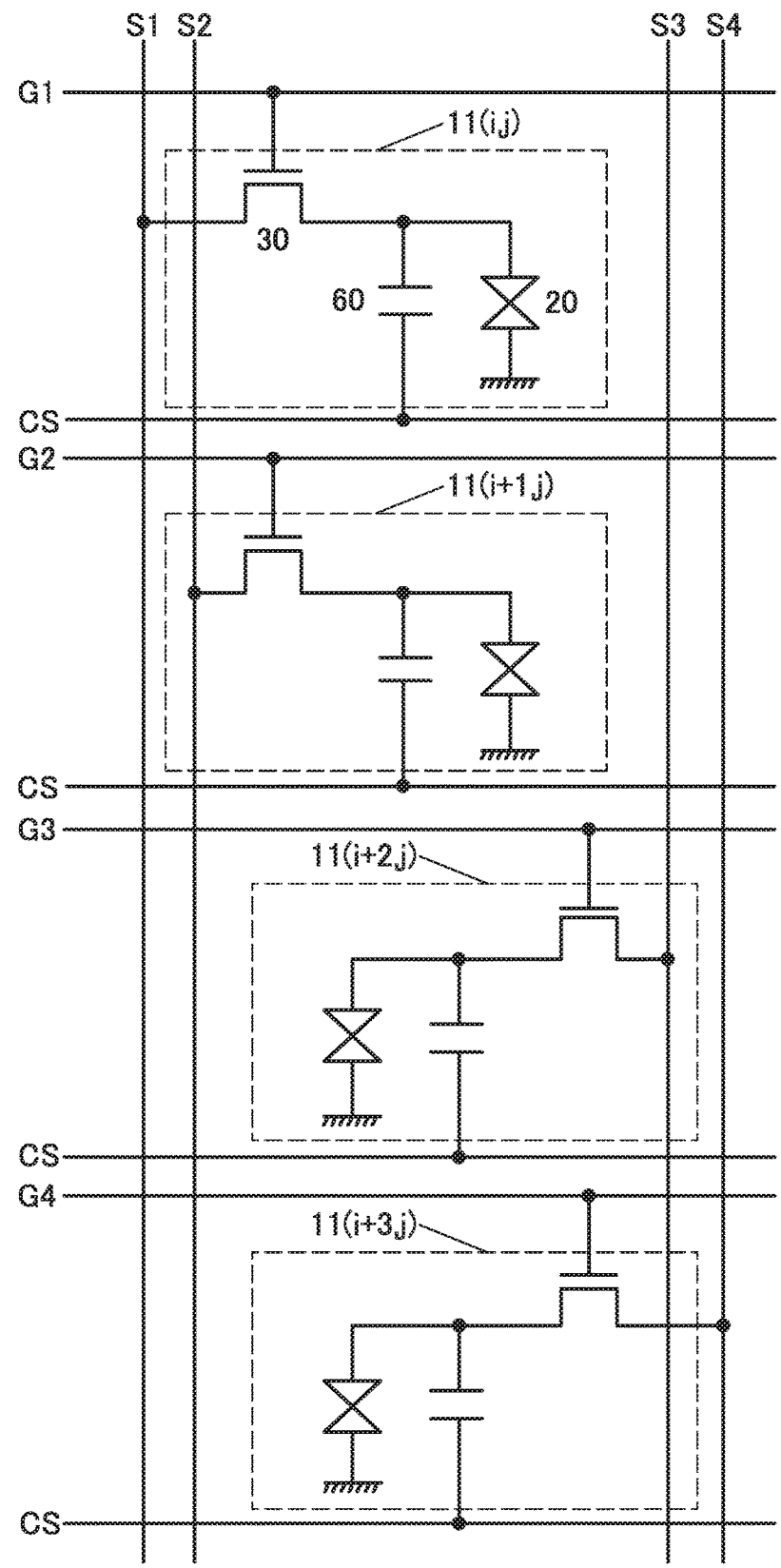
FIG. 7 A structure example of a display device.

FIG. 7 illustrates a circuit diagram including four pixels, the pixel 11(i, j), a pixel 11(i+1, j), a pixel 11(i+2, j), and a pixel 11(i+3, j), arranged in one column in the column direction.

One pixel 11 includes a transistor 30, a liquid crystal element 20, and a capacitor 60.

A wiring S1 to a wiring S4 correspond to source lines, and a wiring G1 to a wiring G4 correspond to gate lines. For example, in the case illustrated in FIG. 7, the wiring S1 corresponds to the wiring $SL_1$(j), the wiring S2 corresponds to the wiring $SL_2$(j), the wiring S3 corresponds to the wiring $SL_3$(j), and the wiring S4 corresponds to the wiring $SL_4$(j). In the case illustrated in FIG. 7, the wiring G1 corresponds to the wiring GL(i), the wiring G2 corresponds to the wiring GL(i+1), the wiring G3 corresponds to the wiring GL(i+2), and the wiring G4 corresponds to the wiring GL(i+3).

The wiring S1 is electrically connected to one of a source and a drain of the transistor 30 included in the pixel 11(i, j), and the wiring G1 is electrically connected to a gate of the transistor 30 included in the pixel 11(i, j). The wiring S2 is electrically connected to one of a source and a drain of the transistor 30 included in the pixel 11(i+1, j), and the wiring G2 is electrically connected to a gate of the transistor 30 included in the pixel 11(i+1, j). The wiring S3 is electrically connected to one of a source and a drain of the transistor 30 included in the pixel 11(i+2, j), and the wiring G3 is electrically connected to a gate of the transistor 30 included in the pixel 11(i+2, j). The wiring S4 is electrically connected to one of a source and a drain of the transistor 30 included in the pixel 11(i+3, j), and the wiring G4 is electrically connected to a gate of the transistor 30 included in the pixel 11(i+3, j).

The other of the source and the drain of the transistor 30 is electrically connected to one electrode of the capacitor 60 and one electrode (pixel electrode) of the liquid crystal element 20. The other electrode of the capacitor 60 is electrically connected to a wiring CS, and a common potential is supplied to the wiring CS.

The transistor 30 has a function of controlling writing of a signal supplied from the source line to the pixel 11 by switching an on state and an off state. Specifically, by turning on the transistor 30, charge corresponding to the signal supplied from the source line can be written to the capacitor 60 electrically connected to the transistor 30. By turning off the transistor 30, the charge written to the capacitor 60 can be retained.

Here, the transistor 30 can be a transistor using amorphous silicon. It is difficult to increase the field-effect mobility of the transistor using amorphous silicon; however, even when such a transistor is used, the display device of one embodiment of the present invention can have extremely high resolution such as 4K, 8K, or the like. In addition, a large display device with a diagonal screen size of 50 inches or larger, 60 inches or larger, or 70 inches or larger can be manufactured.

Alternatively, a transistor including a metal oxide in a channel formation region (hereinafter also referred to as an OS transistor) can be used as the transistor 30. A metal oxide has a larger energy gap than a semiconductor such as silicon, and an OS transistor can have a lower minority carrier density. Therefore, when an OS transistor is in an off state, current flowing between a source and a drain of the OS transistor (hereinafter also referred to as off-state current) is extremely low. Thus, when the OS transistor is used as the transistor 30, charge can be retained in the capacitor 60 for a long time. Accordingly, the frequency of writing of charge to the capacitor 60, that is, the frequency of a refresh operation can be reduced, leading to reduced power consumption of the display device 10.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where a metal oxide has at least one of an amplifying function, a rectifying function, and a switching function, the metal oxide can be referred to as a metal oxide semiconductor, or OS for short. An OS FET refers to a transistor including a metal oxide or an oxide semiconductor.

In this specification and the like, a metal oxide containing nitrogen is also called a metal oxide in some cases. Moreover, a metal oxide containing nitrogen may be referred to as a metal oxynitride.

In this specification and the like, CAAC (c-axis aligned crystal) and CAC (Cloud-Aligned Composite) are stated in some cases. Note that CAAC refers to an example of a crystal structure, and CAC refers to an example of a function or a material composition.

In this specification and the like, a CAC-OS or a CAC-metal oxide has a conducting function in part of the material and an insulating function in another part of the material, and has a function of a semiconductor as the whole material. Note that in the case where the CAC-OS or the CAC-metal oxide is used in an active layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of these functions can maximize both functions.

In this specification and the like, the CAC-OS or the CAC-metal oxide includes conductive regions and insulating regions. The conductive regions have the aforementioned conducting function, and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different bandgaps. For example, the CAC-OS or the CAC-metal oxide is composed of a component having a wide gap due to the insulating region and a component having a narrow gap due to the conductive region. When carriers flow in this composition, carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, a high on-state current and a high field-effect mobility.

In other words, the CAC-OS or the CAC-metal oxide can also be referred to as a matrix composite or a metal matrix composite.

FIG. 8(A) illustrates a layout example of the pixel 11(i+2, j) and the pixel 11(i+3, j).

In FIG. 8(A) and the like, components provided in the same layer are illustrated with the same hatching. Also in the drawings referred to below, components provided in the same layer may be illustrated with the same hatching.

As illustrated in FIG. 8(A), the wiring G3, the wiring G4, and the wiring CS extend in the row direction (the lateral direction), and the wiring S1 to the wiring S4 extend in the column direction (the longitudinal direction).

A structure example of the pixel 11(i+2, j) is described. In the transistor 30 included in the pixel 11(i+2, j), a semiconductor layer 32 is provided over the wiring G3, and part of the wiring G3 has a function as the gate. Part of the wiring S3 has a function as one of the source and the drain. The semiconductor layer 32 includes a region positioned between the wiring S2 and the wiring S3.

A conductive layer 33a having a function as the other of the source and the drain of the transistor 30 and as the one electrode of the capacitor 60 is provided to be electrically connected to the semiconductor layer 32. A conductive layer 21 having a function as the pixel electrode is provided, and the conductive layer 33a and the conductive layer 21 are electrically connected to each other through an opening portion 38.

A structure example of the pixel 11(i+3, j) is described. In the transistor 30 included in the pixel 11(i+3, j), the semiconductor layer 32 is provided over the wiring G4, and part of the wiring G4 has a function as the gate. The semiconductor layer 32 includes a region positioned between the wiring S2 and the wiring S3.

The conductive layer 33a having a function as the other of the source and the drain of the transistor 30 and as the one electrode of the capacitor 60 is provided to be electrically connected to the semiconductor layer 32. The conductive layer 21 having a function as the pixel electrode is provided, and the conductive layer 33a and the conductive layer 21 are electrically connected to each other through the opening portion 38.

A conductive layer 51 having a function as one of the source and the drain of the transistor 30 is provided to be electrically connected to the semiconductor layer 32. Through an opening portion 71, the conductive layer 51 is electrically connected to a conductive layer 52 formed in the same layer as the conductive layer 21. Through an opening portion 72, the conductive layer 52 is electrically connected to a conductive layer 53 formed in the same layer as the wiring G4. Through an opening portion 73, the conductive layer 53 is electrically connected to a conductive layer 54 formed in the same layer as the conductive layer 21. Through an opening portion 74, the conductive layer 54 is electrically connected to the wiring S4.

In other words, in the pixel 11(i+3, j), the conductive layer 51 having a function as one of the source and the drain of the transistor 30 is electrically connected to the wiring S4 through the conductive layer 52, the conductive layer 53, and the conductive layer 54. In the case where the pixel 11(i+3, j) has the structure illustrated in FIG. 8(A), the conductive layer 51, the wiring S3, and the wiring S4 are provided in the same layer and the conductive layer 53 includes a region overlapping with the wiring S3; however, a short-circuit between one of the source and the drain of the transistor 30 and the wiring S3 can be suppressed. Furthermore, the conductive layer 52 and the conductive layer 54 can be formed in the same step as the conductive layer 21 having a function as the pixel electrode, and the conductive layer 53 can be formed in the same step as the wiring G4. Thus, even in the case of the structure in which four source lines are arranged for each column, an increase in the number of steps, specifically, the number of photolithography steps, from that in the case of the structure in which one or two source lines are arranged for each column can be suppressed. In other words, an increase in the number of photomasks can be suppressed. Accordingly, an increase in the manufacturing cost of the display device can be suppressed.

FIG. 8(B) illustrates a layout example of the pixel 11(i, j) and the pixel 11(i+1, j). As illustrated in FIG. 8(B), the wiring G1 and the wiring G2 extend in the row direction.

In the pixel 11(i, j), the conductive layer 51 having a function as one of the source and the drain of the transistor 30 is electrically connected to the wiring S1 through the conductive layer 52, the conductive layer 53, and the conductive layer 54. Except for this, the structure of the pixel 11(i, j) and the structure of the pixel 11(i+3, j) are the same.

In the pixel 11(i+1, j), part of the wiring S2 has a function as one of the source and the drain of the transistor 30. Except for this, the structure of the pixel 11(i+1, j) and the structure of the pixel 11(i+2, j) are the same.

The above is the description of the structure examples of the pixels.

CROSS-SECTIONAL STRUCTURE EXAMPLE

Examples of a cross-sectional structure of the display device are described below.

Cross-Sectional Structure Example 1

Figure 9:
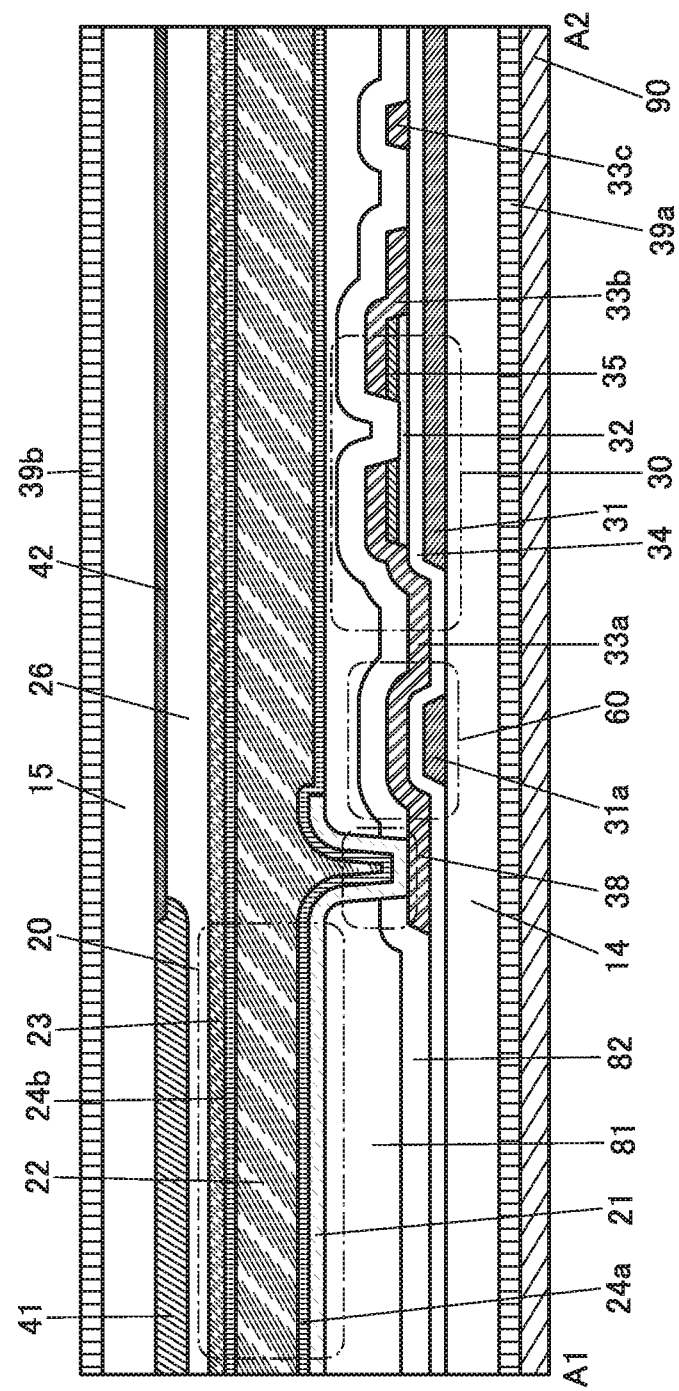
FIG. 9 A structure example of a display device.

FIG. 9 illustrates an example of a cross section along cutting line A1-A2 in FIG. 8(A). Here, an example of the case where the transmissive liquid crystal element 20 is used as a display element is shown. In FIG. 9, a substrate 15 side is a display surface side.

The display device 10 has a structure in which a liquid crystal 22 is provided between a substrate 14 and the substrate 15. The liquid crystal element 20 includes the conductive layer 21 provided on the substrate 14 side, a conductive layer 23 provided on the substrate 15 side, and the liquid crystal 22 provided therebetween. Furthermore, an alignment film 24a is provided between the liquid crystal 22 and the conductive layer 21 and an alignment film 24b is provided between the liquid crystal 22 and the conductive layer 23.

The conductive layer 21 has a function as a pixel electrode. The conductive layer 23 has a function as a common electrode or the like. The conductive layer 21 and the conductive layer 23 each have a function of transmitting visible light. Thus, the liquid crystal element 20 is a transmissive liquid crystal element.

A coloring layer 41 and a light-blocking layer 42 are provided on a surface of the substrate 15 on the substrate 14 side. An insulating layer 26 is provided to cover the coloring layer 41 and the light-blocking layer 42, and the conductive layer 23 is provided to cover the insulating layer 26. The coloring layer 41 is provided in a region overlapping with the conductive layer 21. The light-blocking layer 42 is provided to cover the transistor 30, the opening portion 38, and the like.

A polarizing plate 39a is located outward from the substrate 14, and a polarizing plate 39b is located outward from the substrate 15. Furthermore, a backlight unit 90 is located outward from the polarizing plate 39a.

The transistor 30, the capacitor 60, and the like are provided over the substrate 14. The transistor 30 has a function as a selection transistor of the pixel 11. The transistor 30 is electrically connected to the liquid crystal element 20 through the opening portion 38.

The transistor 30 illustrated in FIG. 9 is a transistor that has what is called a channel-etched bottom-gate structure. The transistor 30 includes a conductive layer 31 having a function as a gate, an insulating layer 34 having a function as a gate insulating layer, the semiconductor layer 32, a pair of impurity semiconductor layers 35 having a function as a source region and a drain region, and a pair of the conductive layer 33a and a conductive layer 33b having a function as a source and a drain. A region of the semiconductor layer 32 overlapping with the conductive layer 31 has a function as a channel formation region. The impurity semiconductor layers 35 are provided in contact with the semiconductor layer 32, and the conductive layer 33a and the conductive layer 33b are provided in contact with the impurity semiconductor layers 35.

In this specification and the like, an impurity semiconductor layer is simply referred to as a semiconductor layer in some cases.

Note that the conductive layer 31 corresponds to part of the wiring G3 in FIG. 8(A), and the conductive layer 33b corresponds to part of the wiring S3. Furthermore, a conductive layer 31a and a conductive layer 33c, which are described later, correspond to part of the wiring CS and part of the wiring S4, respectively.

A semiconductor containing silicon is preferably used for the semiconductor layer 32. For example, amorphous silicon, microcrystalline silicon, polycrystalline silicon, or the like can be used. In particular, amorphous silicon can be formed over a large substrate with a high yield, which is preferable. The display device of one embodiment of the present invention can perform favorable display even in the case where a transistor including amorphous silicon having a relatively low field-effect mobility is used.

The impurity semiconductor layers 35 are formed using a semiconductor to which an impurity element imparting one conductivity type is added. In the case where the transistor is an n-channel transistor, for example, silicon to which P or As is added is given as the semiconductor to which the impurity element imparting one conductivity type is added. In contrast, in the case where the transistor is a p-channel transistor, for example, it is possible to add B as the impurity element imparting one conductivity type; however, it is preferable that the transistor be an n-channel transistor. Note that the impurity semiconductor layers 35 may be formed using an amorphous semiconductor or may be formed using a crystalline semiconductor such as a microcrystalline semiconductor.

The capacitor 60 is made of the conductive layer 31a, the insulating layer 34, and the conductive layer 33a. Furthermore, the conductive layer 33c is provided over the conductive layer 31 with the insulating layer 34 therebetween.

An insulating layer 82 and an insulating layer 81 are stacked to cover the transistor 30 and the like. The conductive layer 21 having a function as the pixel electrode is provided over the insulating layer 81. The conductive layer 21 and the conductive layer 33a are electrically connected to each other through the opening portion 38 provided in the insulating layer 81 and the insulating layer 82. The insulating layer 81 preferably has a function as a planarization layer. The insulating layer 82 preferably has a function as a protective film that inhibits diffusion of impurities or the like to the transistor 30 and the like. An inorganic insulating material can be used for the insulating layer 82, and an organic insulating material can be used for the insulating layer 81, for example.

In this specification and the like, the insulating layer 82 and the insulating layer 81 are collectively regarded as one insulating layer in some cases.

Cross-Sectional Structure Example 2

Figure 10:
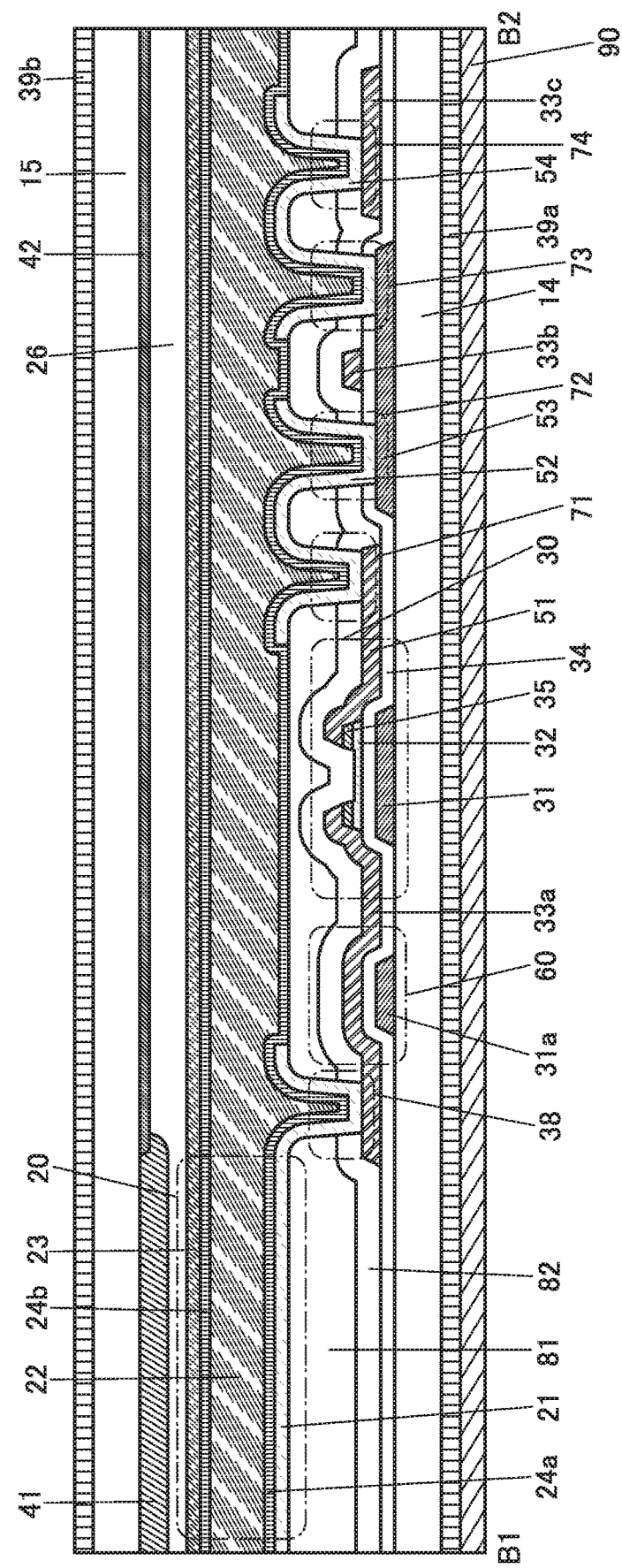
FIG. 10 A structure example of a display device.

FIG. 10 illustrates an example of a cross section along cutting line B1-B2 in FIG. 8(A). The transistor 30 illustrated in FIG. 10 includes the conductive layer 31 having a function as a gate, the insulating layer 34 having a function as a gate insulating layer, the semiconductor layer 32, the pair of impurity semiconductor layers 35 having a function as a source region and a drain region, and a pair of the conductive layer 33a and the conductive layer 51 having a function as a source and a drain. A region of the semiconductor layer 32 overlapping with the conductive layer 31 has a function as a channel formation region. The impurity semiconductor layers 35 are provided in contact with the semiconductor layer 32, and the conductive layer 33a and the conductive layer 51 are provided in contact with the impurity semiconductor layers 35.

Note that the conductive layer 31 corresponds to part of the wiring G4 in FIG. 8(A). As in the case illustrated in FIG. 9, the conductive layer 31a, the conductive layer 33b, and the conductive layer 33c correspond to part of the wiring CS, part of the wiring S3, and part of the wiring S4, respectively. The conductive layer 33b is provided to have a region overlapping with the conductive layer 53 with the insulating layer 34 therebetween.

As described above, the conductive layer 51 and the conductive layer 52 are electrically connected to each other through the opening portion 71 provided in the insulating layer 81 and the insulating layer 82. The conductive layer 52 and the conductive layer 53 are electrically connected to each other through the opening portion 72 provided in the insulating layer 81, the insulating layer 82, and the insulating layer 34. The conductive layer 53 and the conductive layer 54 are electrically connected to each other through the opening portion 73 provided in the insulating layer 81, the insulating layer 82, and the insulating layer 34. The conductive layer 54 and the conductive layer 33c are electrically connected to each other through the opening portion 74 provided in the insulating layer 81 and the insulating layer 82. That is, as described above, the conductive layer 51 having a function as one of the source and the drain of the transistor 30 is electrically connected to the conductive layer 33c corresponding to part of the wiring S4 through the conductive layer 52, the conductive layer 53, and the conductive layer 54. The opening portion 72 and the opening portion 73 are formed with the conductive layer 33b therebetween. Accordingly, a short-circuit between the conductive layer 51 having a function as one of the source and the drain of the transistor 30 and the conductive layer 33b corresponding to part of the wiring S3 is suppressed. Note that as illustrated in FIG. 10, the conductive layer 52 and the conductive layer 54 are formed in the same layer as the conductive layer 21, and the conductive layer 53 is formed in the same layer as the conductive layer 31 and the conductive layer 31a.

Note that components formed in the same layer can include the same material. In other words, for example, the conductive layer 21, the conductive layer 52, and the conductive layer 54 can include the same material. For example, the conductive layer 31, the conductive layer 31a, and the conductive layer 53 can include the same material.

Cross-Sectional Structure Example 3

Figure 11:
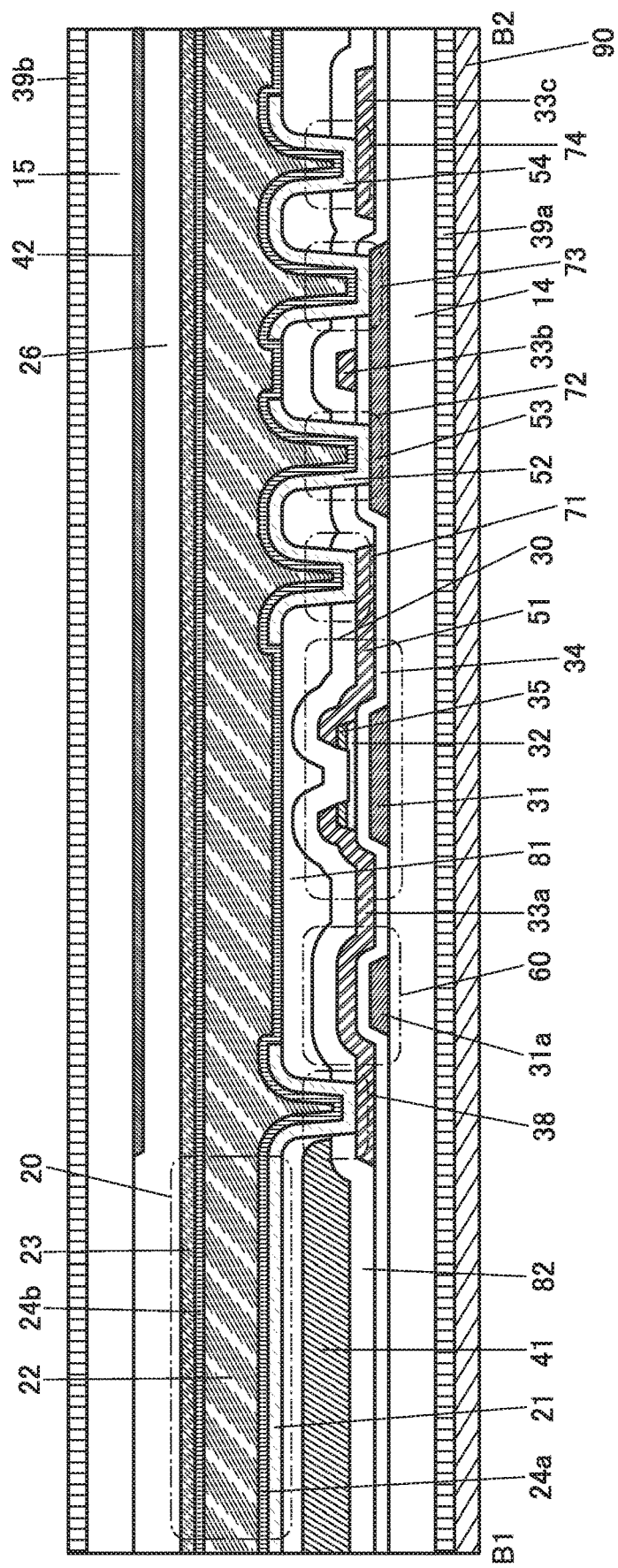
FIG. 11 A structure example of a display device.

FIG. 11 illustrates a modification example of the structure illustrated in FIG. 10. FIG. 11 illustrates an example of the case where the coloring layer 41 is provided on the substrate 14 side. Thus, the structure on the substrate 15 side can be simplified.

Note that in the case where the coloring layer 41 is used as a planarization film, a structure in which the insulating layer 81 is not provided may be employed. Thus, the number of manufacturing steps of the display device 10 can be reduced, and the manufacturing cost of the display device 10 can be reduced.

Cross-Sectional Structure Example 4

Figure 12:
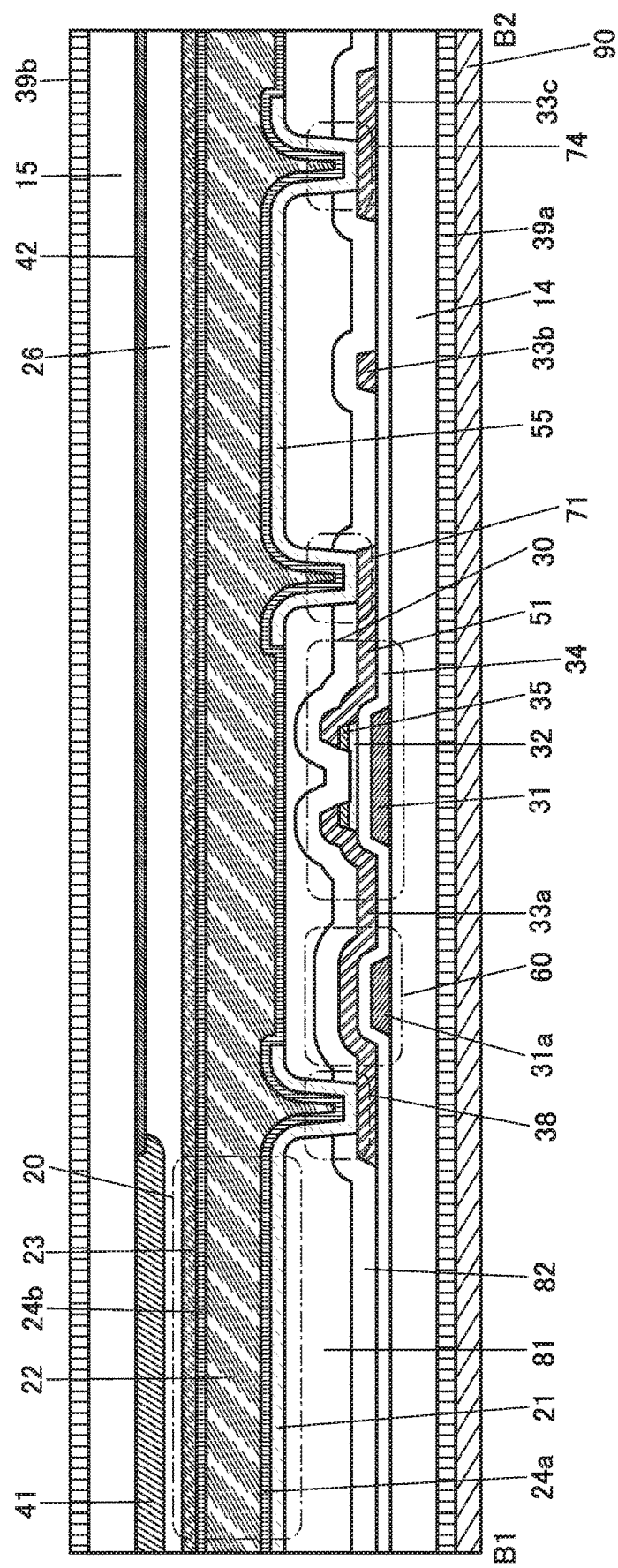
FIG. 12 A structure example of a display device.
Figure 13:
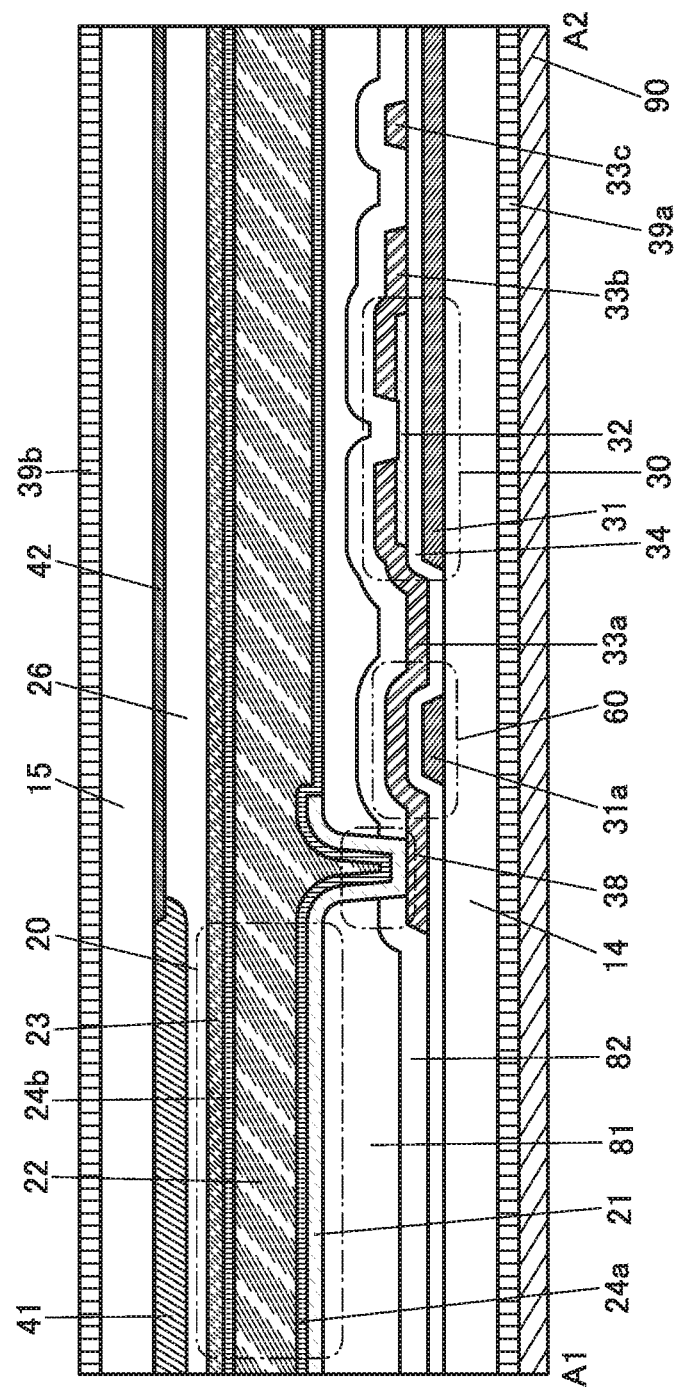
FIG. 13 A structure example of a display device.

FIG. 12 illustrates a modification example of the structure illustrated in FIG. 10. In FIG. 12, an example of the case where the conductive layer 52, the conductive layer 53, the conductive layer 54, the opening portion 72, and the opening portion 73 are omitted. In this case, the conductive layer 51 and the conductive layer 33c are electrically connected to each other through a conductive layer 55 formed in the same layer as the conductive layer 21. Specifically, the conductive layer 51 and the conductive layer 55 are electrically connected to each other through the opening portion 71, and the conductive layer 33c and the conductive layer 55 are electrically connected to each other through the opening portion 74. In the case where the structure illustrated in FIG. 12 is employed, a short-circuit between the conductive layer 51 and the conductive layer 33b can be suppressed.

Cross-Sectional Structure Example 5

FIG. 13, FIG. 14, FIG. 15, and FIG. 16 illustrate a modification example of the structure illustrated in FIG. 9, a modification example of the structure illustrated in FIG. 10, a modification example of the structure illustrated in FIG. 11, and a modification example of the structure illustrated in FIG. 12, respectively. The structures illustrated in FIG. 13 to FIG. 16 are different from the structures illustrated in FIG. 9 to FIG. 12 in that the impurity semiconductor layers 35 are not included.

In the structures illustrated in FIG. 13 to FIG. 16, it is preferable to use a semiconductor including a metal oxide for the semiconductor layer 32. A semiconductor including a metal oxide is used for the semiconductor layer 32, that is, an OS transistor is used as the transistor 30, whereby charge corresponding to the signal supplied from the source line can be retained in the capacitor 60 for a long time, as described above. Accordingly, the frequency of writing of charge to the capacitor 60, that is, the frequency of a refresh operation can be reduced, leading to reduced power consumption of the display device 10.

The above is the description of the cross-sectional structure examples.

[Components]

Each of the above-described components is described below.

<Substrate>

A material having a flat surface can be used as the substrate included in the display panel. As the substrate through which light from the display element is extracted, a material transmitting the light is used. For example, a material such as glass, quartz, ceramics, sapphire, or an organic resin can be used.

The weight and thickness of the display panel can be reduced by using a substrate with a small thickness. Furthermore, a display panel having flexibility can be obtained by using a substrate that is thin enough to have flexibility. Alternatively, glass or the like that is thin enough to have flexibility can be used as the substrate. Further alternatively, a composite material where glass and a resin material are attached to each other with an adhesive layer may be used.

<Transistor>

The transistor includes a conductive layer having a function as a gate, a semiconductor layer, a conductive layer having a function as a source, a conductive layer having a function as a drain, and an insulating layer having a function as a gate insulating layer.

Note that there is no particular limitation on the structure of the transistor included in the display device of one embodiment of the present invention. For example, a planar transistor may be used, a staggered transistor may be used, or an inverted staggered transistor may be used. Either a top-gate transistor or a bottom-gate transistor may be used. Alternatively, gates may be provided above and below a channel.

<Semiconductor Layer>

There is no particular limitation on the crystallinity of the semiconductor layer used for the transistor, and either an amorphous semiconductor or a semiconductor having crystallinity (a microcrystalline semiconductor, a polycrystalline semiconductor, a single crystal semiconductor, or a semiconductor partly including crystal regions) may be used. The use of a semiconductor having crystallinity can suppress deterioration of the transistor characteristics, which is preferable.

For the semiconductor layer of the transistor, for example, an element of Group 14 (silicon, germanium, or the like) can be used. In the case where silicon is used for the semiconductor layer of the transistor, it is particularly preferable to use amorphous silicon. By using amorphous silicon, the transistor can be formed over a large substrate with a high yield, so that mass productivity of the display device of one embodiment of the present invention can be increased.

Alternatively, silicon having crystallinity such as microcrystalline silicon, polycrystalline silicon, or single crystal silicon can be used. In particular, polycrystalline silicon can be formed at a lower temperature than single crystal silicon and has a higher field-effect mobility and a higher reliability than amorphous silicon.

The bottom-gate transistor described as an example in this embodiment is preferable because the number of manufacturing steps can be reduced. In addition, when amorphous silicon, which can be formed at a lower temperature than polycrystalline silicon, is used, materials with low heat resistance can be used as a material of a wiring or an electrode, or a material of a substrate below the semiconductor layer, resulting in wider choice of materials. For example, an extremely large glass substrate or the like can be favorably used. Meanwhile, the top-gate transistor is preferable because an impurity region is easily formed in a self-aligned manner and therefore variation in characteristics and the like can be reduced. This case is particularly preferable in some cases when polycrystalline silicon, single crystal silicon, or the like is used.

A metal oxide can be used for the semiconductor layer of the transistor. Typically, a semiconductor containing silicon, a semiconductor containing gallium arsenide, a metal oxide containing indium, or the like can be used.

In particular, a metal oxide having a wider band gap than silicon is preferably used. A semiconductor material having a wider band gap and a lower carrier density than silicon is preferably used because off-state current of the transistor can be reduced.

Owing to its low off-state current, a transistor using a metal oxide having a wider band gap than silicon enables long-term retention of charges stored in a capacitor that is series-connected to the transistor. The use of such a transistor in a pixel allows a driver circuit to stop while the gray level of an image displayed on each display portion is maintained. As a result, a display device with extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variation in electrical characteristics of the transistors using the semiconductor layer, a stabilizer is preferably contained in addition to them.

Examples of the stabilizer, including the metals that are described above as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide contained in the semiconductor layer, for example, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main components and there is no limitation on the atomic ratio of In to Ga and Zn. For example, the atomic ratio may be In:Ga:Zn=1:1:1, may be In:Ga:Zn=2:2:1, may be In:Ga:Zn=3:1:2, may be In:Ga:Zn=4:2:3, may be In:Ga:Zn=5:1:6, or may be in the neighborhood thereof. Furthermore, a metal element other than In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the metal oxide contained in the semiconductor layer is greater than or equal to 2 eV, preferably greater than or equal to 2.5 eV, further preferably greater than or equal to 3 eV. With use of a metal oxide having such a wide energy gap, the off-state current of the transistor can be reduced.

In the case where the metal oxide contained in the semiconductor layer is an In-M-Zn oxide, it is preferable that the atomic ratio of metal elements of a sputtering target used for forming a film of the In-M-Zn oxide satisfy In≥M. As the atomic ratio of metal elements of such a sputtering target, In:M:Zn=1:1:1, In:M:Zn=1:1:1.2, In:M:Zn=3:1:2, 4:2:4.1, In:M:Zn=2:1:3, In:M:Zn=3:1:2, In:M:Zn=5:1:6, In:M:Zn=5:1:7, In:M:Zn=5:1:8, In:M:Zn=6:1:6, In:M:Zn=5:2:5, and the like are preferable. Note that the atomic ratio of metal elements contained in the formed semiconductor layer varies from the above atomic ratio of metal elements contained in the sputtering target within a range of ±40% as an error.

The metal oxide contained in the semiconductor layer is preferably a later-described CAC-OS or CAC-metal oxide. Thus, the field-effect mobility of the transistor can be increased.

A metal oxide with a low carrier density is preferably used for the semiconductor layer. For example, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{9}/cm^3$ can be used for the semiconductor layer. Such a semiconductor layer has a low impurity concentration and a low density of defect states and thus has stable characteristics. Note that when the semiconductor layer is the metal oxide, water, hydrogen, or the like can be given as an impurity.

In this specification and the like, a metal oxide with a low impurity concentration and a low density of defect states is referred to as a highly purified intrinsic metal oxide or a substantially highly purified intrinsic metal oxide in some cases.

A highly purified intrinsic or substantially highly purified intrinsic metal oxide has few carrier generation sources, and thus has a low carrier density. Thus, a transistor including the metal oxide rarely has electrical characteristics in which the threshold voltage is negative (also referred to as normally-on). The highly purified intrinsic or substantially highly purified intrinsic metal oxide has a low density of defect states and accordingly has a low density of trap states in some cases. Furthermore, a transistor including the highly purified intrinsic or substantially highly purified intrinsic metal oxide has an extremely low off-state current; even when an element has a channel width W of $1\times10^{6}$ μm and a channel length L of 10 μm, the off-state current can be lower than or equal to the measurement limit of a semiconductor parameter analyzer, that is, lower than or equal to $1\times10^{-13}$ A, at a voltage (drain voltage) between a source and a drain in the range from 1 V to 10 V.

Note that the semiconductor layer that can be used in one embodiment of the present invention is not limited to the above, and a material with an appropriate composition may be used depending on required semiconductor characteristics and electric characteristics (field-effect mobility, threshold voltage, and the like) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of Group 14 elements is contained in the metal oxide contained in the semiconductor layer, oxygen vacancies are increased in the semiconductor layer, and the semiconductor layer becomes n-type in some cases. Thus, the concentration of silicon or carbon (the concentration measured by secondary ion mass spectrometry) in the semiconductor layer is preferably lower than or equal to $2\times10^{18}$ atoms/$cm^3$, further preferably lower than or equal to $2\times10^{17}$ atoms/$cm^3$.

An alkali metal and an alkaline earth metal generate carriers in some cases when bonded to a metal oxide, in which case the off-state current of the transistor might be increased. Therefore, the concentration of an alkali metal or an alkaline earth metal of the semiconductor layer, which is obtained by secondary ion mass spectrometry, is preferably lower than or equal to $1\times10^{18}$ atoms/$cm^3$, further preferably lower than or equal to $2\times10^{16}$ atoms/$cm^3$.

The semiconductor layer may have a non-single-crystal structure, for example. Non-single-crystal structures include a polycrystalline structure, a microcrystalline structure, and an amorphous structure, for example. Among the non-single-crystal structures, the amorphous structure has the highest density of defect states.

A metal oxide having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of a region having an amorphous structure, a region having a microcrystalline structure, a region having a polycrystalline structure, and a region having a single crystal structure. The mixed film has, for example, a single-layer structure or a stacked-layer structure including two or more of the above regions in some cases.

<Conductive Layer>

As materials that can be used for the gate, source, and drain of the transistor, and the conductive layers such as the wirings and electrodes included in the display device, metals such as aluminum, titanium, chromium, nickel, copper, yttrium, zirconium, molybdenum, silver, tantalum, and tungsten, an alloy containing any of them as its main component, or the like can be given. A single-layer or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

As a light-transmitting conductive material that can be used for the gate, source, and drain of the transistor and the conductive layers such as the wirings and electrodes included in the display device, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is set small enough to be able to transmit light. A stacked film of any of the above materials can be used for the conductive layers. For example, when a stacked film of indium tin oxide and an alloy of silver and magnesium, or the like is used, the conductivity can be increased, which is preferable. They can also be used for the conductive layers such as the wirings and electrodes included in the display device, and conductive layers (a conductive layer having a function as a pixel electrode or a common electrode) included in the display element.

<Insulating Layer>

Examples of an insulating material that can be used for each of the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

In the case where the semiconductor layer includes a metal oxide, an insulating layer including a region in contact with the semiconductor layer preferably includes a region containing oxygen in excess of the stoichiometric composition (an excess oxygen region). For example, the insulating layer 34 and the insulating layer 82 including a region in contact with the semiconductor layer 32 preferably include an excess oxygen region. Thus, oxygen can be supplied from the insulating layer 34 and the insulating layer 82 to the semiconductor layer 32. In the case where the semiconductor layer 32 includes a metal oxide and oxygen vacancies are formed in the metal oxide, impurities such as hydrogen enters the oxygen vacancies and generates an electron serving as a carrier in some cases. This degrades the electrical characteristics of the transistor in some cases. In the case where the insulating layer including a region in contact with the semiconductor layer includes the excess oxygen region, oxygen can be supplied from the insulating layer to the semiconductor layer, so that the oxygen vacancies can be filled. Thus, the degradation of the electrical characteristics of the transistor can be suppressed. Note that in order to provide the excess oxygen region in the insulating layer, the insulating layer may be formed in an oxygen atmosphere, for example. Alternatively, the formed insulating layer may be subjected to heat treatment in an oxygen atmosphere.

<Liquid Crystal Element>

As the liquid crystal element, for example, a liquid crystal element employing a vertical alignment (VA) mode can be used. Examples of the vertical alignment mode include an MVA (Multi-Domain Vertical Alignment) mode, a PVA (Patterned Vertical Alignment) mode, and an ASV (Advanced Super View) mode.

As the liquid crystal element, a liquid crystal element employing any of a variety of modes can be used. For example, it is possible to use a liquid crystal element employing a TN (Twisted Nematic) mode, an IPS (In-Plane-Switching) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, an ECB (Electrically Controlled Birefringence) mode, a guest-host mode, or the like instead of a VA mode.

Note that the liquid crystal element is an element that controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an optimal liquid crystal material can be used depending on the mode or design to be used.

An alignment film can be provided to control the alignment of a liquid crystal. In the case where a horizontal electric field mode is employed, a liquid crystal exhibiting a blue phase for which an alignment film is not used may be used. The blue phase is one of the liquid crystal phases, which appears just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy. In addition, the liquid crystal composition containing a liquid crystal exhibiting a blue phase and a chiral material does not need alignment treatment and has small viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

The liquid crystal element may be a transmissive liquid crystal element, a reflective liquid crystal element, a transflective liquid crystal element, or the like.

In one embodiment of the present invention, a transmissive liquid crystal element is particularly suitably used.

In the case where a transmissive or transflective liquid crystal element is used, two polarizing plates are provided such that a pair of substrates are sandwiched therebetween. Furthermore, a backlight is provided on the outer side of the polarizing plate. The backlight may be a direct-below backlight or may be an edge-light backlight. The direct-below backlight including an LED (Light Emitting Diode) is preferably used because local dimming is easily performed to improve contrast. The edge-light backlight is preferably used because the thickness of a module including the backlight can be reduced.

When the edge-light backlight is turned off, see-through display can be performed.

<Coloring Layer>

As a material that can be used for the coloring layer, a metal material, a resin material, a resin material containing a pigment or dye, and the like can be given.

<Light-Blocking Layer>

As a material that can be used for the light-blocking layer, carbon black, titanium black, a metal, a metal oxide, a composite oxide containing a solid solution of a plurality of metal oxides, and the like can be given. The light-blocking layer may be a film containing a resin material or may be a thin film of an inorganic material such as a metal. Stacked films of films containing the material of the coloring layer can also be used for the light-blocking layer. For example, a stacked-layer structure of a film containing a material used for a coloring layer which transmits light of a certain color and a film containing a material used for a coloring layer which transmits light of another color can be employed. It is preferable that the coloring layer and the light-blocking layer be formed using the same material because the same apparatus can be used and the process can be simplified.

The above is the description of each of the components.

[Example of Manufacturing Method of Pixel and the Like]

An example of a manufacturing method of the display device 10 will be described below.

Thin films included in the display device (an insulating film, a semiconductor film, a conductive film, and the like) can each be formed by a sputtering method, a chemical vapor deposition (CVD) method, a vacuum evaporation method, a pulsed laser deposition (PLD) method, an atomic layer deposition (ALD) method, or the like. As examples of the CVD method, a plasma-enhanced chemical vapor deposition (PECVD) method, a thermal CVD method, and the like can be given. As an example of the thermal CVD method, a metal organic chemical vapor deposition (MOCVD) method can be given.

The thin films included in the display device (the insulating film, the semiconductor film, the conductive film, and the like) can each be formed by a method such as spin coating, dipping, spray coating, inkjet printing, dispensing, screen printing, or offset printing, or with a doctor knife, a slit coater, a roll coater, a curtain coater, or a knife coater.

The thin films included in the display device can be processed by a lithography method or the like. Alternatively, island-shaped thin films may be formed by a film formation method using a blocking mask. Further alternatively, the thin films may be processed by a nano-imprinting method, a sandblasting method, a lift-off method, or the like.

In the case of processing by a photolithography method, light with an i-line (a wavelength of 365 nm), light with a g-line (a wavelength of 436 nm), light with an h-line (a wavelength of 405 nm), and light in which these are mixed can be given as light used in exposure, for example. Besides, ultraviolet light, KrF laser light, ArF laser light, or the like can also be used. Exposure may be performed by liquid immersion exposure technique. As the light used in exposure, extreme ultra-violet light (EUV), X-rays, and the like can be given. An electron beam can be used instead of the light used in exposure. It is preferable to use extreme ultra-violet light, X-rays, or an electron beam because extremely minute processing can be performed. Note that when exposure is performed by scanning of a beam such as an electron beam, a photomask is not needed.

For etching of the thin films, a dry etching method, a wet etching method, a sandblast method, or the like can be used.

Example 1 of Manufacturing Method

FIG. 17 to FIG. 19 illustrate an example of a manufacturing method of the pixel 11($i$+3, j) and the like having the structure illustrated in FIG. 10. In manufacturing the display device 10, first, a conductive layer is formed over the substrate 14. Next, patterning is performed by a photolithography method or the like and the conductive layer is processed by an etching method or the like, whereby the conductive layer 31, the conductive layer 31a, and the conductive layer 53 are formed (FIG. 17(A)). As described above, the conductive layer 31 corresponds to part of the wiring G3, and the conductive layer 31a corresponds to part of the wiring CS.

Next, the insulating layer 34 is formed. As described above, the insulating layer 34 has a function as the gate insulating layer of the transistor provided in the display device 10.

After that, a semiconductor layer is formed over the insulating layer 34. In the case where, for example, amorphous silicon is used for the semiconductor layer, film formation can be performed by a CVD method or the like using monosilane or the like as a source material. Thus, dangling bonds of silicon included in the semiconductor layer can be terminated with hydrogen and thermodynamic stability can be obtained. Amorphous silicon containing hydrogen, as described above, is referred to as hydrogenated amorphous silicon.

Next, an impurity semiconductor layer which is a semiconductor layer containing an impurity is formed over the semiconductor layer. In the case where, for example, hydrogenated amorphous silicon is used for the impurity semiconductor layer, when the transistor is an n-type transistor, film formation can be performed by a CVD method or the like in which phosphine, arsine, or the like is added to a source material such as monosilane. When the transistor is a p-type transistor, the impurity semiconductor layer can be formed by a CVD method or the like by adding diborane or the like to a source material such as monosilane.

Then, patterning is performed by a photolithography method or the like and the formed semiconductor layer is processed by an etching method or the like, whereby the semiconductor layer 32 and the impurity semiconductor layer 35 are formed (FIG. 17(B)).

Next, a conductive layer is formed over the insulating layer 34 and over the impurity semiconductor layer 35. After that, patterning is performed by a photolithography method or the like and the conductive layer is processed by an etching method or the like, whereby the conductive layer 51, the conductive layer 33a, the conductive layer 33b, and the conductive layer 33c are formed (FIG. 17(C)). As described above, the conductive layer 51 functions as one of the source and the drain of the transistor 30, and the conductive layer 33a has a function as the other of the source and the drain of the transistor 30 and as the one electrode of the capacitor 60. Furthermore, the conductive layer 33b corresponds to part of the wiring S3 and the conductive layer 33c corresponds to part of the wiring S4. The conductive layer 33b is formed so as to have a region overlapping with the conductive layer 53.

Next, the insulating layer 82 is formed, and then the insulating layer 81 is formed. After the insulating layer 81 is formed, planarization treatment is performed on the insulating layer 81 by a chemical mechanical polishing (CMP) method or the like.

Next, patterning is performed by a photolithography method or the like. Then, the insulating layer 81 and the insulating layer 82 are processed by an etching method or the like, whereby the opening portion 71 reaching the conductive layer 51, the opening portion 38 reaching the conductive layer 33a, and the opening portion 74 reaching the conductive layer 33c are formed. Furthermore, the insulating layer 81, the insulating layer 82, and the insulating layer 34 are processed by an etching method or the like, whereby the opening portion 72 and the opening portion 73 reaching the conductive layer 53 are formed with the conductive layer 33b therebetween (FIG. 18(A)). Thus, the opening portion 38 and the opening portion 71 to the opening portion 74 are formed.

Next, a conductive layer is formed over the insulating layer 81 and in the opening portion 38 and the opening portion 71 to the opening portion 74. After that, patterning is performed by a photolithography method or the like and the conductive layer is processed by an etching method or the like, whereby the conductive layer 21, the conductive layer 52, and the conductive layer 54 are formed (FIG. 18(B)). The conductive layer 21 is electrically connected to the conductive layer 33a through the opening portion 38. The conductive layer 52 is electrically connected to the conductive layer 51 through the opening portion 71 and electrically connected to the conductive layer 53 through the opening portion 72. The conductive layer 54 is electrically connected to the conductive layer 53 through the opening portion 73 and electrically connected to the conductive layer 33c through the opening portion 74. As described above, the conductive layer 21 has a function as the pixel electrode of the liquid crystal element provided in the display device 10. In addition, the conductive layer 51 having a function as one of the source and the drain of the transistor 30 is electrically connected to the conductive layer 33c corresponding to part of the wiring S4 through the conductive layer 52, the conductive layer 53, and the conductive layer 54.

Next, the alignment film 24a is formed (FIG. 19(A)). After that, the light-blocking layer 42, the coloring layer 41, the insulating layer 26, the conductive layer 23, and the alignment film 24b are formed over the substrate 15 (FIG. 19(B)). The coloring layer 41 can be formed by a photolithography method, a printing method, or an inkjet method. By using an inkjet method, for example, the coloring layer 41 can be formed at room temperature, formed at a low vacuum, or formed over a large substrate. Thus, the coloring layer 41 can be formed even in an extremely high-resolution display device with a resolution of 4K, 8K, or the like. The coloring layer 41 can also be formed in a large display device with a diagonal screen size of 50 inches or larger, 60 inches or larger, or 70 inches or larger. Since the coloring layer 41 can be formed without a resist mask, the number of manufacturing steps of the display device 10 can be reduced and the manufacturing cost can be reduced.

Next, between the substrate 14 illustrated in FIG. 19(A) and the substrate 15 illustrated in FIG. 19(B), the liquid crystal 22 is sealed with an adhesive layer (not illustrated). Then, the polarizing plate 39a, the polarizing plate 39b, and the backlight unit 90 are formed. Through the above steps, the display device 10 having the structure illustrated in FIG. 10 can be manufactured.

Here, in manufacturing a display device, the smaller the number of photolithography steps in a manufacturing process is, i.e., the smaller the number of photomasks is, the lower the manufacturing cost can be.

For example, among the steps illustrated in FIG. 17 and FIG. 18 (the steps involved in the substrate 14 side), the display device 10 can be manufactured through five photolithography steps in total: a formation step of the conductive layer 31 and the like (FIG. 17(A)), a formation step of the semiconductor layer 32 and the like (FIG. 17(B)), a formation step of the conductive layer 33a and the like (FIG. 17(C)), a formation step of the opening portion 38 and the like (FIG. 18(A)), and a formation step of the conductive layer 21 and the like (FIG. 18(B)). That is, a backplane substrate can be manufactured with five photomasks.

In the case where the display device has a structure in which one or two source lines are provided for each pixel column, the pixel 11 having the structure illustrated in FIG. 10 is not necessarily provided and all the pixels 11 can have the structure illustrated in FIG. 9, for example. Even in this case, the manufacture of the backplane substrate needs five photolithography steps in total. That is, five photomasks are necessary. Thus, even in the case of a structure in which four source lines are provided for each pixel column, the display device can be manufactured with the same number of photomasks as that in the case where one or two source lines are provided for each pixel column. Accordingly, the manufacturing cost of the display device having the structure in which four source lines are provided for each pixel column can be prevented from exceeding the manufacturing cost of the display device having the structure in which one or two source lines are provided for each pixel column.

Example 2 of Manufacturing Method

Figure 14:
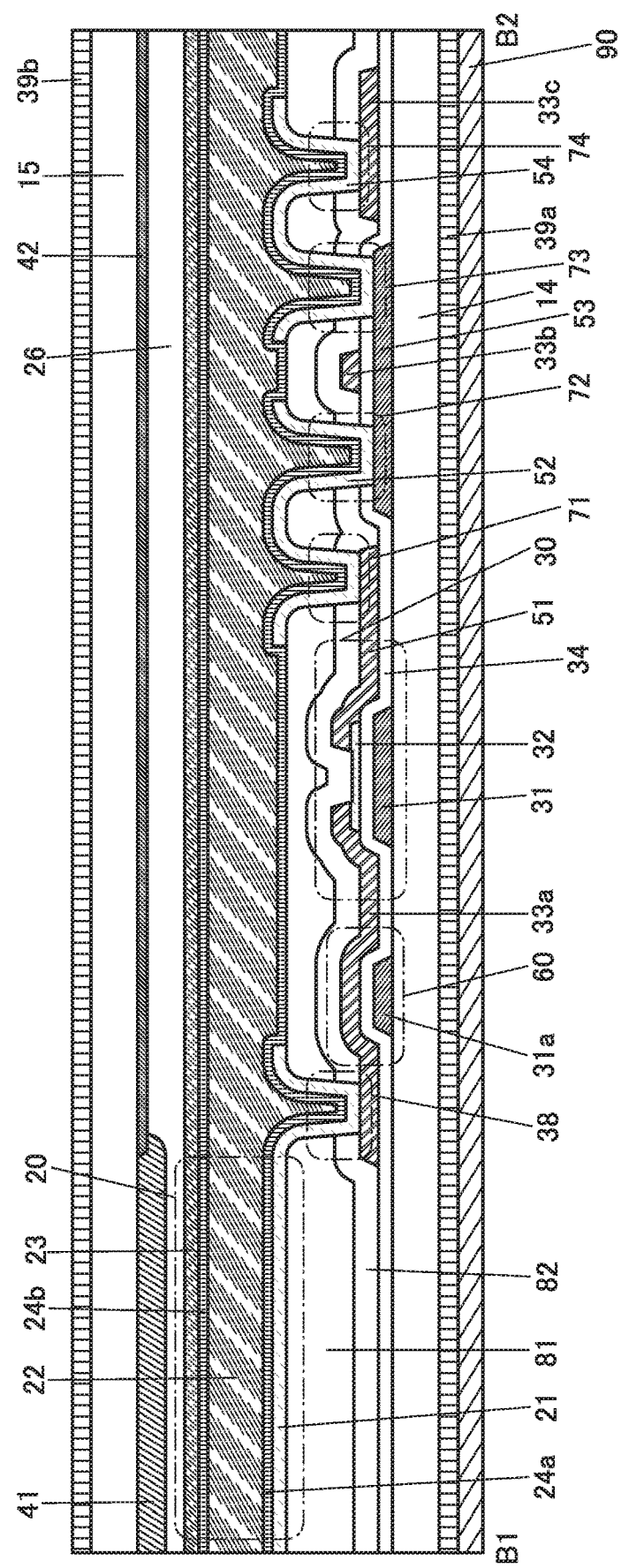
FIG. 14 A structure example of a display device.
Figure 15:
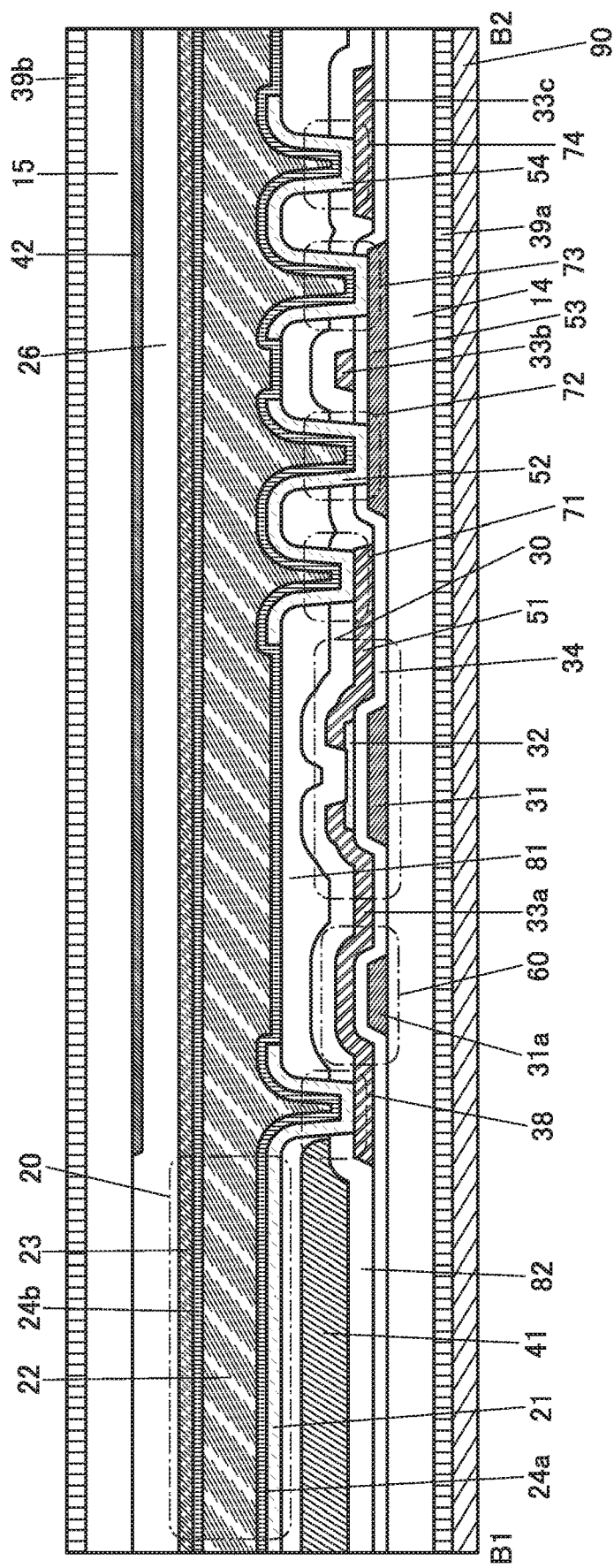
FIG. 15 A structure example of a display device.
Figure 16:
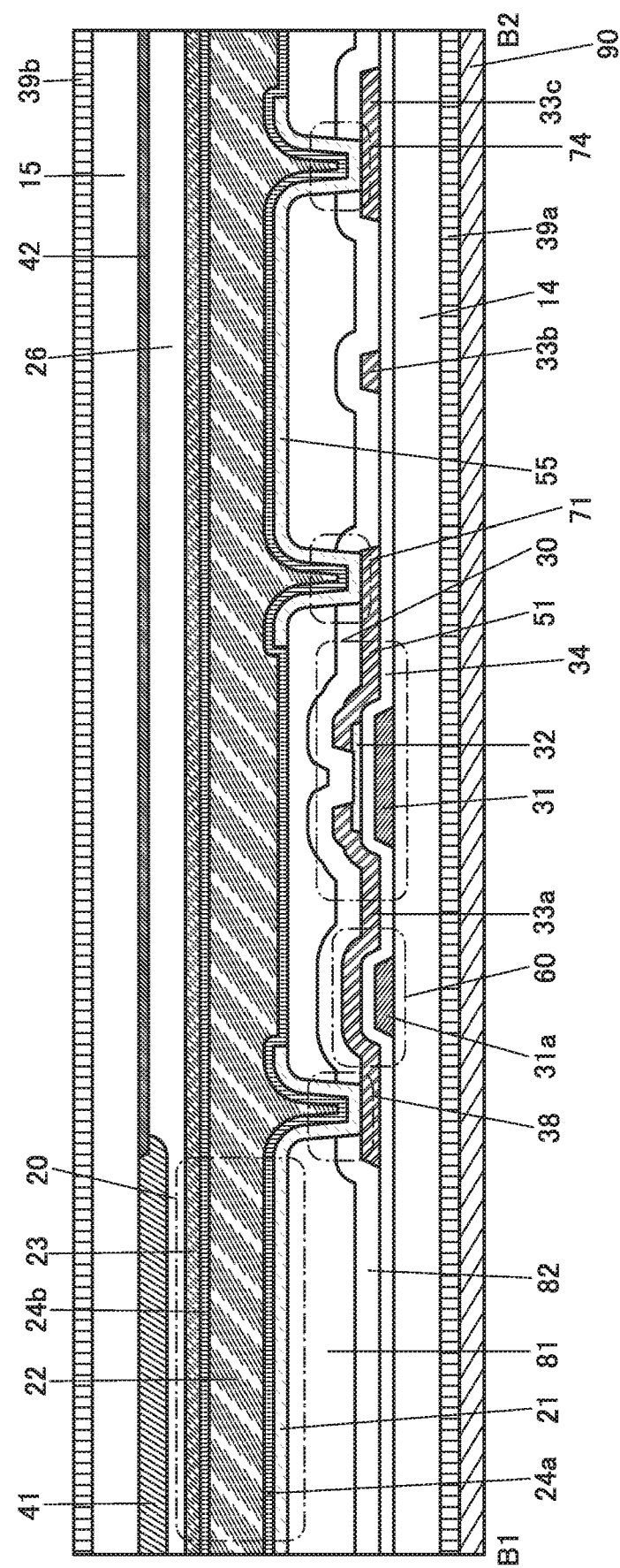
FIG. 16 A structure example of a display device.

FIG. 20 to FIG. 22 illustrate an example of a manufacturing method of the pixel 11($i$+3, j) and the like having the structure illustrated in FIG. 14. FIGS. 20(A), (B), and (C), FIGS. 21(A) and (B), and FIGS. 22(A) and (B) correspond to FIGS. 17(A), (B), and (C), FIGS. 18(A) and (B), and FIGS. 19(A) and (B), respectively. The manufacturing method illustrated in FIG. 20 to FIG. 22 is different from the above-mentioned manufacturing method in that the impurity semiconductor layers 35 are not formed in the step illustrated in FIG. 20(B).

In the manufacturing method illustrated in FIG. 20 to FIG. 22, a metal oxide can be used for the semiconductor layer formed over the insulating layer 34, for example. In this case, the semiconductor layer can be formed by a sputtering method. For example, in the case where an In—Ga—Zn-based oxide is used for the semiconductor layer, the semiconductor layer can be formed by a sputtering method using an In—Ga—Zn-based oxide as a target. The other steps can be performed in a manner similar to that of the manufacturing method illustrated in FIG. 17 to FIG. 19.

The above is the description of examples of a manufacturing method of the pixel and the like.

<Shape of Conductive Layer>

For a conductive layer that can be used as a wiring such as a gate line or a source line, a low-resistance material such as metal or an alloy is preferably used because it can reduce the wiring resistance. In the case where a display device having a large screen is manufactured, it is also effective to increase the width of a wiring. However, such a conductive layer does not transmit visible light, and in a transmissive liquid crystal display device, a large width of a wiring itself and a reduction in aperture ratio owing to an increase in the number of wirings are caused in some cases.

Thus, the shape of an end portion of the conductive layer is devised, whereby light from a backlight unit can be extracted efficiently.

Figure 23A:
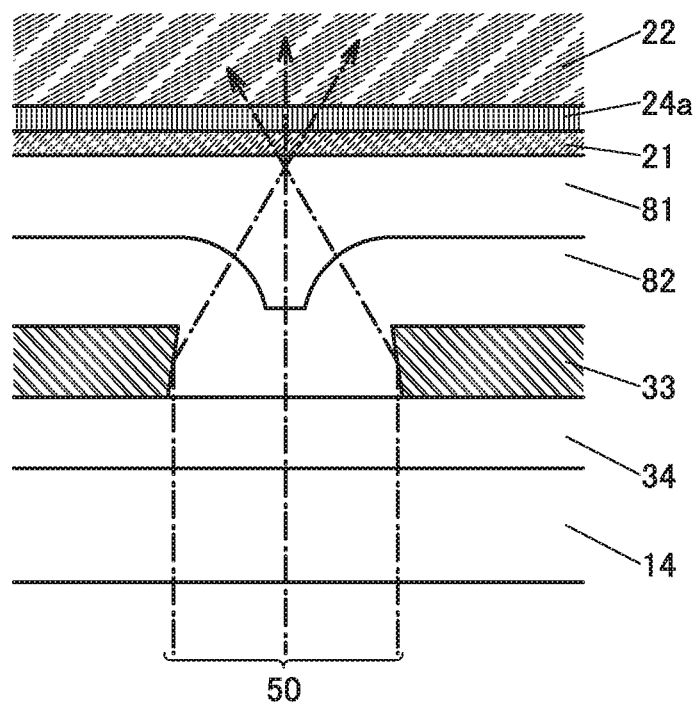
FIG. 23 Structure examples of a display device.

FIG. 23(A) is a cross-sectional view of the conductive layer 33 forming a source line and the like and the vicinity thereof. An end portion of the conductive layer 33 has an inverse tapered shape. The conductive layer 33 can be the conductive layer 33$a$, the conductive layer 33$b$, and the conductive layer 33$c$, for example. Alternatively, the conductive layer 33 can be the conductive layer 51, for example.

Here, a taper angle refers to an angle between a bottom surface (a surface in contact with a surface where a thin film is formed) and a side surface at an end portion of the thin film. The taper angle is greater than 0° and less than 180°. A taper with an angle less than 90° is referred to as a forward taper whereas a taper with an angle greater than 90° is referred to as an inverse taper.

As illustrated in FIG. 23(A), when the conductive layer 33 has an inverse tapered shape, part of light 50 from the backlight unit is reflected by a side surface of the conductive layer 33 and reaches the liquid crystal 22. Consequently, the light extraction efficiency can be increased compared with the case where a side surface of the conductive layer 33 is perpendicular or has a forward tapered shape.

Here, the taper angle of the conductive layer 33 is preferably greater than 90° and less than 135°, further preferably greater than or equal to 91° and less than or equal to 120°, still further preferably greater than or equal to 95° and less than or equal to 110°.

Figure 23B:
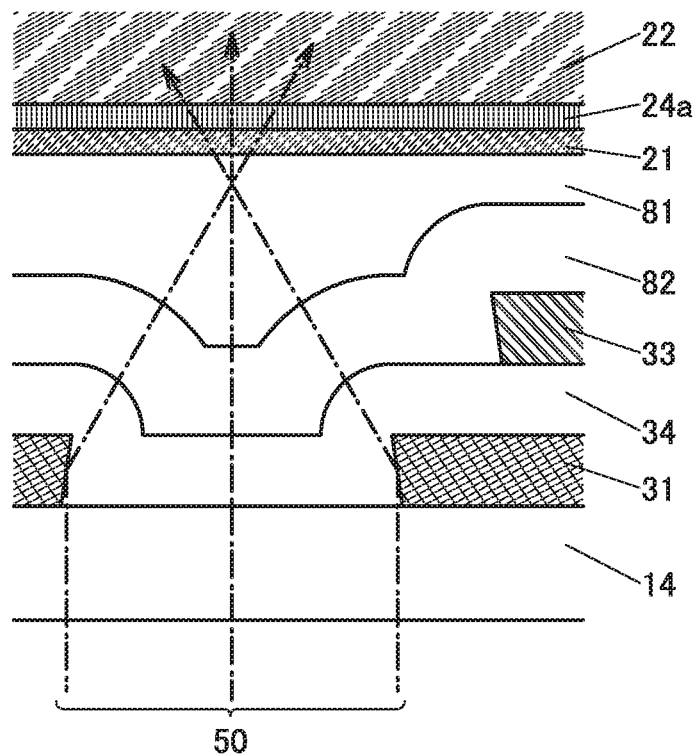

FIG. 23(B) illustrates an example of the case where the conductive layer 31 forming a gate line and the like has an inverse tapered shape. When the conductive layer 31 has an inverse tapered shape as well as the conductive layer 33, the light extraction efficiency can be increased more efficiently.

The above is the description of the shape of the conductive layer.

At least part of this embodiment can be implemented in combination with any of the other embodiments described in this specification as appropriate.

Embodiment 2

In this embodiment, an example of a transistor that can be used for the display device or the like described in the above embodiment is described with reference to drawings.

Structure Example 1 of Transistor

Modification examples of the transistor illustrated in FIG. 9 to FIG. 12 and the like are described below.

Figure 24A:
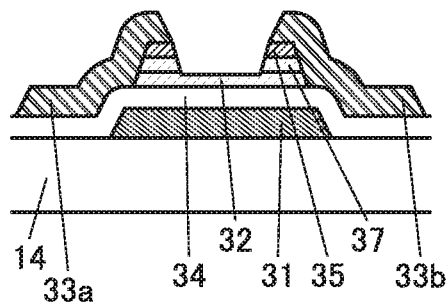
FIG. 24 Structure examples of a transistor.

A transistor illustrated in FIG. 24(A) includes a semiconductor layer 37 between the semiconductor layer 32 and the impurity semiconductor layers 35.

The semiconductor layer 37 may be formed using the same semiconductor film as the semiconductor layer 32. The semiconductor layer 37 has a function as an etching stopper for preventing the semiconductor layer 32 from being removed by etching at the time of etching of the impurity semiconductor layers 35. Although FIG. 24(A) illustrates an example where the semiconductor layer 37 is divided into a right portion and a left portion, part of the semiconductor layer 37 may cover a channel formation region of the semiconductor layer 32.

Furthermore, the semiconductor layer 37 may contain an impurity at a concentration lower than that in the impurity semiconductor layer 35. Thus, the semiconductor layer 37 can function as an LDD (Lightly Doped Drain) region and can suppress the hot channel effect when the transistor is driven.

Figure 24B:
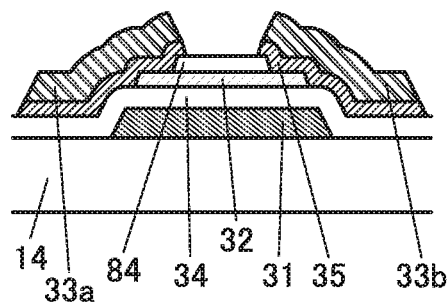

In a transistor illustrated in FIG. 24(B), an insulating layer 84 is provided over the channel formation region of the semiconductor layer 32. The insulating layer 84 has a function as an etching stopper at the time of etching of the impurity semiconductor layer 35.

Figure 24C:
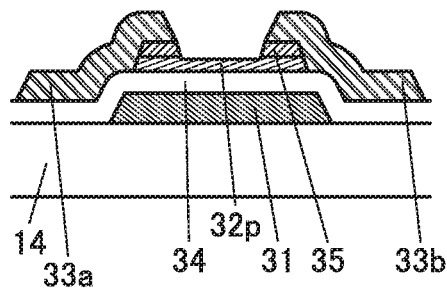

A transistor illustrated in FIG. 24(C) includes a semiconductor layer 32$p$ instead of the semiconductor layer 32. The semiconductor layer 32$p$ includes a semiconductor film having high crystallinity. For example, the semiconductor layer 32$p$ contains a polycrystalline semiconductor or a single crystal semiconductor. Thus, a transistor having a high field-effect mobility can be provided.

Figure 24D:
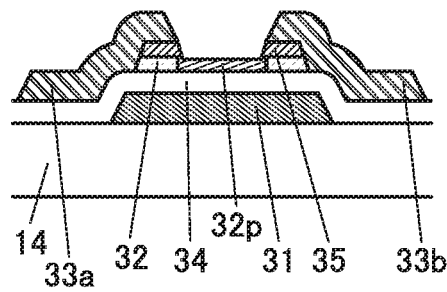

A transistor illustrated in FIG. 24(D) includes the semiconductor layer 32$p$ in the channel formation region of the semiconductor layer 32. For example, the transistor illustrated in FIG. 24(D) can be formed by irradiating a semiconductor film to be the semiconductor layer 32 with laser light or the like so that crystallization is caused locally. Thus, a transistor having a high field-effect mobility can be provided.

Figure 24E:
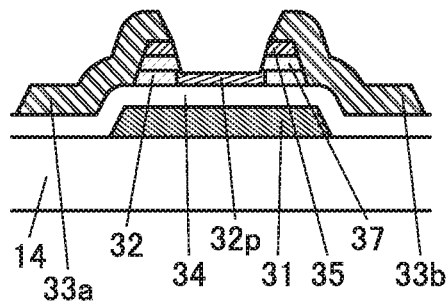

A transistor illustrated in FIG. 24(E) includes the semiconductor layer 32$p$ having crystallinity in the channel formation region of the semiconductor layer 32 of the transistor illustrated in FIG. 24(A).

Figure 24F:
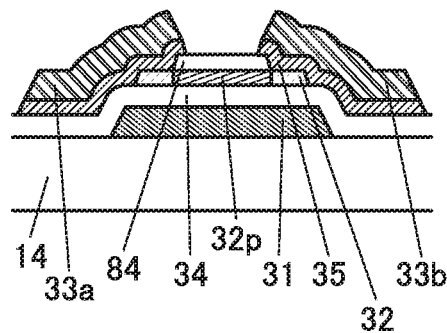

A transistor illustrated in FIG. 24(F) includes the semiconductor layer 32p having crystallinity in the channel formation region of the semiconductor layer 32 of the transistor illustrated in FIG. 24(B).

Structure Example 2 of Transistor

Modification examples of the transistor illustrated in FIG. 13 to FIG. 16 and the like are described below.

Figure 25A:
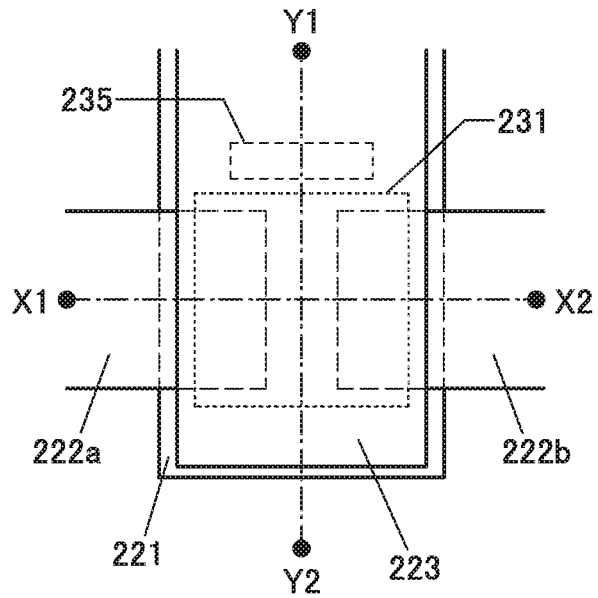
FIG. 25 A structure example of a transistor.
Figure 25B:
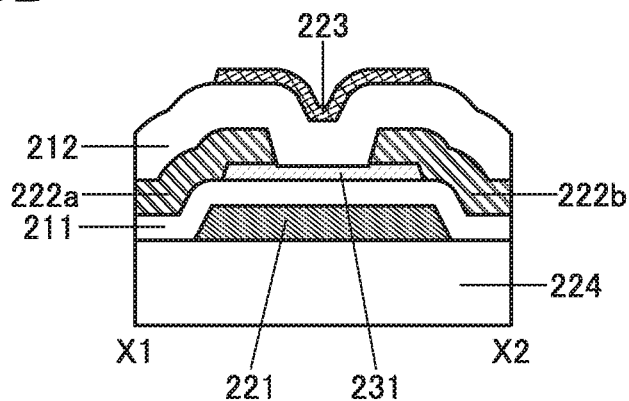
Figure 25C:
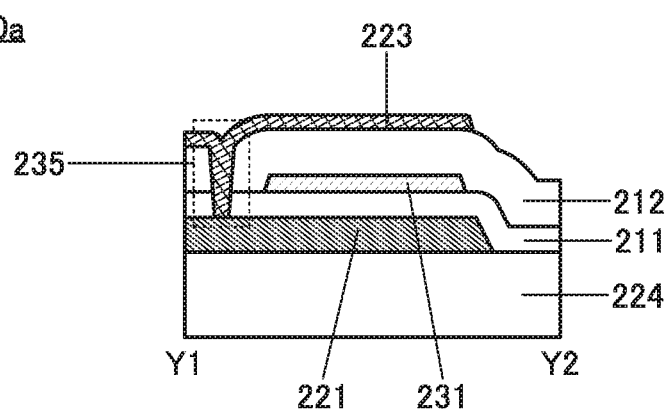

As an example of a structure of a transistor, a transistor 200a is described with reference to FIGS. 25(A), (B), and (C). FIG. 25(A) is a top view of the transistor 200a. FIG. 25(B) corresponds to a cross-sectional view of a cut plane taken along dashed-dotted line X1-X2 in FIG. 25(A), and FIG. 25(C) corresponds to a cross-sectional view of a cut plane taken along dashed-dotted line Y1-Y2 in FIG. 25(A). Note that in FIG. 25(A), some components of the transistor 200a (an insulating layer having a function as a gate insulating layer, and the like) are omitted to avoid complexity. Note that hereinafter, in some cases, the direction of the dashed-dotted line X1-X2 is called the channel length direction, and the direction of the dashed-dotted line Y1-Y2 is called the channel width direction. As in FIG. 25(A), in some cases, some components are omitted from some top views of transistors described below.

The transistor 200a includes a conductive layer 221 over an insulating layer 224, an insulating layer 211 over the insulating layer 224 and over the conductive layer 221, a semiconductor layer 231 over the insulating layer 211, a conductive layer 222a over the semiconductor layer 231 and over the insulating layer 211, a conductive layer 222b over the semiconductor layer 231 and over the insulating layer 211, an insulating layer 212 over the semiconductor layer 231, over the conductive layer 222a, and over the conductive layer 222b, and a conductive layer 223 over the insulating layer 212.

Note that the insulating layer 224 can be a substrate instead of an insulating layer. In the case where the insulating layer 224 is a substrate, the substrate can be a substrate that contains a material similar to that of the substrate 14 described in Embodiment 1.

The conductive layer 221 and the conductive layer 223 can contain a material similar to that of the conductive layer 31 described in Embodiment 1, for example. The insulating layer 211 can contain a material similar to that of the insulating layer 34 described in Embodiment 1, for example. The conductive layer 222a and the conductive layer 222b can contain a material similar to that of the conductive layer 33 and the conductive layer 51 described in Embodiment 1, for example. The insulating layer 212 can contain a material similar to that of the insulating layer 82 described in Embodiment 1.

As the semiconductor layer 231, like the semiconductor layer 32 described in Embodiment 1, a semiconductor layer containing a metal oxide can be used. In this embodiment, the case where the semiconductor layer 231 is a semiconductor layer containing a metal oxide is described.

The insulating layer 211 and the insulating layer 212 have an opening portion 235. The conductive layer 223 is electrically connected to the conductive layer 221 through the opening portion 235.

Here, the insulating layer 211 has a function as a first gate insulating layer of the transistor 200a, and the insulating layer 212 has a function as a second gate insulating layer of the transistor 200a. In the transistor 200a, the conductive layer 221 has a function as a first gate, the conductive layer 222a has a function as one of a source and a drain, and the conductive layer 222b has a function as the other of the source and the drain. In the transistor 200a, the conductive layer 223 has a function as a second gate.

Note that the transistor 200a is what is called a channel-etched transistor, and has a dual-gate structure.

The transistor 200a can have a structure in which the conductive layer 223 is not provided. In that case, the transistor 200a is what is called a channel-etched transistor, and has a bottom-gate structure.

As illustrated in FIGS. 25(B) and (C), the semiconductor layer 231 is positioned to face the conductive layer 221 and the conductive layer 223, and is sandwiched between two conductive layers having functions as the gates. The length of the conductive layer 223 in the channel length direction and the length of the conductive layer 223 in the channel width direction are longer than the length of the semiconductor layer 231 in the channel length direction and the length of the semiconductor layer 231 in the channel width direction, respectively, and the whole semiconductor layer 231 is covered with the conductive layer 223 with the insulating layer 212 therebetween.

In other words, the conductive layer 221 and the conductive layer 223 are connected to each other in the opening portion 235 provided in the insulating layer 211 and the insulating layer 212, and each have a region located outside a side end portion of the semiconductor layer 231.

With this structure, the semiconductor layer 231 included in the transistor 200a can be electrically surrounded by electric fields of the conductive layer 221 and the conductive layer 223. A device structure of a transistor in which electric fields of a first gate and a second gate electrically surround a semiconductor layer where a channel formation region is formed, like in the transistor 200a, can be referred to as a surrounded channel (s-channel) structure.

Since the transistor 200a has the s-channel structure, an electric field for inducing a channel can be effectively applied to the semiconductor layer 231 by the conductive layer 221 having a function as the first gate; therefore, the current drive capability of the transistor 200a can be improved and high on-state current characteristics can be obtained. Since the on-state current can be increased, it is possible to reduce the size of the transistor 200a. In addition, since the transistor 200a has a structure in which the semiconductor layer 231 is surrounded by the conductive layer 221 having a function as the first gate and the conductive layer 223 having a function as the second gate, the mechanical strength of the transistor 200a can be increased.

Since the transistor 200a having the s-channel structure has a high field-effect mobility and high driving capability, the use of the transistor 200a in a driver circuit, typically in a gate driver, allows the display device to have a narrow frame.

Figure 26A:
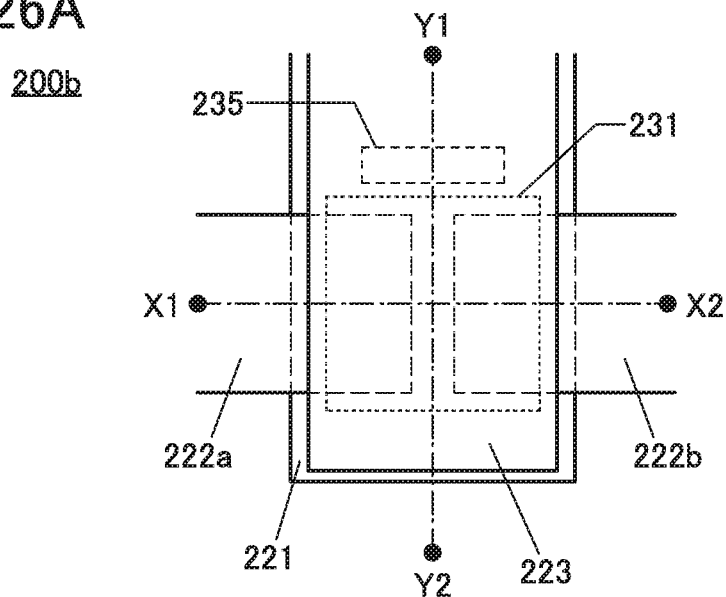
FIG. 26 A structure example of a transistor.
Figure 26B:
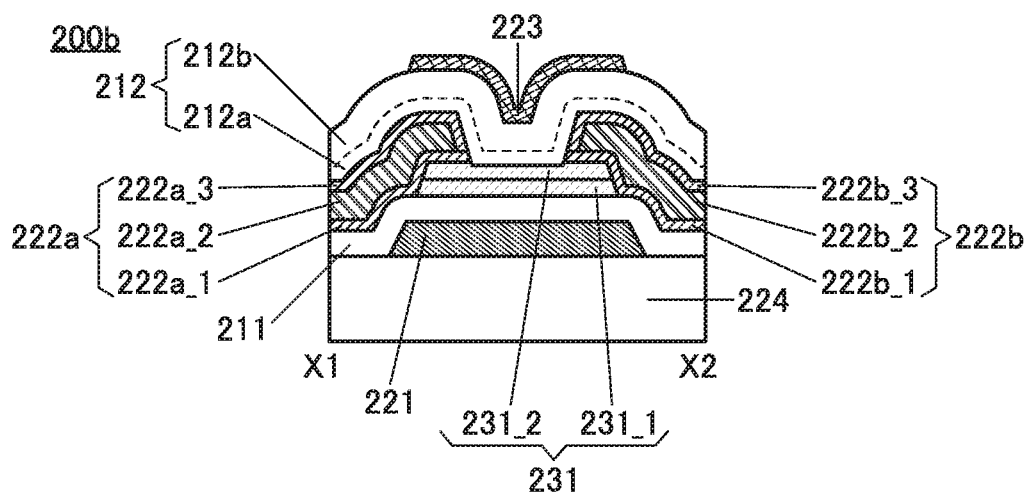
Figure 26C:
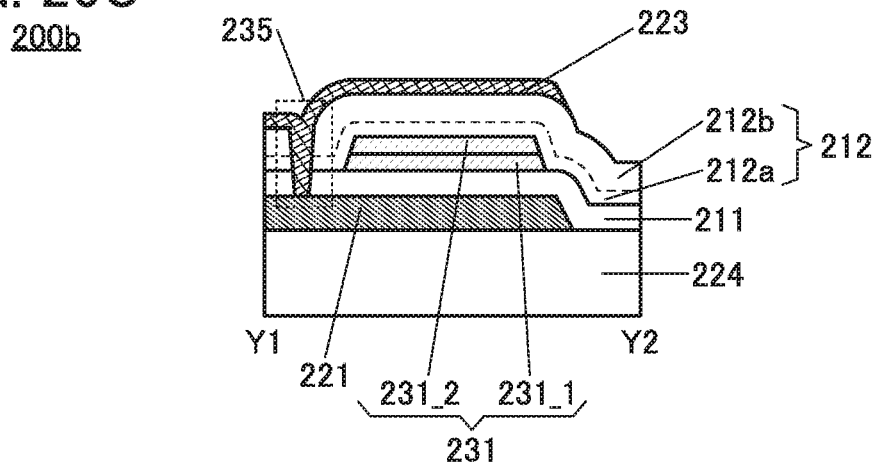

Next, as an example of a structure of a transistor, a transistor 200b is described with reference to FIGS. 26(A), (B), and (C). FIG. 26(A) is a top view of the transistor 200b. FIG. 26(B) corresponds to a cross-sectional view of a cut plane taken along dashed-dotted line X1-X2 in FIG. 26(A), and FIG. 26(C) corresponds to a cross-sectional view of a cut plane taken along dashed-dotted line Y1-Y2 in FIG. 26(A).

The transistor 200b is different from the transistor 200a in that the semiconductor layer 231, the conductive layer 222a, the conductive layer 222b, and the insulating layer 212 each have a stacked-layer structure.

The insulating layer 212 includes an insulating layer 212a over the semiconductor layer 231, over the conductive layer 222a, and over the conductive layer 222b, and an insulating layer 212b over the insulating layer 212a. The insulating layer 212 has a function of supplying oxygen to the semiconductor layer 231. That is, the insulating layer 212 contains oxygen. The insulating layer 212a is an insulating layer that can transmit oxygen. Note that the insulating layer 212a also functions as a film that relieves damage to the semiconductor layer 231 at the time of forming the insulating layer 212b in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating layer 212a.

In addition, it is preferable that the number of defects in the insulating layer 212a be small, and typically, it is preferable that the spin density corresponding to a signal that appears at g=2.001 due to a dangling bond of silicon be lower than or equal to $3 \times 10^{17}$ spins/cm$^3$ by ESR measurement. This is because if the density of defects contained in the insulating layer 212a is high, oxygen is bonded to the defects and the property of transmitting oxygen of the insulating layer 212a is lowered.

Note that in the insulating layer 212a, in some cases, not all oxygen that has entered the insulating layer 212a from the outside moves to the outside of the insulating layer 212a but some oxygen remains in the insulating layer 212a. Furthermore, movement of oxygen occurs in the insulating layer 212a in some cases in such a manner that oxygen enters the insulating layer 212a and oxygen contained in the insulating layer 212a moves to the outside of the insulating layer 212a. When an oxide insulating layer that can transmit oxygen is formed as the insulating layer 212a, oxygen released from the insulating layer 212b provided over the insulating layer 212a can be moved to the semiconductor layer 231 through the insulating layer 212a.

Note that as the insulating layer 212a, an oxide insulating layer having a low density of states due to nitrogen oxide can be used. Note that the density of states due to nitrogen oxide can be formed between the energy of the valence band maximum of the metal oxide and the energy of the conduction band minimum of the metal oxide. A silicon oxynitride film that releases a small amount of nitrogen oxide, an aluminum oxynitride film that releases a small amount of nitrogen oxide, or the like can be used as the above oxide insulating layer.

Note that a silicon oxynitride film that releases a small amount of nitrogen oxide is a film that releases ammonia more than nitrogen oxide in thermal desorption spectroscopy (TDS) analysis; the amount of released ammonia is typically greater than or equal to $1 \times 10^{18}$/cm$^3$ and less than or equal to $5 \times 10^{19}$/cm$^3$. Note that the amount of released ammonia is the released amount by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$, x is greater than 0 and less than or equal to 2, preferably greater than or equal to 1 and less than or equal to 2), typically NO$_2$ or NO, forms levels in the insulating layer 212a or the like. The level is positioned in the energy gap of the semiconductor layer 231. Therefore, when nitrogen oxide is diffused to the interface between the insulating layer 212a and the semiconductor layer 231, an electron is in some cases trapped by the level on the insulating layer 212a side. As a result, the trapped electron remains in the vicinity of the interface between the insulating layer 212a and the semiconductor layer 231; thus, the threshold voltage of the transistor is shifted in the positive direction.

Nitrogen oxide reacts with ammonia and oxygen in heat treatment. Since nitrogen oxide contained in the insulating layer 212a reacts with ammonia contained in the insulating layer 212b in heat treatment, nitrogen oxide contained in the insulating layer 212a is reduced. Therefore, an electron is hardly trapped at the interface between the insulating layer 212a and the semiconductor layer 231.

By using the above oxide insulating layer as the insulating layer 212a, the shift in the threshold voltage of the transistor can be reduced, which leads to a smaller change in the electrical characteristics of the transistor.

The concentration of nitrogen of the above oxide insulating layer measured by SIMS is lower than or equal to $6 \times 10^{20}$ atoms/cm$^3$.

The above oxide insulating layer is formed by a PECVD method using silane and dinitrogen monoxide at a substrate temperature higher than or equal to 220° C. and lower than or equal to 350° C., whereby a dense and hard film can be formed.

The insulating layer 212b is an oxide insulating layer which contains oxygen at a higher proportion than the stoichiometric composition. Part of oxygen is released from the above oxide insulating layer by heating. Note that the above oxide insulating layer includes a region in which the amount of released oxygen in TDS is greater than or equal to $1.0 \times 10^{19}$ atoms/cm$^3$, preferably greater than or equal to $3.0 \times 10^{20}$ atoms/cm$^3$. Note that the amount of released oxygen is the total amount in a temperature range of 50° C. to 650° C. or 50° C. to 550° C. in heat treatment in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating layer 212b.

It is preferable that the number of defects in the insulating layer 212b be small, and typically, it is preferable that the spin density corresponding to a signal that appears at g=2.001 due to a dangling bond of silicon be lower than $1.5 \times 10^{18}$ spins/cm$^3$, further preferably lower than or equal to $1 \times 10^{18}$ spins/cm$^3$ by ESR measurement. Note that the insulating layer 212b is provided more apart from the semiconductor layer 231 than the insulating layer 212a is, and thus may have higher density of defects than the insulating layer 212a.

Furthermore, the insulating layer 212a and the insulating layer 212b can be formed using insulating layers formed of the same kinds of materials; thus, an interface between the insulating layer 212a and the insulating layer 212b cannot be clearly observed in some cases. Thus, in this embodiment, the interface between the insulating layer 212a and the insulating layer 212b is shown by a dashed line. Although a two-layer structure of the insulating layer 212a and the insulating layer 212b is described in this embodiment, the present invention is not limited to this; for example, a single-layer structure of the insulating layer 212a or a stacked-layer structure of three or more layers may be employed.

The semiconductor layer 231 in the transistor 200b includes a semiconductor layer 231_1 over the insulating layer 211 and a semiconductor layer 231_2 over the semiconductor layer 231_1. The semiconductor layer 231_1 and the semiconductor layer 231_2 contain the same element.

For example, it is preferable that the semiconductor layer 231_1 and the semiconductor layer 231_2 each contain the same element as the element in the above semiconductor layer 231.

Each of the semiconductor layer 231_1 and the semiconductor layer 231_2 preferably includes a region where the atomic proportion of In is higher than that of element M For example, the atomic ratio of In to M and Zn in each of the semiconductor layer 231_1 and the semiconductor layer 231_2 is preferably In:M:Zn=4:2:3 or in the neighborhood thereof. Here, neighborhood means that when In is 4, M ranges from 1.5 to 2.5 and Zn ranges from 2 to 4. Alternatively, the atomic ratio of In to M and Zn in each of the semiconductor layer 231_1 and the semiconductor layer 231_2 is preferably In:M:Zn=5:1:6 or in the neighborhood thereof. The semiconductor layer 231_1 and the semiconductor layer 231_2 having substantially the same composition can be formed using the same sputtering target; thus, the manufacturing cost can be reduced. When the same sputtering target is used, the semiconductor layer 231_1 and the semiconductor layer 231_2 can be formed successively in the same chamber in a vacuum; therefore, entry of impurities into the interface between the semiconductor layer 231_1 and the semiconductor layer 231_2 can be suppressed.

Here, the semiconductor layer 231_1 may include a region whose crystallinity is lower than that of the semiconductor layer 231_2. Note that the crystallinity of the semiconductor layer 231_1 and the semiconductor layer 231_2 can be determined by analysis by X-ray diffraction (XRD) or analysis with a transmission electron microscope (TEM), for example.

The region with low crystallinity in the semiconductor layer 231_1 serves as a diffusion path of excess oxygen, through which excess oxygen can also be diffused into the semiconductor layer 231_2 having higher crystallinity than the semiconductor layer 231_1. When a stacked-layer structure including the semiconductor layers having different crystal structures is employed and the region with low crystallinity is used as a diffusion path of excess oxygen as described above, a highly reliable transistor can be provided.

The semiconductor layer 231_2 including a region with higher crystallinity than the semiconductor layer 231_1 can prevent impurities from entering the semiconductor layer 231. In particular, the increased crystallinity of the semiconductor layer 231_2 can suppress damage at the time of forming the conductive layer 222a and the conductive layer 222b. The surface of the semiconductor layer 231, i.e., the surface of the semiconductor layer 231_2 is exposed to an etchant or an etching gas at the time of forming the conductive layer 222a and the conductive layer 222b. However, when the semiconductor layer 231_2 includes a region with high crystallinity, the semiconductor layer 231_2 has higher etching resistance than the semiconductor layer 231_1 with low crystallinity. Thus, the semiconductor layer 231_2 has a function as an etching stopper.

By including a region with lower crystallinity than the semiconductor layer 231_2, the semiconductor layer 231_1 sometimes has a high carrier density.

When the semiconductor layer 231_1 has a high carrier density, the Fermi level is sometimes high relative to the conduction band of the semiconductor layer 231_1. This lowers the conduction band minimum of the semiconductor layer 231_1, so that the energy difference between the conduction band minimum of the semiconductor layer 231_1 and the trap level, which might be formed in a gate insulating layer (here, the insulating layer 211), is increased in some cases. The increase of the energy difference can reduce trap of charges in the gate insulating layer and reduce variation in the threshold voltage of the transistor, in some cases. In addition, when the semiconductor layer 231_1 has a high carrier density, the semiconductor layer 231 can have a high field-effect mobility.

Although the semiconductor layer 231 in the transistor 200b has a stacked-layer structure including two layers in this example, the structure is not limited thereto, and a structure in which three or more layers are stacked may be employed.

The conductive layer 222a included in the transistor 200b includes a conductive layer 222a_1, a conductive layer 222a_2 over the conductive layer 222a_1, and a conductive layer 222a_3 over the conductive layer 222a_2. The conductive layer 222b included in the transistor 200b includes a conductive layer 222b_1, a conductive layer 222b_2 over the conductive layer 222b_1, and a conductive layer 222b_3 over the conductive layer 222b_2.

For example, it is preferable that the conductive layer 222a_1, the conductive layer 222b_1, the conductive layer 222a_3, and the conductive layer 222b_3 contain one or more elements selected from titanium, tungsten, tantalum, molybdenum, indium, gallium, tin, and zinc. Furthermore, it is preferable that the conductive layer 222a_2 and the conductive layer 222b_2 contain one or more elements selected from copper, aluminum, and silver.

Specifically, an In—Sn oxide or an In—Zn oxide can be used for the conductive layer 222a_1, the conductive layer 222b_1, the conductive layer 222a_3, and the conductive layer 222b_3 and copper can be used for the conductive layer 222a_2 and the conductive layer 222b_2.

An end portion of the conductive layer 222a_1 has a region located outside an end portion of the conductive layer 222a_2, and the conductive layer 222a_3 covers a top surface and a side surface of the conductive layer 222a_2 and has a region that is in contact with the conductive layer 222a_1. An end portion of the conductive layer 222b_1 has a region located outside an end portion of the conductive layer 222b_2, and the conductive layer 222b_3 covers a top surface and a side surface of the conductive layer 222b_2 and has a region that is in contact with the conductive layer 222b_1.

The above structure is preferred because the wiring resistance of the conductive layer 222a and the conductive layer 222b can be reduced and diffusion of copper to the semiconductor layer 231 can be inhibited.

Figure 27A:
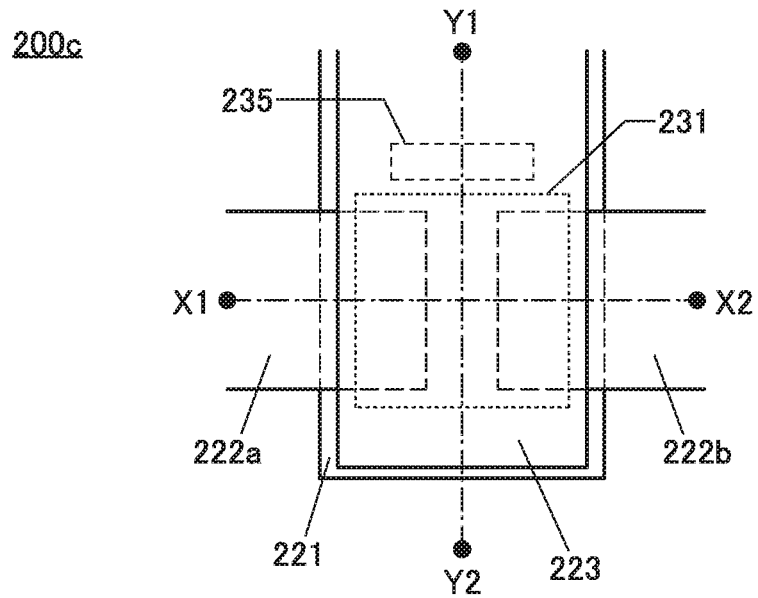
FIG. 27 A structure example of a transistor.
Figure 27B:
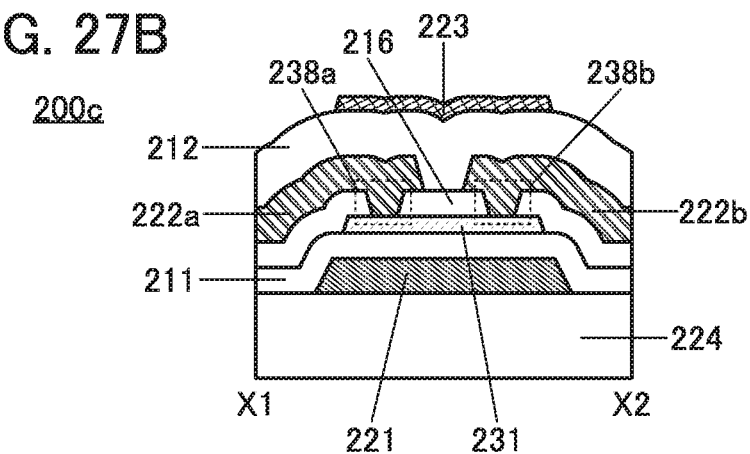
Figure 27C:
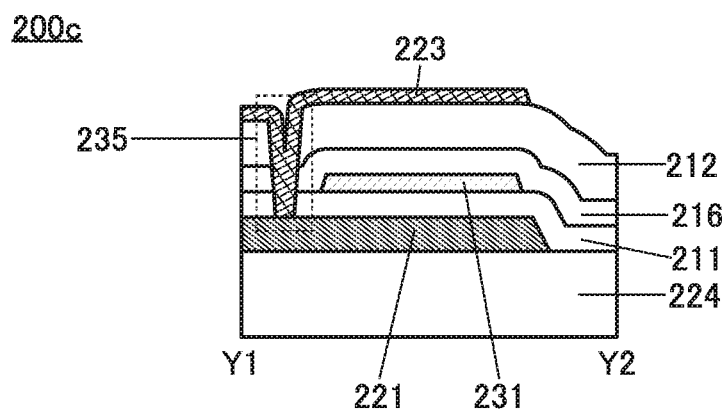

Next, as an example of a structure of a transistor, a transistor 200c is described with reference to FIGS. 27(A), (B), and (C). FIG. 27(A) is a top view of the transistor 200c. FIG. 27(B) corresponds to a cross-sectional view of a cut plane taken along dashed-dotted line X1-X2 in FIG. 27(A), and FIG. 27(C) corresponds to a cross-sectional view of a cut plane taken along dashed-dotted line Y1-Y2 in FIG. 27(A).

The transistor 200c includes the conductive layer 221 over the insulating layer 224, the insulating layer 211 over the conductive layer 221 and over the insulating layer 224, the semiconductor layer 231 over the insulating layer 211, an insulating layer 216 over the semiconductor layer 231 and over the insulating layer 211, the conductive layer 222a over the semiconductor layer 231 and over the insulating layer 216, the conductive layer 222b over the semiconductor layer 231 and over the insulating layer 216, the insulating layer 212 over the insulating layer 216, the conductive layer 222a, and the conductive layer 222b, and the conductive layer 223 over the insulating layer 212.

The insulating layer 211, the insulating layer 216, and the insulating layer 212 have the opening portion 235. The conductive layer 221 having a function as a first gate of the transistor 200c is electrically connected to the conductive layer 223 having a function as a second gate of the transistor 200c through the opening portion 235. The insulating layer 216 has an opening portion 238a and an opening portion 238b. The conductive layer 222a having a function as one of a source and a drain of the transistor 200c is electrically connected to the semiconductor layer 231 through the opening portion 238a. The conductive layer 222b having a function as the other of the source and the drain of the transistor 200c is electrically connected to the semiconductor layer 231 through the opening portion 238b.

The insulating layer 216 has a function as a channel protective layer of the transistor 200c. Without the insulating layer 216, a channel formation region of the semiconductor layer 231 might be damaged in some cases when the conductive layer 222a and the conductive layer 222b are formed by an etching method or the like. This might make the electrical characteristics of the transistor unstable in some cases. The damage to the channel formation region of the semiconductor layer 231 can be prevented when the insulating layer 216 is formed, a conductive layer is formed after the opening portion 238a and the opening portion 238b are provided, and the conductive layer is processed by an etching method or the like to form the conductive layer 222a and the conductive layer 222b. Accordingly, the electrical characteristics of the transistor can be stabilized and a highly reliable transistor can be provided.

The insulating layer 216 can include a material similar to that of the insulating layer 212, for example.

The insulating layer 216 preferably includes an excess oxygen region, and when the insulating layer 216 includes an excess oxygen region, oxygen can be supplied to the channel formation region of the semiconductor layer 231. As a result, oxygen vacancies formed in the channel formation region can be filled with excess oxygen, which can provide a highly reliable display device.

After the opening portion 238a and the opening portion 238b are formed, an impurity element is preferably added to the semiconductor layer 231. Specifically, an element that forms an oxygen vacancy or an element that is bonded to an oxygen vacancy is preferably added. This can increase the conductivity of a region of the semiconductor layer 231 which overlaps with the conductive layer 222a (one of a source region and a drain region) and a region of the semiconductor layer 231 which overlaps with the conductive layer 222b (the other of the source region and the drain region), the detail of which is to be described later. Accordingly, the current drive capability of the transistor 200c is improved, so that high on-state current characteristics can be obtained.

Note that the transistor 200c is what is called a channel-protective transistor, and has a dual-gate structure.

Like the transistor 200a and the transistor 200b, the transistor 200c has the s-channel structure. With this structure, the semiconductor layer 231 included in the transistor 200c can be electrically surrounded by electric fields of the conductive layer 221 and the conductive layer 223.

Since the transistor 200c has the s-channel structure, an electric field for inducing a channel can be effectively applied to the semiconductor layer 231 by the conductive layer 221 or the conductive layer 223. Thus, the current drive capability of the transistor 200c can be improved and high on-state current characteristics can be obtained. As a result of the high on-state current, it is possible to reduce the size of the transistor 200c. Furthermore, since the transistor 200c has a structure in which the semiconductor layer 231 is surrounded by the conductive layer 221 and the conductive layer 223, the mechanical strength of the transistor 200c can be increased.

Note that the transistor 200c can have a structure in which the conductive layer 223 is not provided. In that case, the transistor 200c is what is called a channel-protective transistor, and has a bottom-gate structure.

Next, an example of a structure of a transistor is described with reference to FIGS. 28(A), (B), (C), and (D).

Figure 28A:
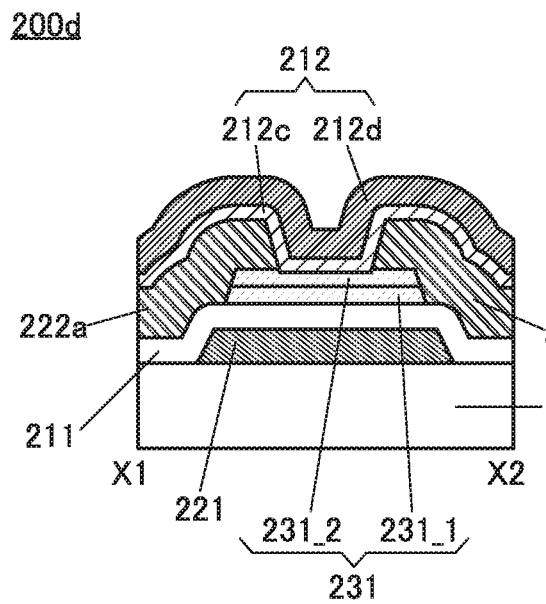
FIG. 28 Structure examples of a transistor.
Figure 28B:
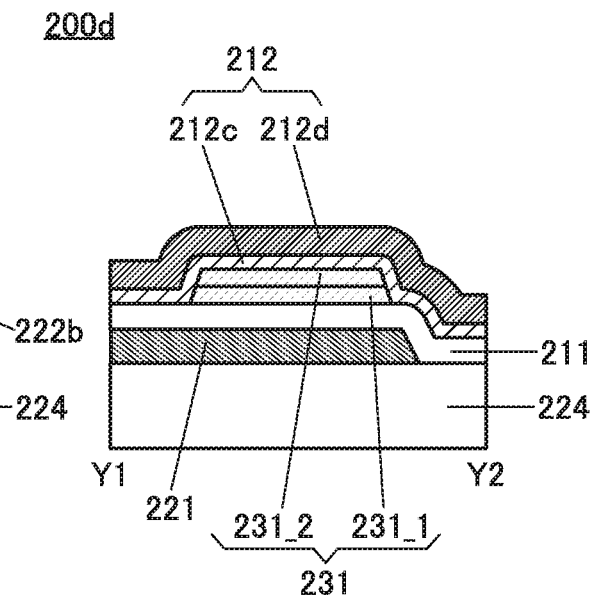
Figure 28C:
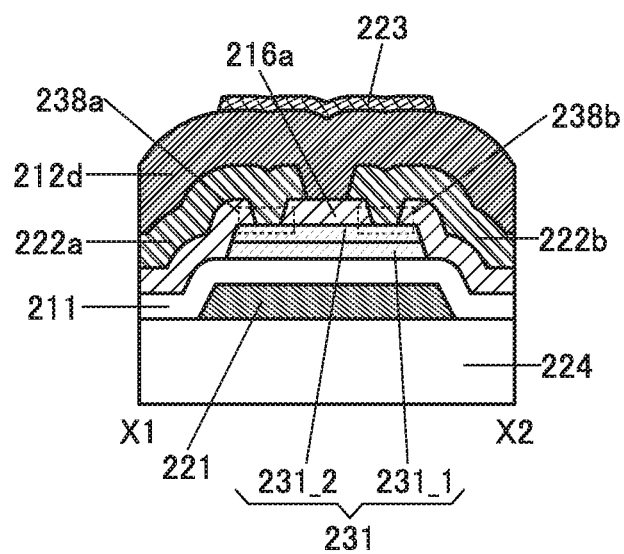

FIGS. 28(A) and (B) are cross-sectional views of a transistor 200d and FIGS. 28(C) and (D) are cross-sectional views of a transistor 200e. Note that the transistor 200d is a modification example of the above-described transistor 200b and the transistor 200e is a modification example of the above-described transistor 200c. Thus, in FIGS. 28(A), (B), (C), and (D), common reference numerals are used for the components having functions similar to those in the transistor 200b and the transistor 200c, and a detailed description is omitted.

Figure 28D:
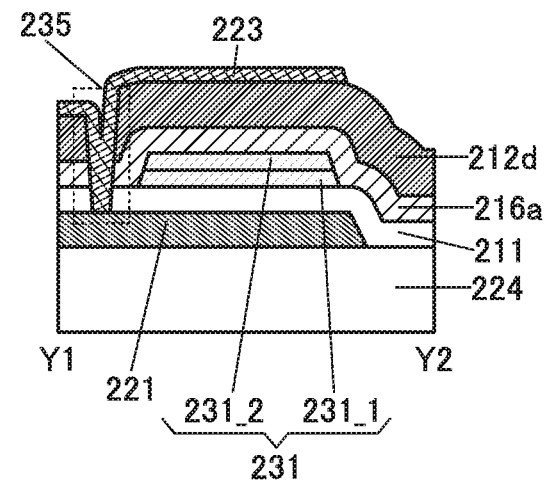

FIG. 28(A) is a cross-sectional view of the transistor 200d in the channel length direction, and FIG. 28(B) is a cross-sectional view of the transistor 200d in the channel width direction. FIG. 28(C) is a cross-sectional view of the transistor 200e in the channel length direction, and FIG. 28(D) is a cross-sectional view of the transistor 200e in the channel width direction.

Compared with the transistor 200b, the transistor 200d illustrated in FIGS. 28(A) and (B) is not provided with the conductive layer 223 and the opening portion 235. The transistor 200d is different from the transistor 200b in the structures of the insulating layer 212, the conductive layer 222a, and the conductive layer 222b.

In the transistor 200d, the insulating layer 212 includes an insulating layer 212c and an insulating layer 212d over the insulating layer 212c. The insulating layer 212c has a function of supplying oxygen to the semiconductor layer 231 and a function of preventing entry of impurities (typically, water, hydrogen, and the like). As the insulating layer 212c, an aluminum oxide film, an aluminum oxynitride film, or an aluminum nitride oxide film can be used. In particular, the insulating layer 212c is preferably an aluminum oxide film formed by a reactive sputtering method. As an example of a method of forming an aluminum oxide film by a reactive sputtering method, the following method can be given.

First, a mixed gas of an inert gas (typically, an Ar gas) and an oxygen gas is introduced into a sputtering chamber. Subsequently, a voltage is applied to an aluminum target provided in the sputtering chamber, whereby the aluminum oxide film can be deposited. As an electric power source for applying a voltage to the aluminum target, a DC power source, an AC power source, or an RF power source can be given. The DC power source is particularly preferable because the productivity can be improved.

The insulating layer 212d has a function of preventing entry of impurities (typically, water, hydrogen, and the like). As the insulating layer 212d, a silicon nitride film, a silicon nitride oxide film, or a silicon oxynitride film can be used. In particular, a silicon nitride film formed by a PECVD method is preferably used as the insulating layer 212d. The silicon nitride film formed by a PECVD method is preferable because the film is likely to have a high film density. Note that the hydrogen concentration in the silicon nitride film formed by a PECVD method is high in some cases.

Since the insulating layer 212c is provided below the insulating layer 212d in the transistor 200d, hydrogen contained in the insulating layer 212d does not or is less likely to diffuse into the semiconductor layer 231 side.

Note that the transistor 200d is a transistor having a single-gate structure, unlike the transistor 200b. The use of a transistor having a single-gate structure can reduce the number of masks, leading to increased productivity.

The transistor 200e illustrated in FIGS. 28(C) and (D) is different from the transistor 200c in the structures of the insulating layer 216 and the insulating layer 212. Specifically, the transistor 200e includes an insulating layer 216a instead of the insulating layer 216, and the insulating layer 212d instead of the insulating layer 212. In addition, in the transistor 200e, the semiconductor layer 231 includes the semiconductor layer 231_1 and the semiconductor layer 231_2.

The insulating layer 216a has a function similar to that of the insulating layer 212c.

The structure of the transistor 200d or the transistor 200e can be formed using the existing production line without high capital investment. For example, a production line for an oxide semiconductor can be simply substituted for a production line for hydrogenated amorphous silicon.

Figure 29A:
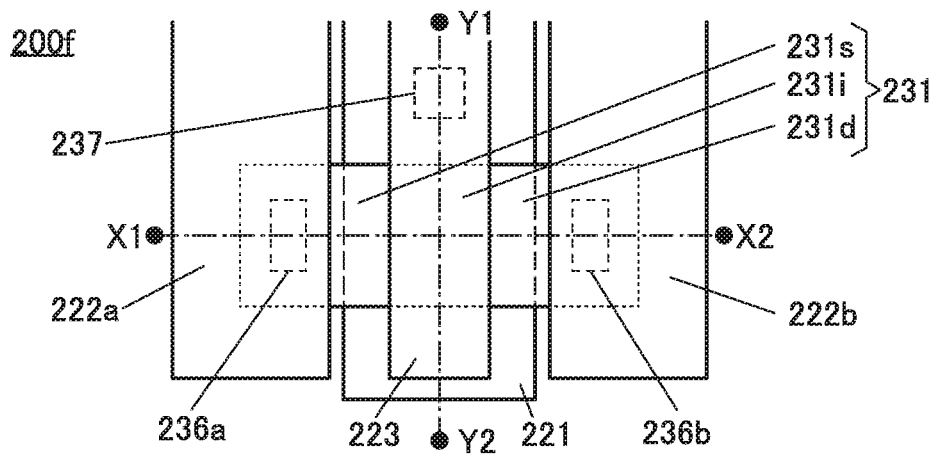
FIG. 29 A structure example of a transistor.

Next, as an example of a structure of a transistor, a transistor 200f is described with reference to FIGS. 29(A), (B), and (C). FIG. 29(A) is a top view of the transistor 200f, FIG. 29(B) corresponds to a cross-sectional view of a cut plane taken along dashed-dotted line X1-X2 in FIG. 29(A), and FIG. 29(C) corresponds to a cross-sectional view of a cut plane taken along dashed-dotted line Y1-Y2 in FIG. 29(A).

The transistor 200f illustrated in FIGS. 29(A), (B), and (C) includes the conductive layer 221 over the insulating layer 224, the insulating layer 211 over the conductive layer 221 and over the insulating layer 224, the semiconductor layer 231 over the insulating layer 211, the insulating layer 212 over the semiconductor layer 231, the conductive layer 223 over the insulating layer 212, and an insulating layer 215 over the insulating layer 211, over the semiconductor layer 231, and over the conductive layer 223. Note that the semiconductor layer 231 includes a channel formation region 231i overlapping with the conductive layer 223, a source region 231s in contact with the insulating layer 215, and a drain region 231d in contact with the insulating layer 215.

The insulating layer 215 contains nitrogen or hydrogen. The insulating layer 215 is in contact with the source region 231s and the drain region 231d, so that nitrogen or hydrogen in the insulating layer 215 is added to the source region 231s and the drain region 231d. The source region 231s and the drain region 231d each have a high carrier density when nitrogen or hydrogen is added thereto.

The transistor 200f may include the conductive layer 222a electrically connected to the source region 231s through an opening portion 236a provided in the insulating layer 215. The transistor 200f may further include the conductive layer 222b electrically connected to the drain region 231d through an opening portion 236b provided in the insulating layer 215.

The insulating layer 211 has a function as a first gate insulating layer, and the insulating layer 212 has a function as a second gate insulating layer. The insulating layer 215 has a function as a protective insulating layer.

The insulating layer 212 includes an excess oxygen region. When the insulating layer 212 includes an excess oxygen region, excess oxygen can be supplied to the channel formation region 231i included in the semiconductor layer 231. As a result, oxygen vacancies that might be formed in the channel formation region 231i can be filled with excess oxygen, which can provide a highly reliable display device.

Note that to supply excess oxygen to the semiconductor layer 231, excess oxygen may be supplied to the insulating layer 211 formed below the semiconductor layer 231. However, in that case, excess oxygen contained in the insulating layer 211 might also be supplied to the source region 231s and the drain region 231d included in the semiconductor layer 231. When excess oxygen is supplied to the source region 231s and the drain region 231d, the resistance of the source region 231s and the drain region 231d might be increased in some cases.

By contrast, in the structure in which the insulating layer 212 formed over the semiconductor layer 231 contains excess oxygen, excess oxygen can be selectively supplied only to the channel formation region 231i. Alternatively, the carrier densities of the source region 231s and the drain region 231d are selectively increased after excess oxygen is supplied to the channel formation region 231i, the source region 231s, and the drain region 231d, in which case an increase in the resistance of the source region 231s and the drain region 231d can be prevented.

Furthermore, each of the source region 231s and the drain region 231d included in the semiconductor layer 231 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas element. Typical examples of the rare gas element include helium, neon, argon, krypton, and xenon. In the case where one or more of the elements that form oxygen vacancies or the elements that are bonded to oxygen vacancies are contained in the insulating layer 215, the one or more of the elements are diffused from the insulating layer 215 to the source region 231s and the drain region 231d, and/or added to the source region 231s and the drain region 231d by impurity addition treatment.

When an impurity element is added to the metal oxide, a bond between a metal element and oxygen in the metal oxide is cut, so that an oxygen vacancy is formed. Alternatively, when an impurity element is added to the metal oxide, oxygen bonded to a metal element in the metal oxide is bonded to the impurity element and the oxygen is released from the metal element, so that an oxygen vacancy is formed. As a result, the carrier density of the metal oxide is increased and thus the conductivity thereof becomes higher.

The conductive layer 221 has a function as a first gate, the conductive layer 223 has a function as a second gate, the conductive layer 222a has a function as a source, and the conductive layer 222b has a function as a drain.

Figure 29B:
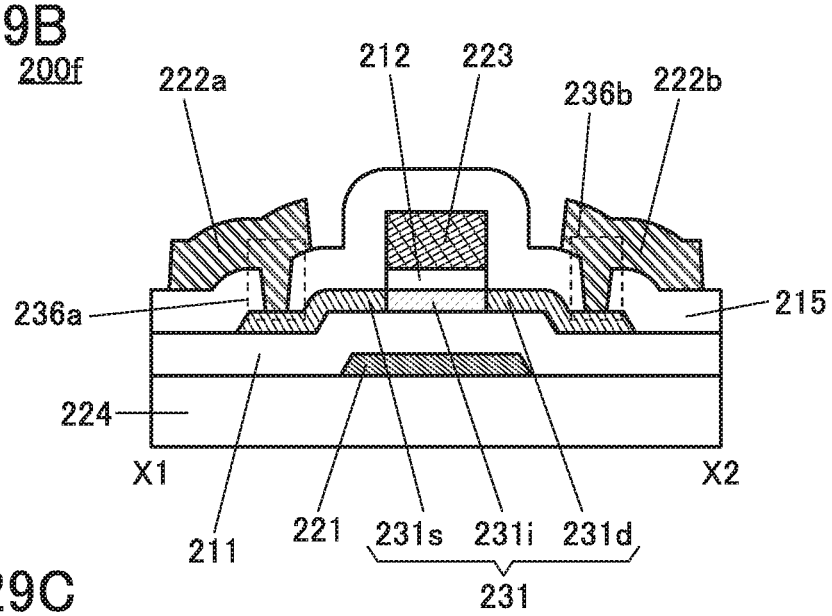
Figure 29C:
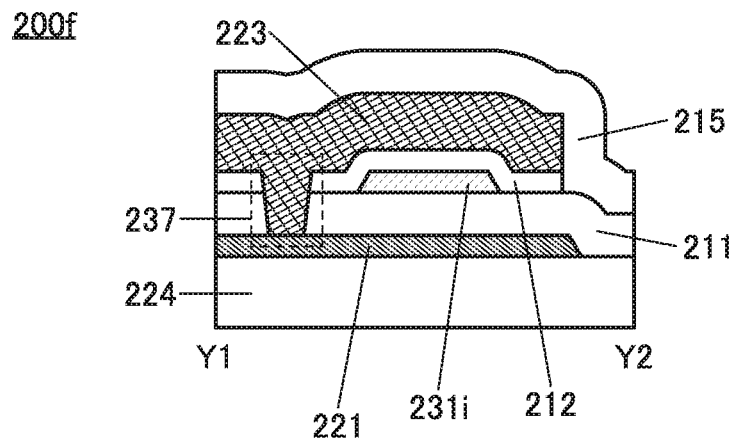

As illustrated in FIG. 29(C), an opening portion 237 is provided in the insulating layer 211 and the insulating layer 212. The conductive layer 221 is electrically connected to the conductive layer 223 through the opening portion 237. Thus, the conductive layer 221 and the conductive layer 223 are supplied with the same potential. Note that different potentials may be supplied to the conductive layer 221 and the conductive layer 223 without providing the opening portion 237. Alternatively, the conductive layer 221 may be used as a light-blocking film without providing the opening portion 237. For example, light emitted to the channel formation region 231i from the bottom can be suppressed when the conductive layer 221 is formed with a light-blocking material.

As illustrated in FIGS. 29(B) and (C), while facing the conductive layer 221 having a function as the first gate and the conductive layer 223 having a function as the second gate, the semiconductor layer 231 is positioned between the two conductive layers having functions as the gates.

Like the transistor 200a, the transistor 200b, and the transistor 200c, the transistor 200f has the s-channel structure. With this structure, the semiconductor layer 231 included in the transistor 200f can be electrically surrounded by electric fields of the conductive layer 221 having a function as the first gate and the conductive layer 223 having a function as the second gate.

Since the transistor 200f has the s-channel structure, an electric field for inducing a channel can be effectively applied to the semiconductor layer 231 by the conductive layer 221 or the conductive layer 223. Thus, the current drive capability of the transistor 200f can be improved and high on-state current characteristics can be obtained. As a result of the high on-state current, it is possible to reduce the size of the transistor 200f. Furthermore, since the transistor 200f has a structure in which the semiconductor layer 231 is surrounded by the conductive layer 221 and the conductive layer 223, the mechanical strength of the transistor 200f can be increased.

The transistor 200f may be called a TGSA (Top Gate Self Aligned) FET from the position of the conductive layer 223 relative to the semiconductor layer 231 or the formation method of the conductive layer 223.

The semiconductor layer 231 in the transistor 200f may have a stacked-layer structure including two or more layers, as in the transistor 200b.

Although the insulating layer 212 is provided only in a portion overlapping with the conductive layer 223 in the transistor 200f, the structure is not limited thereto, and the structure in which the insulating layer 212 covers the semiconductor layer 231 can be employed. Alternatively, a structure in which the conductive layer 221 is not provided can be employed.

This embodiment can be implemented in combination with any of the structures described in the other embodiments and the like as appropriate.

Embodiment 3

In this embodiment, examples of a method of crystallization for polycrystalline silicon which can be used for a semiconductor layer of a transistor and a laser crystallization apparatus are described.

To form a polycrystalline silicon layer having favorable crystallinity, it is preferable that an amorphous silicon layer be provided over a substrate and the amorphous silicon layer be crystallized by laser irradiation. For example, a linear beam is used as laser light and the substrate is moved while the amorphous silicon layer is irradiated with the linear beam, so that a polycrystalline silicon layer can be formed in a desired region over the substrate.

The method using a linear beam is relatively favorable in throughput. On the other hand, it is a method in which laser light is moved relative to a region and is emitted a plurality of times; thus, variation in crystallinity tends to be produced owing to a change in the output of laser light and a change in the beam profile caused by the output change. For example, when a semiconductor layer crystallized by this method is used for a transistor included in a pixel of a display device, a random stripe pattern caused by variation in crystallinity might be observed when an image is displayed.

The length of the linear beam is ideally greater than or equal to the length of a side of the substrate; however, the length of the linear beam is limited by an output of a laser and the structure of an optical system. Thus, it is practical to irradiate a large substrate with the laser light by turning back the laser light in a substrate plane. Consequently, there is a region irradiated with the laser light a plurality of times. Since the crystallinity of such a region is likely to be different from that of the other region, display unevenness is sometimes caused in the region.

To avoid such a problem as mentioned above, an amorphous silicon layer formed over a substrate may be crystallized by local laser irradiation. Local laser irradiation easily forms a polycrystalline silicon layer with small variation in crystallinity.

Figure 30A:
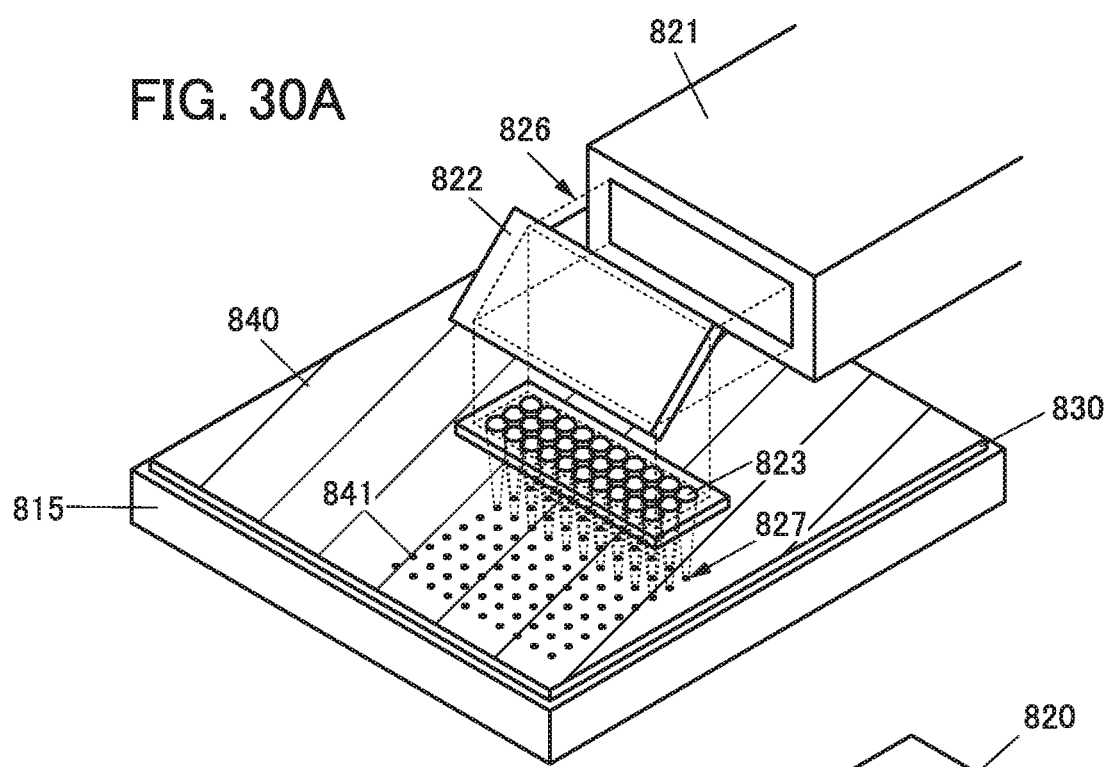
FIG. 30 Examples of a laser irradiation method and a laser crystallization apparatus.

FIG. 30(A) is a diagram illustrating a method of locally irradiating an amorphous silicon layer formed over a substrate with laser light.

Laser light 826 emitted from an optical system unit 821 is reflected by a mirror 822 and enters a microlens array 823. The microlens array 823 collects the laser light 826 to form a plurality of laser beams 827.

A substrate 830 over which an amorphous silicon layer 840 is formed is fixed to a stage 815. The amorphous silicon layer 840 is irradiated with the plurality of laser beams 827, so that a plurality of polycrystalline silicon layers 841 can be formed at the same time.

Microlenses of the microlens array 823 are preferably provided to match with a pixel pitch of the display device. Alternatively, they may be provided at intervals of an integral multiple of the pixel pitch. In either of the cases, polycrystalline silicon layers can be formed in regions corresponding to all pixels by repeating the laser irradiation and the movement of the stage 815 in the X direction or the Y direction.

For example, when the microlens array 823 includes M rows and N columns (M and N are natural numbers) of microlenses arranged with a pixel pitch, laser irradiation is performed at a predetermined start position first, so that M rows and N columns of polycrystalline silicon layers 841 can be formed. Then, the stage 815 is moved by N columns in the row direction, laser irradiation is performed, and M rows and N columns of polycrystalline silicon layers 841 are further formed; consequently, M rows and 2N columns of polycrystalline silicon layers 841 can be formed. By repeating the steps, a plurality of polycrystalline silicon layers 841 can be formed in desired regions. In the case where laser irradiation is performed by turning back the laser light, laser irradiation is performed after movement in the row direction by a distance of N columns, and laser irradiation is repeated after movement in the column direction by a distance of M rows.

Note that even in the case of a method in which laser irradiation is performed while the stage 815 is moved in one direction, polycrystalline silicon layers can be formed with a pixel pitch by adjusting the oscillation frequency of the laser light and the moving speed of the stage 815 properly.

The size of the laser beam 827 can be approximately an area in which the whole semiconductor layer of a transistor is included, for example. Alternatively, the size can be approximately an area in which the whole channel formation region of a transistor is included. Further alternatively, the size can be approximately an area in which part of a channel formation region of a transistor is included. The size can be selected from them depending on required electrical characteristics of a transistor.

Note that in the case of a display device including a plurality of transistors in a pixel, the size of the laser beam 827 can be approximately an area in which the whole semiconductor layer of each transistor in a pixel is included. Alternatively, the size of the laser beam 827 may be approximately an area in which the whole semiconductor layers of transistors in a plurality of pixels are included.

As illustrated in FIG. 31(A), a mask 824 may be provided between the mirror 822 and the microlens array 823. The mask 824 is provided with a plurality of opening portions corresponding to respective microlenses. The shape of the opening portion can be projected in the shape of the laser beam 827; as illustrated in FIG. 31(A), the laser beam 827 having a circular shape can be obtained in the case where the mask 824 includes circular opening portions. The laser beam 827 having a rectangular shape can be obtained in the case where the mask 824 includes rectangular opening portions. The mask 824 is effective in the case where only a channel formation region of a transistor is crystallized, for example. Note that the mask 824 may be provided between the optical system unit 821 and the mirror 822 as illustrated in FIG. 31(B).

Figure 30B:
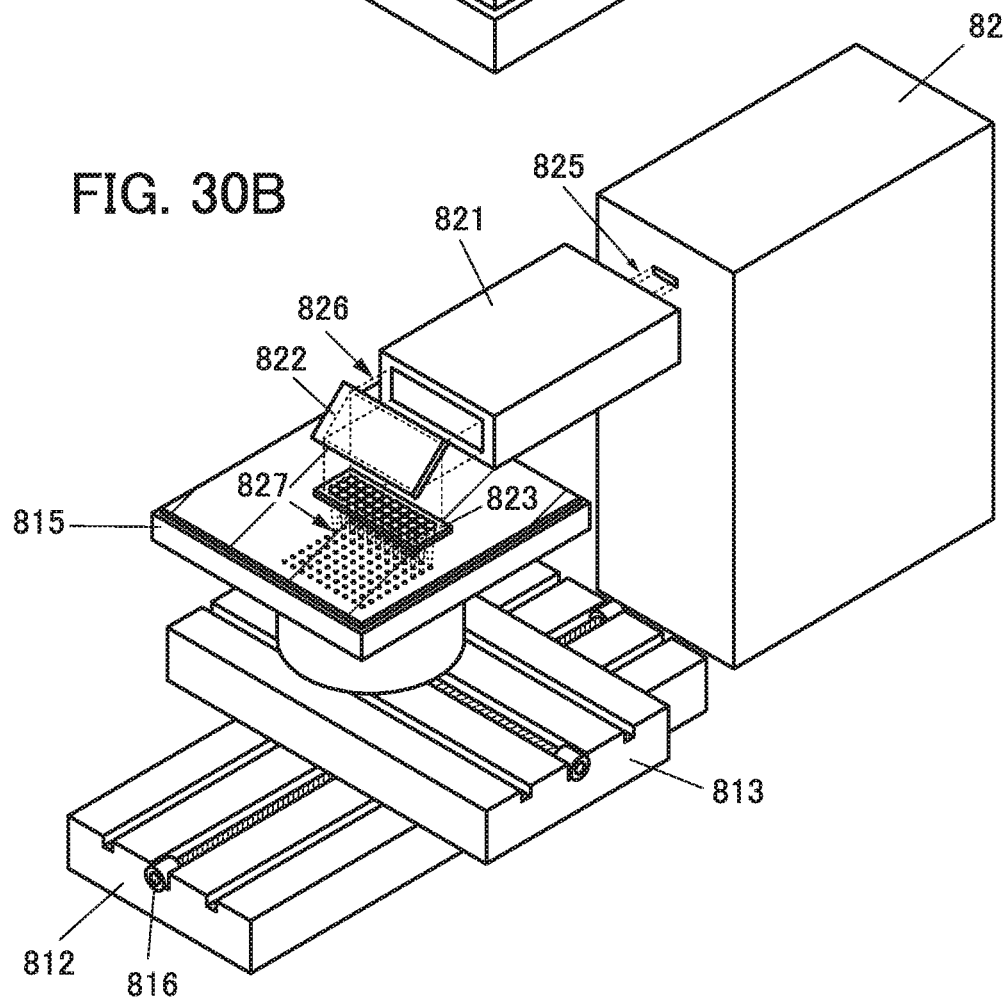

FIG. 30(B) is a perspective view illustrating a main structure of a laser crystallization apparatus which can be used in the above local laser irradiation step. The laser crystallization apparatus includes a moving mechanism 812, a moving mechanism 813, and the stage 815 which are components of an X-Y stage. A laser 820, the optical system unit 821, the mirror 822, and the microlens array 823 to shape the laser beam 827 are further included.

The moving mechanism 812 and the moving mechanism 813 each have a function of performing reciprocating linear motion in the horizontal direction. As a mechanism for powering the moving mechanism 812 and the moving mechanism 813, a ball screw mechanism 816 driven by a motor can be used, for example. The moving directions of the moving mechanism 812 and the moving mechanism 813 cross orthogonally; thus, the stage 815 fixed to the moving mechanism 813 can be moved in the X direction and in the Y direction freely.

The stage 815 includes a fixing mechanism such as a vacuum suction mechanism and can fix the substrate 830 or the like. Furthermore, the stage 815 may include a heating mechanism as needed. Although not illustrated, the stage 815 includes a pusher pin and a vertical moving mechanism thereof, and the substrate 830 or the like can be moved up and down when the substrate 830 or the like is transferred.

The laser 820 is preferably a pulsed laser, but may be a CW laser as long as light with a wavelength and intensity suitable for the purpose of processing can be output. Typically, an excimer laser that can emit ultraviolet light with a wavelength of 351 nm to 353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser (a YAG laser, a fiber laser, or the like) may be used. A plurality of lasers 820 may be provided.

The optical system unit 821 includes a mirror, a beam expander, a beam homogenizer, and the like, for example, and can expand laser light 825 while homogenizing the energy in-plane distribution of the laser light 825 output from the laser 820.

As the mirror 822, a dielectric multilayer mirror can be used, for example, and is provided so that the incident angle of the laser light is substantially 45°. The microlens array 823 can have a shape such that a plurality of convex lenses are provided on the top surface or on the top and bottom surfaces of a quartz board, for example.

With use of the above-described laser crystallization apparatus, polycrystalline silicon layers with small variation in crystallinity can be formed.

At least part of this embodiment can be implemented in combination with any of the other embodiments described in this specification as appropriate.

Embodiment 4

The composition of a CAC-OS applicable to a transistor disclosed in one embodiment of the present invention is described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium. It is particularly preferable that indium and zinc are contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (μ) can be achieved.

In contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is most suitable for a variety of semiconductor devices such as displays.

At least part of this embodiment can be implemented in combination with any of the other embodiments described in this specification as appropriate.

Embodiment 5

In this embodiment, another structure example of the display device described in the above embodiment will be described.

Figure 32:
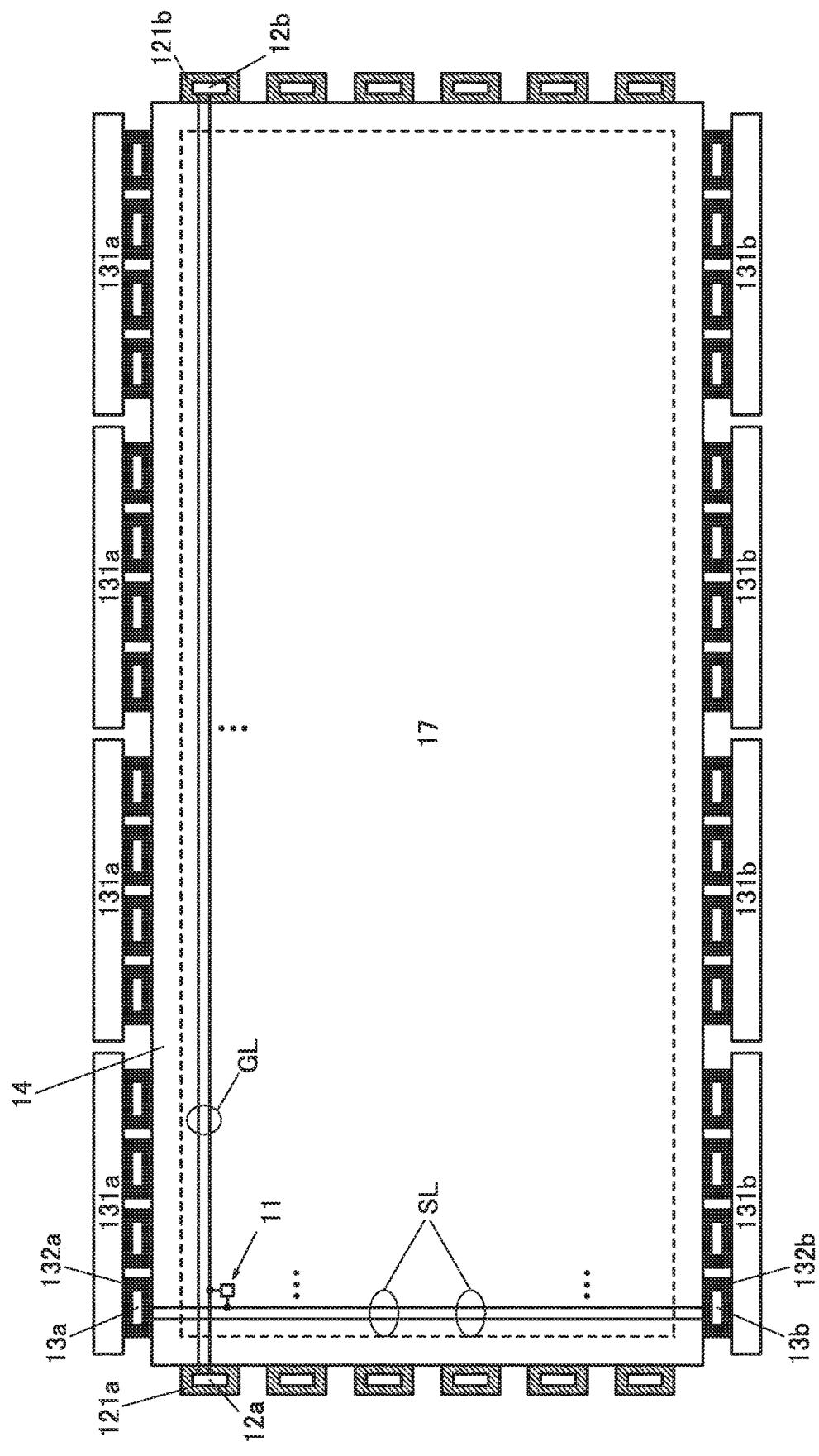
FIG. 32 A structure example of a display panel.

FIG. 32 illustrates a structure example of the display device 10. The display device 10 includes the display portion 17 provided over the substrate 14. The display portion 17 includes the plurality of pixels 11 connected to the wirings GL and the wirings SL.

Furthermore, the display device 10 is provided with a plurality of TAB (Tape Automated Bonding) tapes 121a and a plurality of TAB tapes 121b. The TAB tapes 121a and the TAB tapes 121b are provided to face each other with the display portion 17 therebetween. Integrated circuits in which the gate drivers 12a and the like are formed are mounted on the TAB tapes 121a, and integrated circuits in which the gate drivers 12b and the like are formed are mounted on the TAB tapes 121b. The gate drivers 12a and the gate drivers 12b are connected to the plurality of wirings GL and have a function of supplying selection signals to the wirings GL.

In addition, the display device 10 is provided with a plurality of printed boards 131a and a plurality of TAB tapes 132a, and provided with a plurality of printed boards 131b and a plurality of TAB tapes 132b. The printed boards 131a and the TAB tapes 132a are provided to face the printed boards 131b and the TAB tapes 132b with the display portion 17 therebetween.

The printed boards 131a are each connected to the plurality of TAB tapes 132a and have a function of distributing external input signals to the TAB tapes 132a. The printed boards 131b are each connected to the plurality of TAB tapes 132b and have a function of distributing external input signals to the TAB tapes 132b. Integrated circuits in which the source drivers 13a and the like are formed are mounted on the TAB tapes 132a, and integrated circuits in which the source drivers 13b and the like are formed are mounted on the TAB tapes 132b. The source drivers 13a and the source drivers 13b are connected to the plurality of wirings SL and have a function of supplying signals to the wirings SL.

In the case where a large-screen display panel which is compatible with 2K, 4K, or 8K broadcasting or the like is manufactured, the plurality of printed boards 131a and the plurality of printed boards 131b are preferably provided as illustrated in FIG. 32. Accordingly, input of image data to the display device 10 is facilitated.

Note that the gate drivers 12a, the gate drivers 12b, the source drivers 13a, and the source drivers 13b can also be provided over the substrate 14 by a COG (Chip On Glass) method, a COF (Chip On Film) method, or the like.

At least part of this embodiment can be implemented in combination with any of the other embodiments described in this specification as appropriate.

Embodiment 6

In this embodiment, electronic appliances of embodiments of the present invention will be described with reference to drawings.

Each of the electronic devices described below is provided with the display device of one embodiment of the present invention in a display portion. Thus, the electronic appliances achieve high resolution. In addition, the electronic appliances can achieve both high resolution and a large screen.

The display portion of the electronic appliance of one embodiment of the present invention can display, for example, an image with a resolution of full high definition, 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic appliances include electronic appliances with a relatively large screen, such as a television device, a desktop or laptop personal computer, a monitor of a computer or the like, a digital signage, and a large game machine such as a pachinko machine; a digital camera; a digital video camera; a digital photo frame; a mobile phone; a portable game console; a portable information terminal; and an audio reproducing device.

The electronic appliance or a lighting device of one embodiment of the present invention can be incorporated along a curved surface of an inside wall or an outside wall of a house or a building or a curved surface of an interior or exterior of an automobile.

The electronic appliance of one embodiment of the present invention may include an antenna. When a signal is received by the antenna, an image, information, or the like can be displayed on a display portion. When the electronic appliance includes the antenna and a secondary battery, the antenna may be used for contactless power transmission.

The electronic appliance of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic appliance of one embodiment of the present invention can have a variety of functions. For example, the electronic appliance can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 33A:
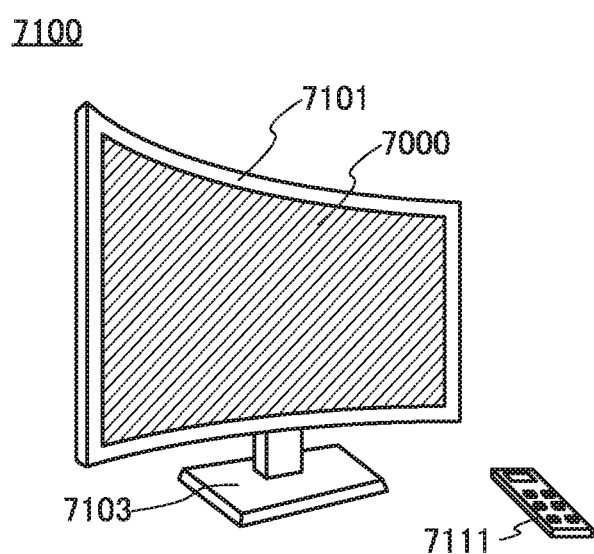
FIG. 33 Structure examples of an electronic appliance.

FIG. 33(A) illustrates an example of a television device. In a television device 7100, a display portion 7000 is incorporated in a housing 7101. Here, a structure in which the housing 7101 is supported by a stand 7103 is shown.

The display device of one embodiment of the present invention can be used in the display portion 7000. In this way, the television device 7100 can display a high-resolution image. The television device 7100 can display a high-resolution image on a large screen.

The television device 7100 illustrated in FIG. 33(A) can be operated with an operation switch provided in the housing 7101 or a separate remote controller 7111. Furthermore, the display portion 7000 may include a touch sensor and the television device 7100 may be operated by touching the display portion 7000 with a finger or the like. Furthermore, the remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) information communication can be performed.

Figure 33B:
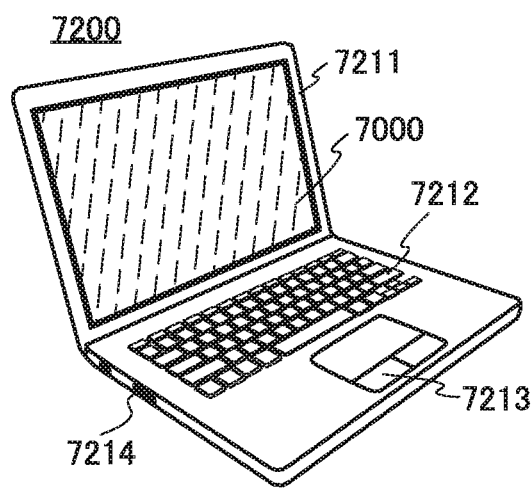

FIG. 33(B) illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000. In this way, the laptop personal computer 7200 can display a high-resolution image. The laptop personal computer 7200 can display a high-resolution image on a large screen.

Figure 33C:
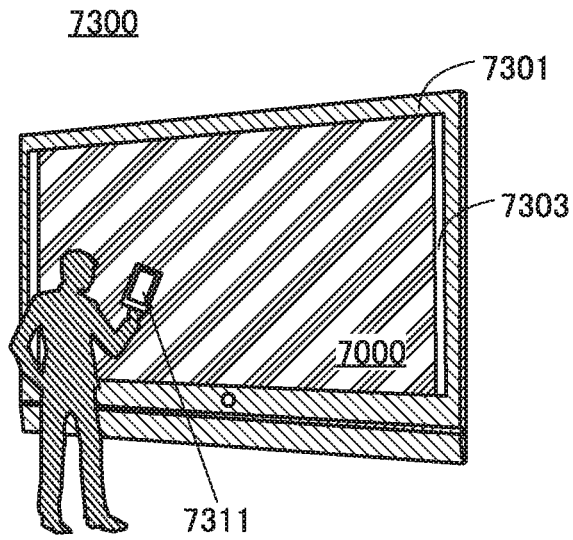

FIGS. 33(C) and (D) illustrate examples of the digital signage.

A digital signage 7300 illustrated in FIG. 33(C) includes a housing 7301, the display portion 7000, a speaker 7303, and the like. Moreover, the digital signage 7300 can include an LED lamp, operation keys (including a power switch or an operation switch), a connection terminal, a variety of sensors, a microphone, and the like.

Figure 33D:
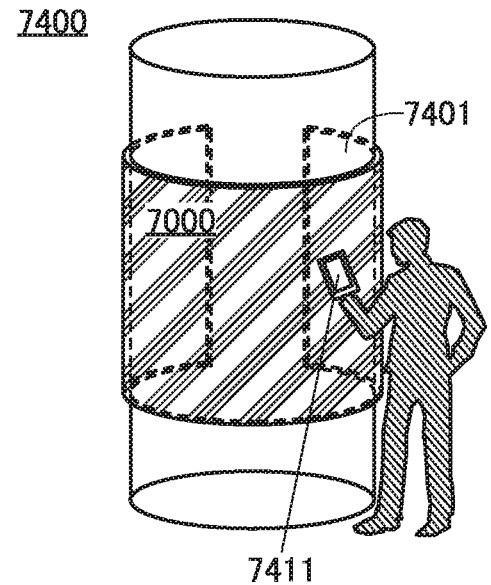

FIG. 33(D) illustrates a digital signage 7400 attached to a cylindrical pillar 7401. The digital signage 7400 includes the display portion 7000 provided along a curved surface of the pillar 7401.

The display device of one embodiment of the present invention can be used in each of the display portions 7000 illustrated in FIGS. 33(C) and (D). In this way, the digital signage 7300 and the digital signage 7400 can display a high-resolution image. The digital signage 7300 and the digital signage 7400 can display a high-resolution image on a large screen.

A larger area of the display portion 7000 can provide more information at a time. In addition, the larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. In the case where the display device is used for providing information such as route information or traffic information, usability can be enhanced by intuitive operation.

Furthermore, as illustrated in FIGS. 33(C) and (D), it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or the information terminal 7411. Moreover, by operation of the information terminal 7311 or the information terminal 7411, a displayed image on the display portion 7000 can be switched.

Furthermore, it is possible to make the digital signage 7300 or the digital signage 7400 execute a game with use of the screen of the information terminal 7311 or the information terminal 7411 as an operation means (controller). Thus, an unspecified number of people can join in and enjoy the game concurrently.

At least part of this embodiment can be implemented in combination with any of the other embodiments described in this specification as appropriate.

Example 1

In this example, results of rough estimation of data writing time of an 8K4K liquid crystal display module including a 65-inch diagonal pixel area are described.

In particular, in this example, whether a large-sized high-resolution display in which hydrogenated amorphous silicon (a-Si:H) is used for a semiconductor layer of a transistor can be operated by applying one embodiment of the present invention was examined.

Note that the resolution of the 8K4K display is extremely high: the horizontal resolution is 7680 and the vertical resolution is 4320. Recommendation ITU-R BT.2020-2 is an international standard for 8K4K displays. In the standard, the driving method is a progressive method and the maximum frame frequency is 120 Hz.

In the case where a transistor with a low field-effect mobility is used in a large-sized high-resolution display module, image rewriting cannot be done in a frame period and driving cannot be performed in some cases. In such a case, a configuration in which a pixel area is divided into a plurality of parts (e.g., four parts) and each part is provided with a scan line driver circuit (also referred to as a gate driver) and a signal line driver circuit (also referred to as a source driver) can be employed. With such a configuration, image rewriting of the plurality of pixel areas can be performed at the same time; thus, image rewriting can be performed in a frame period even when a transistor with a low field-effect mobility is used.

However, the configuration in which the pixel area is divided has, for example, the following problems: an increase in cost resulting from an increase in the number of ICs such as the source driver and the gate driver and the amount of materials thereof; a decrease in the aperture ratio due to an increase in the number of wirings; an increase in a frame area due to mounting of ICs; the necessity of a circuit for synchronizing the divided pixel areas; and a decrease in visibility because a boundary portion between the divided pixel areas is visually recognized. In addition, image processing or the like for dividing image data to be input is necessary; thus, a large-scale image processing circuit that can operate at a high speed might be required.

In view of the above, in this example, a configuration in which a selection signal was supplied to each gate line and pixels were selected one by one and a configuration in which a selection signal was supplied to two or four gate lines at a time and two or four pixels that adjoined in the column direction were concurrently selected were considered. The two or four pixels that were concurrently selected were connected to different source lines. That is, two or four source lines were arranged for each column. In this example, rough estimation of data writing time was performed with use of a layout of pixels with such a configuration.

In this example, a case where hydrogenated amorphous silicon was used for a semiconductor layer of a transistor and a case where a metal oxide was used for a semiconductor layer of a transistor were examined.

The data writing time in the case where hydrogenated amorphous silicon was used for a semiconductor layer was estimated with use of a pseudo parameter obtained by changing field-effect mobility that is a design parameter from an actually measured value of a transistor formed using microcrystalline silicon.

As to the semiconductor layer including a metal oxide, the following two types of structures were considered. As the metal oxide, In—Ga—Zn oxide was used. In a first type, a single layer of a metal oxide with an atomic ratio In:Ga:Zn=1:1:1 or the neighborhood thereof was used as the semiconductor layer. In a second type, a stacked layer of a metal oxide with an atomic ratio In:Ga:Zn=4:2:3 or the neighborhood thereof was used as the semiconductor layer. Specifically, a case where a CAC-OS (Cloud-Aligned Composite oxide semiconductor) film was used as a first metal oxide layer and a CAAC-OS (c-axis-aligned crystalline oxide semiconductor) film was used as a second metal oxide layer was assumed.

Table 1 shows parameters of layers used in this example. These parameters were for the case of a transistor in which a metal oxide was used for a semiconductor layer; however, in this example, the same parameters were also used in the case of a transistor in which hydrogenated amorphous silicon was used for a semiconductor layer.

TABLE 1

|  | Material | Thickness | Sheet resistance | Relative dielectric constant |
| --- | --- | --- | --- | --- |
| Counter electrode | ITSO | 100 nm | 100 Ω/□ | — |
| Liquid crystal layer | LC material | 3200 nm | 0.011 fF/μm$^2$ | 4 |
| Pixel electrode | ITSO | 100 nm | 100 Ω/□ | — |
| Planarization film | acrylic | 3000 nm | 0.012 fF/μm$^2$ | 4 |
| Passivation film 2 | SiN | 100 nm | 0.620 fF/μm$^2$ | 7 |
| Passivation film 1 | SiON\SiON | 430 nm | 0.082 fF/μm$^2$ | 4 |
| SD wiring* | Cu | 600 nm*** | 0.050 Ω/□ | — |
| Semiconductor layer | IGZO or a-Si:H | 40 nm | — | — |
| Gate insulating layer** | SiON | 280 nm | 0.127 fF/μm$^2$ | 4 |
| Gate wiring* | Cu | 600 nm*** | 0.050 Ω/□ | — |
| Substrate | glass | — | — | — |

*The conversion value based on sheet resistance 0.1 Ω/□ of TaN_10 nm\Cu_300 nm.
**The conversion value of an SiON single layer based on SiN_400 nm\SiON_50 nm.
***700 nm in the case where IGZO was used for the semiconductor layer and two pixels were concurrently selected.

<Case where Pixels are Selected One by One>

Figure 34A:
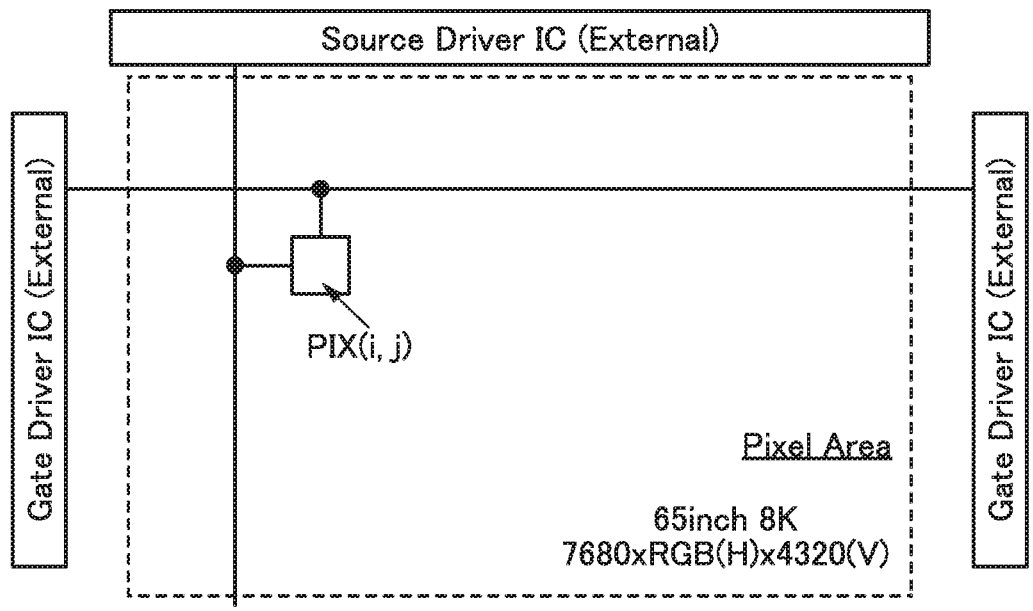
FIG. 34 A block diagram showing a display module in Example 1 and a circuit diagram showing a pixel in Example 1.

FIG. 34(A) is a block diagram showing a configuration of a display module used in this example. In this configuration, a selection signal is supplied to each gate line and pixels are selected one by one. A gate driver and a source driver are both external circuits. A gate line is supplied with the same signal from two gate driver ICs (External). A source line is supplied with a signal from one source driver IC (External). A pixel area is not divided. The pixel area has a diagonal of 65 inches, and the number of effective pixels is 7680×RGB (H)×4320 (V).

Figure 34B:
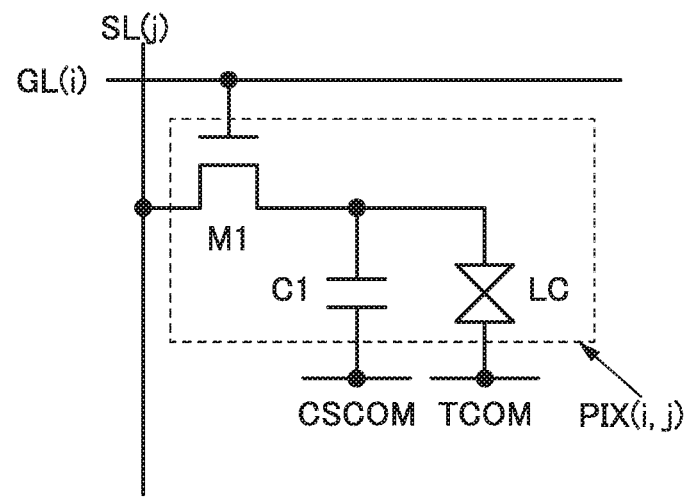

FIG. 34(B) is a circuit diagram of a pixel PIX(i, j). The pixel PIX(i, j) includes a transistor M1, a capacitor C1, and a liquid crystal element LC. A gate of the transistor M1 is connected to a gate line GL(i). One of a source and a drain of the transistor M1 is connected to a source line SL(j), and the other is connected to one electrode of the capacitor C1 and one electrode of the liquid crystal element LC. The other electrode of the capacitor C1 is connected to a wiring CSCOM. The other electrode of the liquid crystal element LC is connected to a wiring TCOM.

Figure 35A:
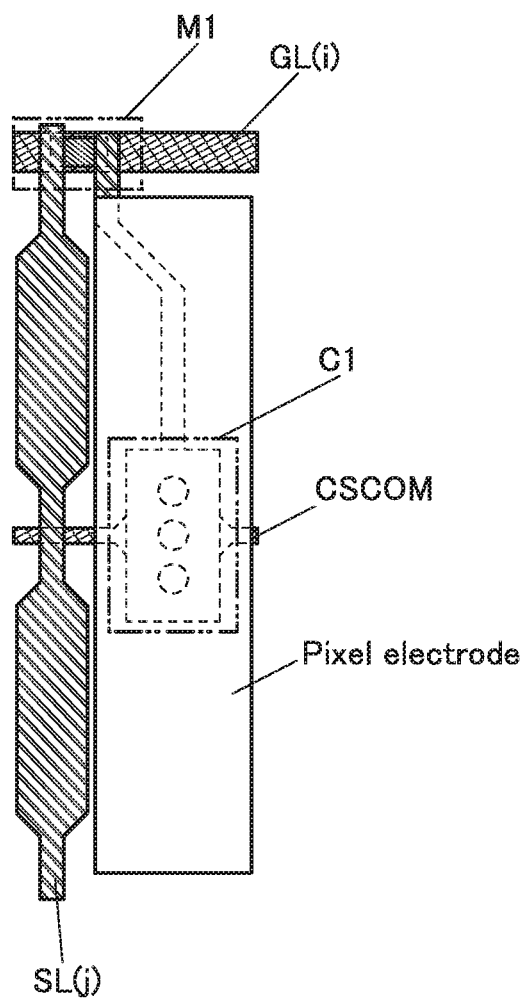
FIG. 35 Top views showing a pixel layout in Example 1.
Figure 35B:
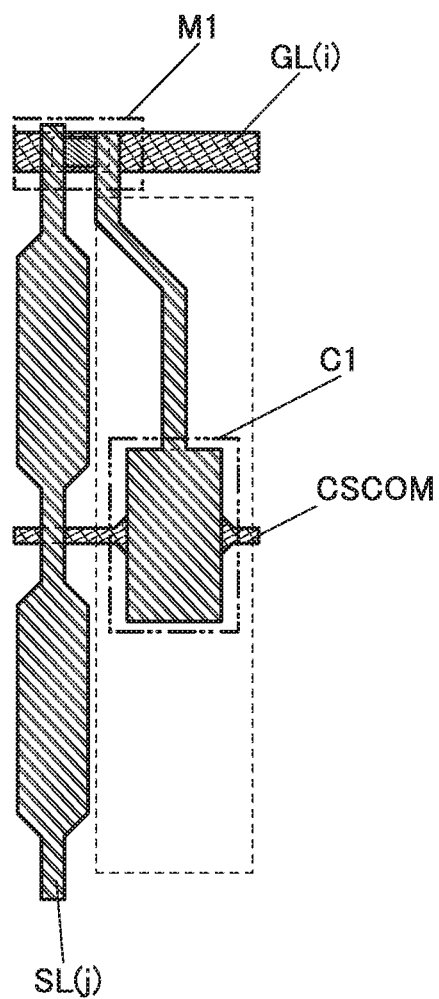

FIGS. 35(A) and (B) illustrate a pixel layout of a display module in which pixels are selected one by one. FIG. 35(A) is a top view in which a stacked-layer structure including components from the gate line GL(i) to the pixel electrode is seen from the pixel electrode side. FIG. 35(B) is a top view in which the pixel electrode is omitted from FIG. 35(A).

The pixel size is 62.5 μm×187.5 μm. The transistor M1 is a channel-etched transistor with a bottom-gate top-contact structure. The transistor M1 has a channel length L of 4 μm, a channel width W of 8 μm, and an LDD region overlapping with a gate (hereinafter, an overlap LDD region $L_{ov}$) of 2 μm. The gate line GL(i) has a width of 10 μm, and the wiring CSCOM has a width of 3.5 μm. The source line SL(j) has a width of 10 μm, but has a width of 4 μm at a portion crossing another wiring (the gate line GL(i) or the wiring CSCOM). The aperture ratio is 45.6%.

First, rough estimation of data writing time in the case where a metal oxide is used for a semiconductor layer is described with reference to FIG. 36.

A period for charging a gate line of a pixel and a period for charging a source line and the pixel were roughly estimated in such a manner that the parasitic resistance and the parasitic capacitance were extracted from the pixel layout in FIG. 35(A) and only a parameter of the field-effect mobility of the transistor was changed. In this example, the data writing time corresponds to the sum of the period for charging a gate line and the period for charging a source line and a pixel. In this example, the period for charging a gate line is a time until the potential of the gate line reaches 75% of the maximum input voltage, and the period for charging a source line and a pixel is a time until the potential of the source line reaches 99% of the maximum input voltage.

Here, a normalized value (normalized mobility) under a condition that the field-effect mobility in the case where a stacked layer of a metal oxide with an atomic ratio In:Ga:Zn=4:2:3 or the neighborhood thereof was used as a semiconductor layer was 1 was used. The transistor size was not changed. The load of the whole pixel area is described below. A parasitic resistance Rgl of the gate line was 3.60 kΩ, a parasitic capacitance Cgl of the gate line was 255 pF, a parasitic resistance Rsl of the source line was 5.80 kΩ, a parasitic capacitance Csl of the source line was 147 pF, and a parasitic capacitance Cpix of the pixel was 216.6 fF. Note that in this example, the parasitic capacitance Cpix of the pixel includes storage capacitance of a capacitor, capacitance of a liquid crystal element, and parasitic capacitance of a node A. In this example, the node A is a node at which a source or a drain of a transistor, one electrode of a capacitor, and one electrode of a liquid crystal element are connected in each pixel.

Figure 36:
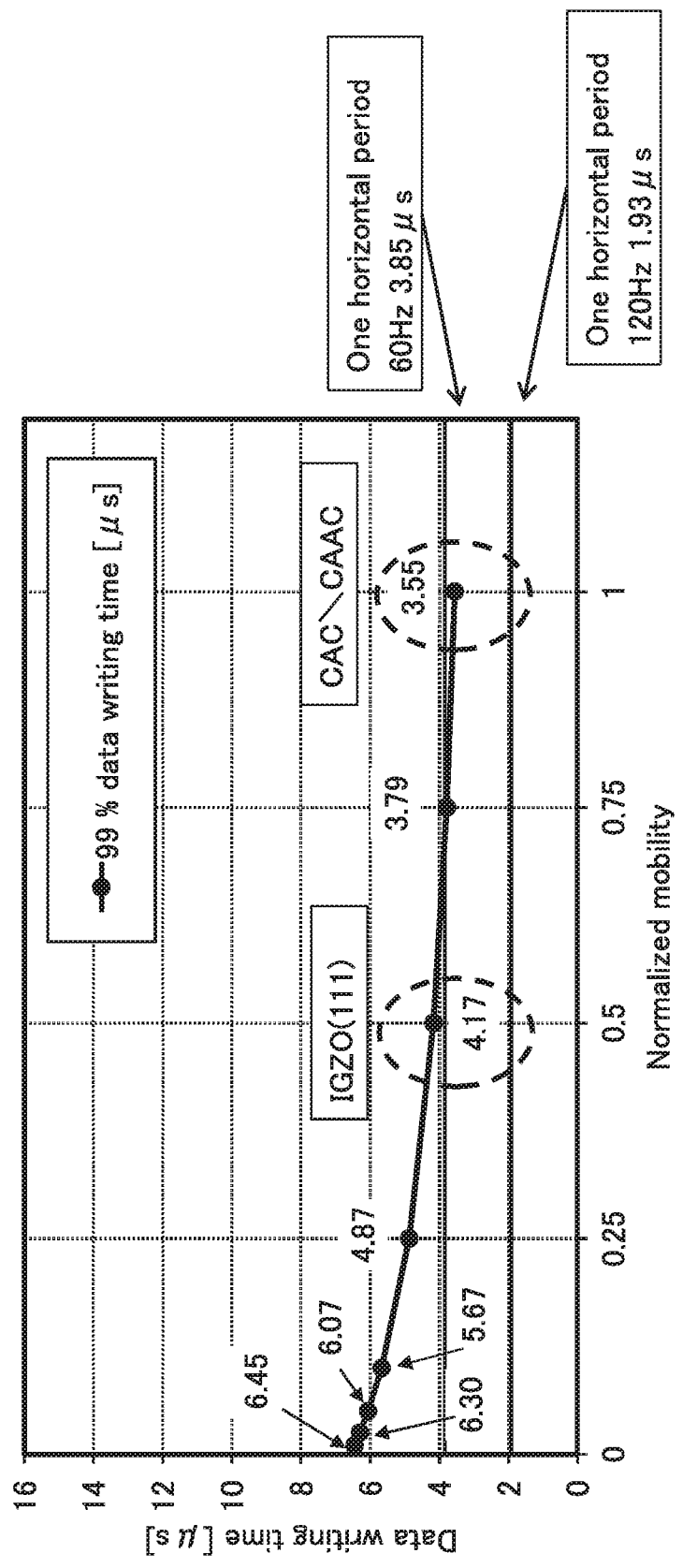
FIG. 36 Results of rough estimation of data writing time in Example 1.

The result of normalized mobility of 1 in FIG. 36 corresponds to the case where a stacked layer of a metal oxide with an atomic ratio In:Ga:Zn=4:2:3 or the neighborhood thereof is used as a semiconductor layer (denoted as "CAC\CAAC" in FIG. 36). In that case, the data writing time was 3.55 μs, which was shorter than one horizontal period 3.85 μs in 60-Hz driving; accordingly, it was estimated that 60-Hz driving could be performed. This data writing time was longer than one horizontal period 1.93 μs in 120-Hz driving; accordingly, it was estimated that 120-Hz driving was difficult.

The result of normalized mobility of 0.5 in FIG. 36 corresponds to the case where a single layer of a metal oxide with an atomic ratio In:Ga:Zn=1:1:1 or the neighborhood thereof is used as a semiconductor layer (denoted as "IGZO (111)" in FIG. 36). In that case, the data writing time was 4.17 μs, which was longer than one horizontal period 3.85 μs in 60-Hz driving; accordingly, it was estimated that not only 120-Hz driving but also 60-Hz driving was difficult.

Next, rough estimation of data writing time in the case where hydrogenated amorphous silicon is used for a semiconductor layer is described with reference to FIG. 37.

A period for charging a gate line of a pixel and a period for charging a source line and the pixel were roughly estimated in such a manner that the parasitic resistance and the parasitic capacitance were extracted from the pixel layout in FIG. 35(A) and the field-effect mobility of a design parameter was changed from the actually measured value of a transistor fabricated using microcrystalline silicon. The transistor size and storage capacitance were not changed. In the case where hydrogenated amorphous silicon is actually used for a semiconductor layer, a larger transistor and storage capacitance are needed, and thus the data writing time needs to be longer than that shown as the result in this example. The load of the whole pixel area is described below. A parasitic resistance Rgl of the gate line was 3.60 kΩ, a parasitic capacitance Cgl of the gate line was 255 pF, a parasitic resistance Rsl of the source line was 5.80 kΩ, a parasitic capacitance Csl of the source line was 147 pF, and a parasitic capacitance Cpix of the pixel was 216.6 fF.

Figure 37:
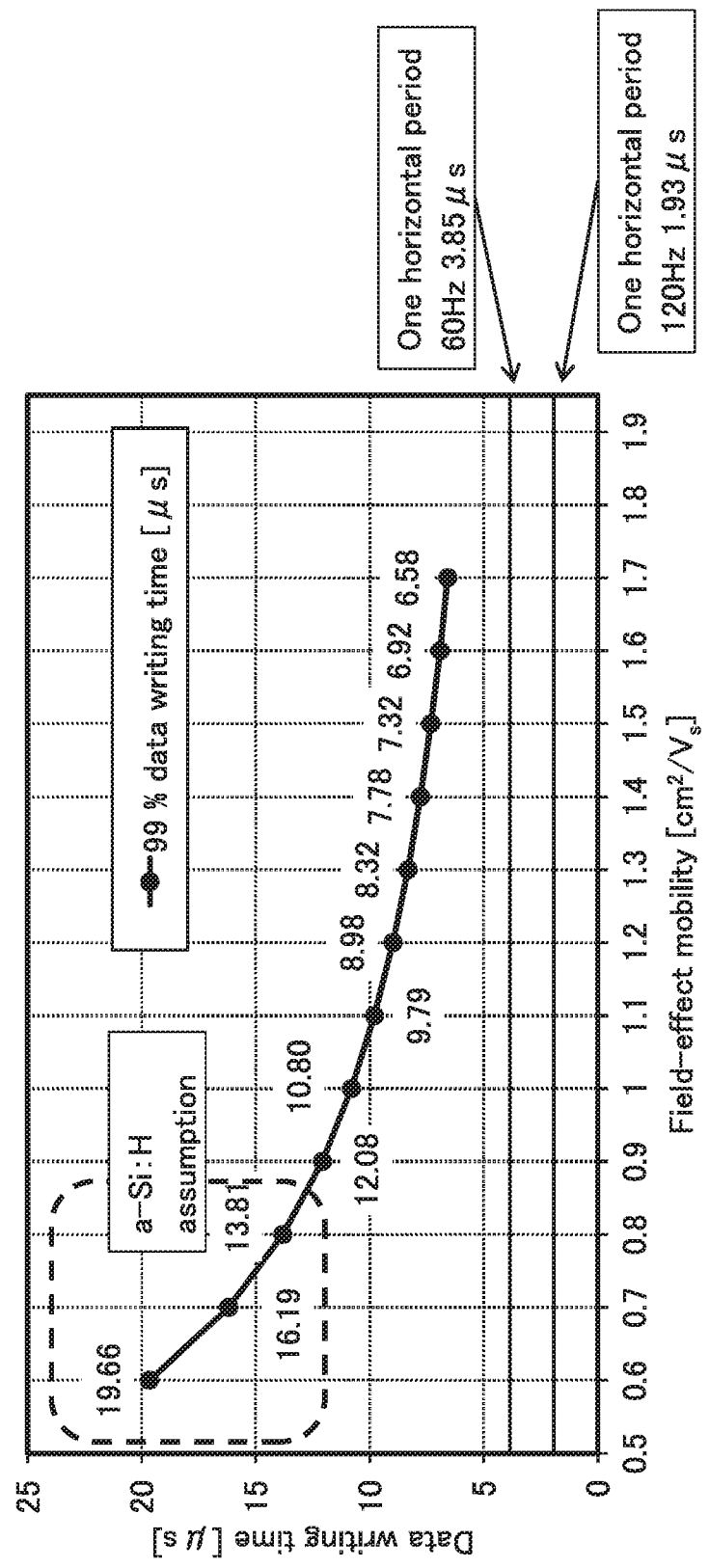
FIG. 37 Results of rough estimation of data writing time in Example 1.

The results of field-effect mobility of 0.6, 0.7, and 0.8 [cm$^2$/Vs] in FIG. 37 correspond to the case where hydrogenated amorphous silicon is used for a semiconductor layer. In that case, each data writing time was 19.66 μs, 16.19 μs, or 13.81 μs, which were longer than one horizontal period 1.93 μs in 120-Hz driving and one horizontal period 3.85 μs in 60-Hz driving; accordingly, it was estimated that not only 120-Hz driving but also 60-Hz driving was difficult.

<Case Where Two Pixels are Selected at a Time>

Figure 38A:
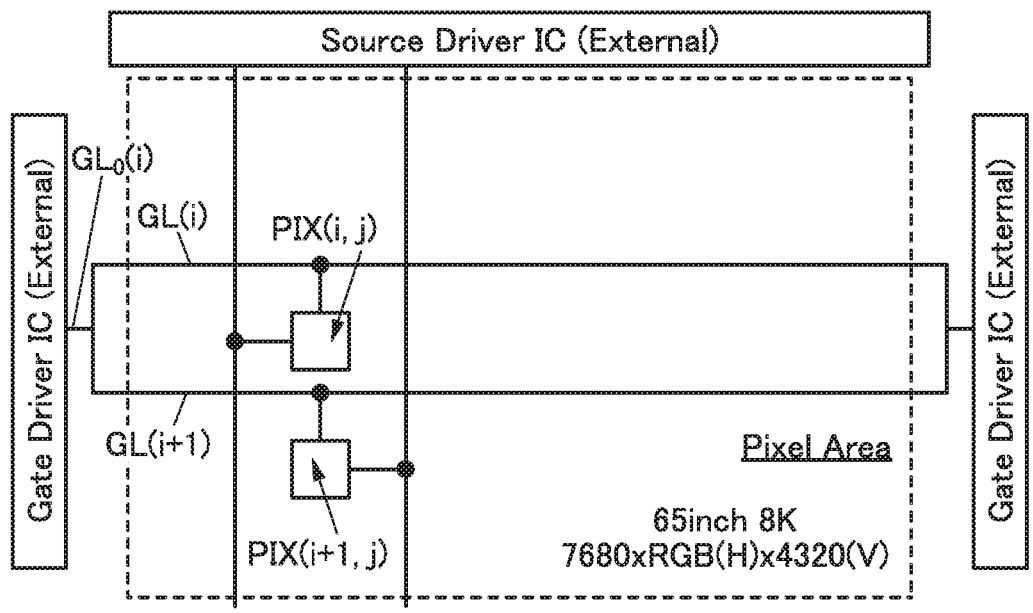
FIG. 38 A block diagram showing a display module in Example 1 and a circuit diagram showing a pixel in Example 1.

FIG. 38(A) is a block diagram showing a configuration of a display module used in this example. In this configuration, a selection signal is supplied to two gate lines at a time, and two pixels that adjoin in the column direction are selected at a time. A gate driver and a source driver are both external circuits. A gate line is supplied with the same signal from two gate driver ICs. The gate line $GL_0$(i) is electrically connected to the gate line GL(i) and the gate line GL(i+1), and pixels in two rows of the i-th row and the (i+1)-th row are driven at a time. A signal is supplied to a source line from one source driver IC. A pixel area is not divided. The pixel area has a diagonal of 65 inches, and the number of effective pixels is 7680×RGB (H)×4320 (V).

Figure 38B:
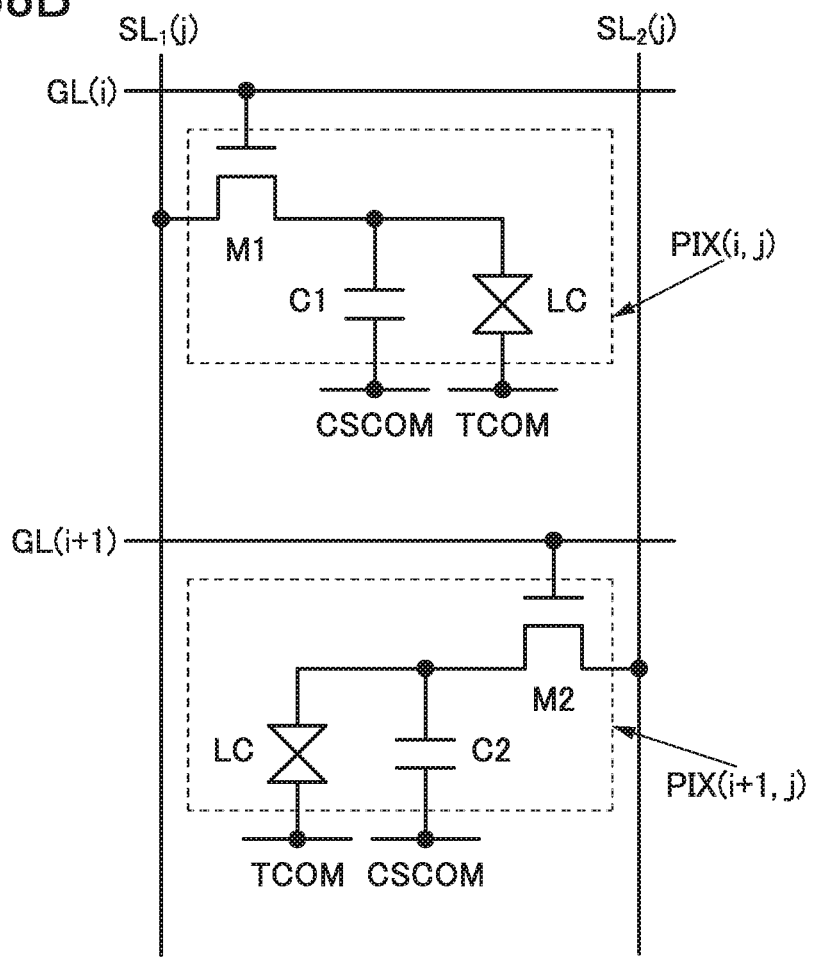

FIG. 38(B) is a circuit diagram showing the pixel PIX(i, j) and a pixel PIX(i+1, j).

First, a configuration of the pixel PIX(i, j) is described. The pixel PIX(i, j) includes the transistor M1, the capacitor C1, and the liquid crystal element LC. The gate of the transistor M1 is connected to the gate line GL(i). One of the source and the drain of the transistor M1 is connected to the source line $SL_1(j)$, and the other is connected to one electrode of the capacitor C1 and one electrode of the liquid crystal element LC. The other electrode of the capacitor C1 is connected to the wiring CSCOM. The other electrode of the liquid crystal element LC is connected to the wiring TCOM.

Next, a configuration of the pixel PIX(i+1, j) is described. The pixel PIX(i+1, j) includes a transistor M2, a capacitor C2, and the liquid crystal element LC. A gate of the transistor M2 is connected to the gate line GL(i+1). One of a source and a drain of the transistor M2 is connected to the source line $SL_2(j)$, and the other is connected to one electrode of the capacitor C2 and one electrode of the liquid crystal element LC. The other electrode of the capacitor C2 is connected to the wiring CSCOM. The other electrode of the liquid crystal element LC is connected to the wiring TCOM.

Figure 39A:
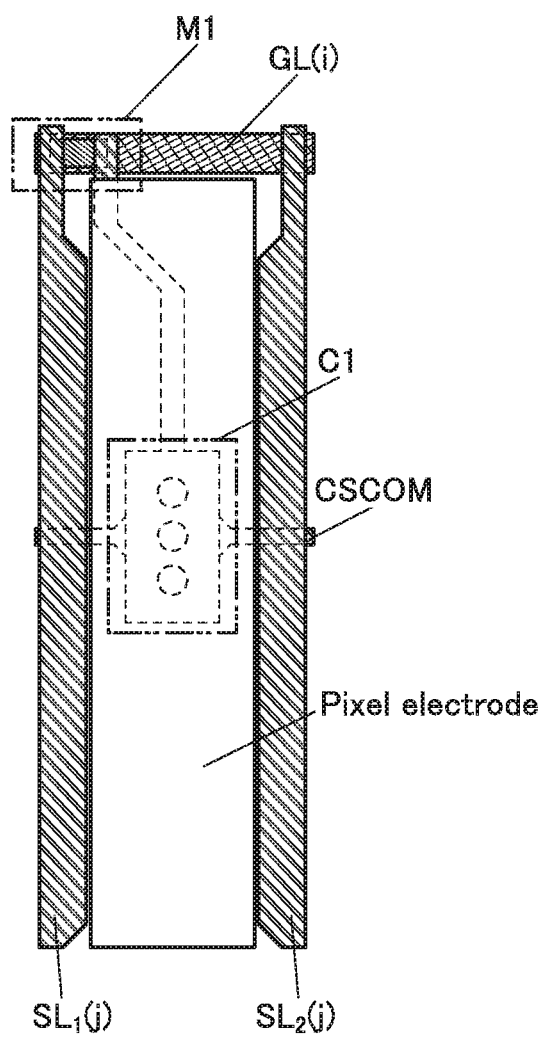
FIG. 39 Top views showing a pixel layout in Example 1.
Figure 39B:
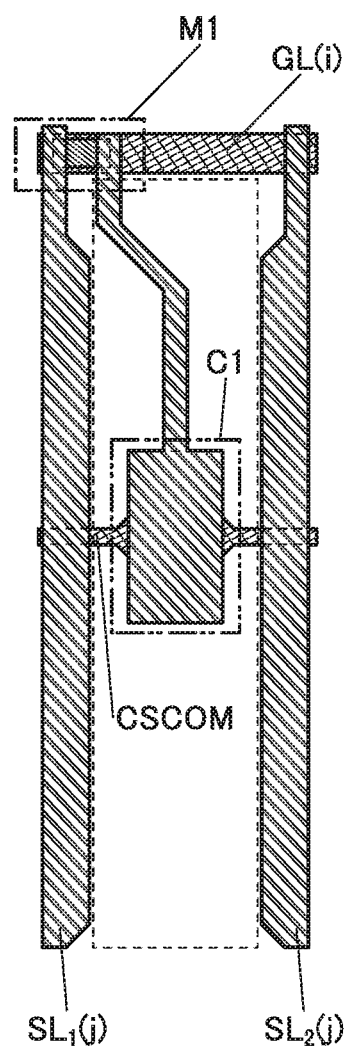

FIGS. 39(A) and (B) illustrate a pixel layout of a display module in which two pixels are selected at a time. FIG. 39(A) is a top view in which a stacked-layer structure including components from the gate line GL(i) to the pixel electrode is seen from the pixel electrode side. FIG. 39(B) is a top view in which the pixel electrode is omitted from FIG. 39(A).

The pixel size is 62.5 µm×187.5 µm. The transistor M1 is a channel-etched transistor with a bottom-gate top-contact structure. The transistor M1 has a channel length L of 4 µm, a channel width W of 8 µm, and an overlap LDD region $L_{ov}$ of 2 µm. The gate line GL(i) has a width of 10 µm, and the wiring CSCOM has a width of 3.5 µm. Each of the source line $SL_1(j)$ and the source line $SL_2(j)$ has a width of 10 µm, but has a width of 4 µm at a portion crossing the gate line. The aperture ratio is 37.3%.

First, rough estimation of data writing time in the case where a metal oxide is used for a semiconductor layer is described with reference to FIG. 40.

A period for charging a gate line of a pixel and a period for charging a source line and the pixel were roughly estimated in such a manner that the parasitic resistance and the parasitic capacitance were extracted from the pixel layout in FIG. 39(A) and only a parameter of the field-effect mobility of the transistor was changed. Here, a normalized value (normalized mobility) under a condition that the field-effect mobility in the case where a stacked layer of a metal oxide with an atomic ratio In:Ga:Zn=4:2:3 or the neighborhood thereof was used as a semiconductor layer was 1 was used. The transistor size was not changed. The load of the whole pixel area is described below. A parasitic resistance Rgl of the gate line was 3.60 kΩ, a parasitic capacitance Cgl of the gate line was 364 pF, a parasitic resistance Rsl of the source line was 4.83 kΩ, a parasitic capacitance Csl of the source line was 182 pF, and a parasitic capacitance Cpix of the pixel was 191 fF.

Figure 40:
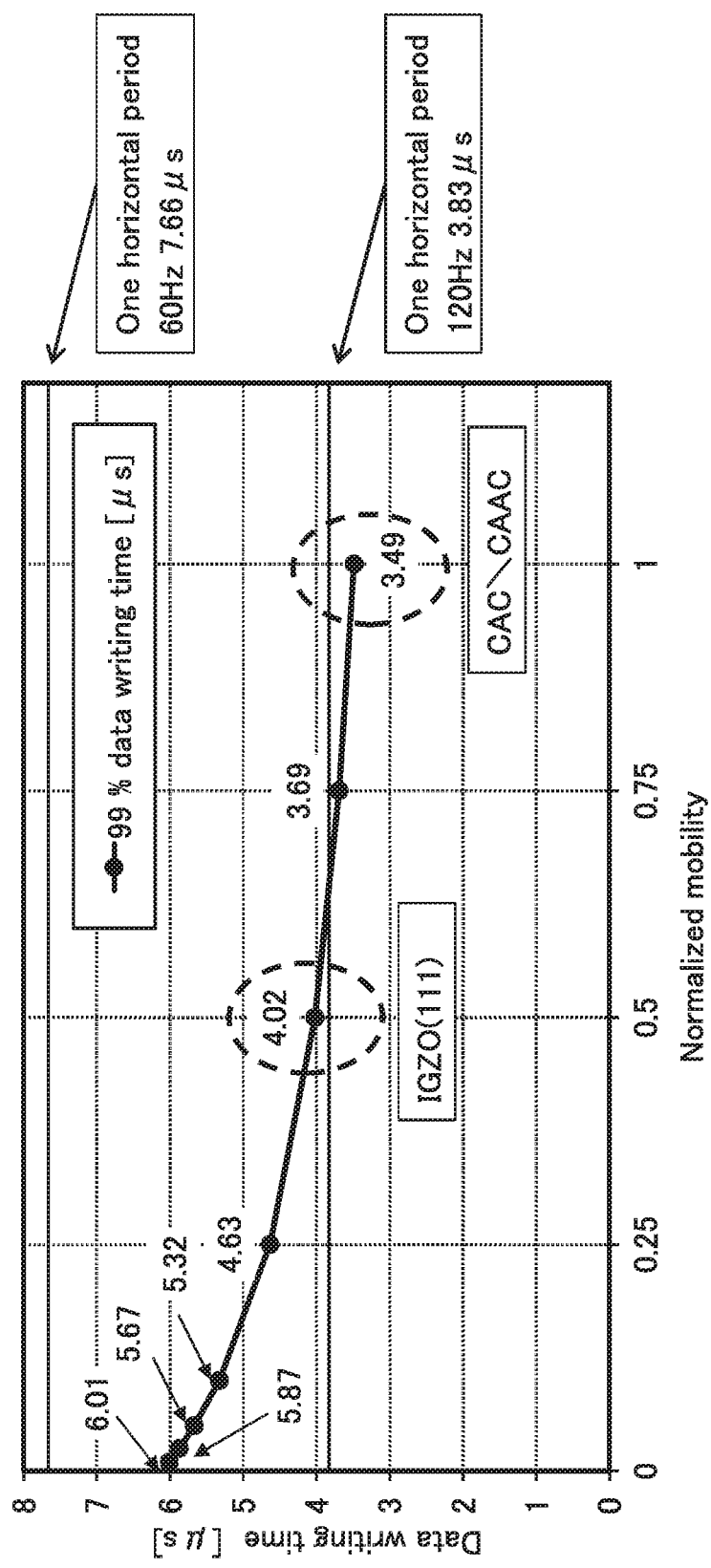
FIG. 40 Results of rough estimation of data writing time in Example 1.

The result of normalized mobility of 1 in FIG. 40 corresponds to the case where a stacked layer of a metal oxide with an atomic ratio In:Ga:Zn=4:2:3 or the neighborhood thereof is used as a semiconductor layer (denoted as "CAC\CAAC" in FIG. 40). In that case, the data writing time was 3.49 µs, which was shorter than one horizontal period 3.83 µs in 120-Hz driving; accordingly, it was estimated that 120-Hz driving could be performed.

The result of normalized mobility of 0.5 in FIG. 40 corresponds to the case where a single layer of a metal oxide with an atomic ratio In:Ga:Zn=1:1:1 or the neighborhood thereof is used as a semiconductor layer (denoted as "IGZO (111)" in FIG. 40). In that case, the data writing time was 4.02 µs, which was shorter than one horizontal period 7.66 µs in 60-Hz driving; accordingly, it was estimated that 60-Hz driving could be performed. This data writing time was longer than one horizontal period 3.83 µs in 120-Hz driving; accordingly, it was estimated that 120-Hz driving was difficult.

In FIG. 40, two gate lines are supplied with the same selection signal, so that the length of one horizontal period can be twice the length of one horizontal period in FIG. 36. Accordingly, a high-resolution display device can be operated easily with use of a transistor with a low field-effect mobility.

The results in FIG. 36 and FIG. 40 show that in the case where CAC\CAAC is used for a semiconductor layer, 120-Hz driving, which was difficult with the configuration in which writing was performed in pixels one by one, can be achieved with the configuration in which writing is performed in two pixels at a time.

The results in FIG. 36 and FIG. 40 show that in the case where IGZO(111) is used for a semiconductor layer, 60-Hz driving, which was difficult with the configuration in which writing was performed in pixels one by one, can be achieved with the configuration in which writing is performed in two pixels at a time.

Next, rough estimation of data writing time in the case where hydrogenated amorphous silicon is used for a semiconductor layer is described with reference to FIG. 41.

A period for charging a gate line of a pixel and a period for charging a source line and the pixel were roughly estimated in such a manner that the parasitic resistance and the parasitic capacitance were extracted from the pixel layout in FIG. 39(A) and the field-effect mobility of a design parameter was changed from the actually measured value of a transistor fabricated using microcrystalline silicon. The transistor size and storage capacitance were not changed. The load of the whole pixel area is described below. A parasitic resistance Rgl of the gate line was 3.60 kΩ, a parasitic capacitance Cgl of the gate line was 364 pF, a parasitic resistance Rsl of the source line was 4.83 kΩ, a parasitic capacitance Csl of the source line was 182 pF, and a parasitic capacitance Cpix of the pixel was 191 fF.

Figure 41:
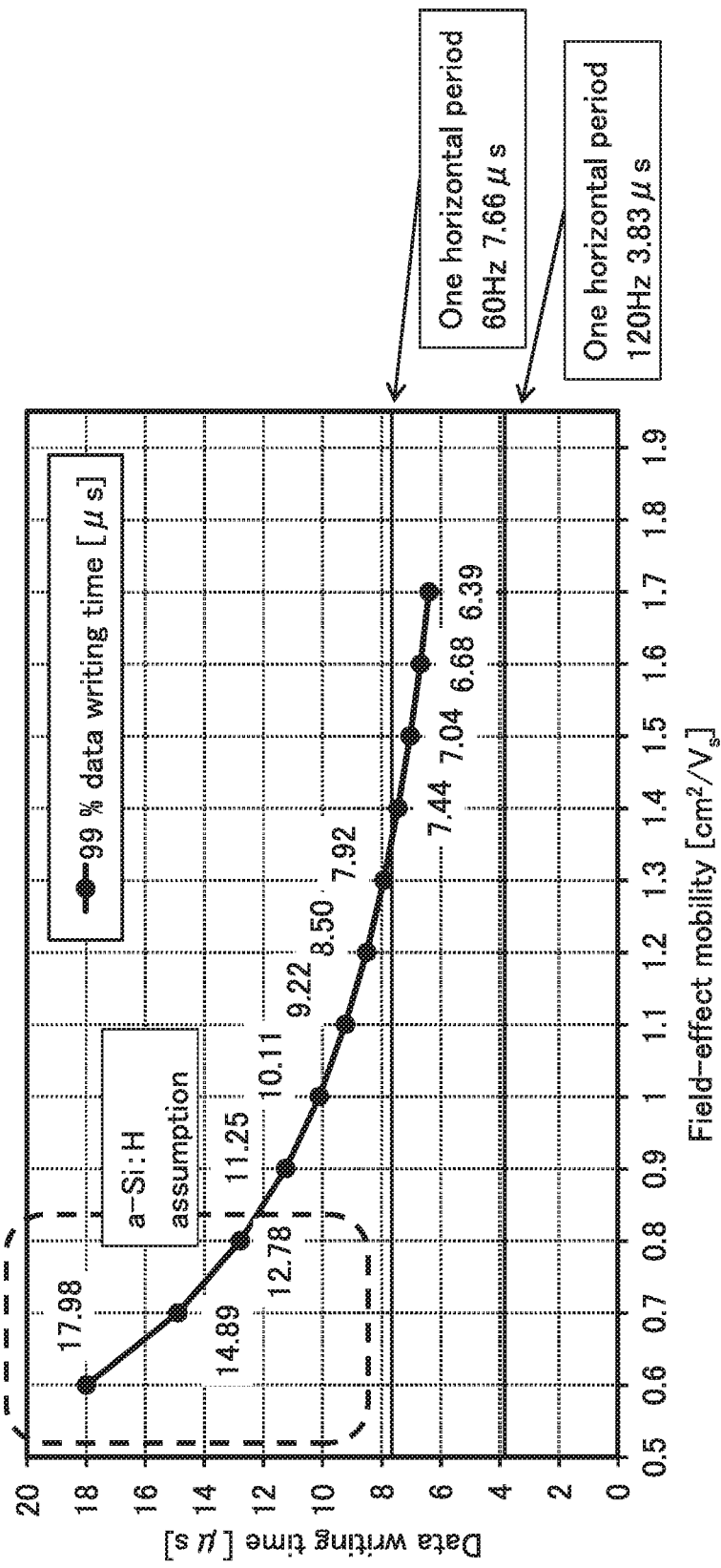
FIG. 41 Results of rough estimation of data writing time in Example 1.

The results of field-effect mobility of 0.6, 0.7, and 0.8 [$cm^2$/Vs] in FIG. 41 correspond to the case where hydrogenated amorphous silicon is used for a semiconductor layer. In that case, each data writing time was 17.98 µs, 14.89 µs, or 12.78 µs, which were longer than one horizontal period 3.83 µs in 120-Hz driving and one horizontal period 7.66 µs in 60-Hz driving; accordingly, it was estimated that not only 120-Hz driving but also 60-Hz driving was difficult.

From the result in FIG. 41, it was estimated that in the case where hydrogenated amorphous silicon was used for a semiconductor layer, 60-Hz driving was difficult even with the configuration in which writing was performed in two pixels at a time, which was different from the case where a metal oxide was used for a semiconductor layer (see the result in FIG. 40).

<Case where Four Pixels are Selected at a Time>

The block diagram illustrating the structure of the display module used in this example is the same as that illustrated in FIG. 1 except that only one source driver 13 is provided. The pixel area has a diagonal of 65 inches, and the number of effective pixels is 7680×RGB (H)×4320 (V). In addition, the circuit diagram of the pixel provided in the pixel area is the same as that in FIG. 7, and the pixel layout is the same as those in FIGS. 8(A) and (B).

The pixel size is 62.5 μm×187.5 μm. The transistors provided in the pixel are channel-etched transistors with a bottom-gate top-contact structure and have the same size. Specifically, each of the transistors provided in the pixel has a channel length L of 4 μm, a channel width W of 8 μm, and an overlap LDD region $L_{ov}$ of 3 μm. Each gate line has a width of 10 μm, and each wiring CS has a width of 5 μm. Each source line has a width of 4 μm. The aperture ratio is 29%.

First, rough estimation of data writing time in the case where a metal oxide is used for a semiconductor layer is described with reference to FIG. 42.

A period for charging a gate line of a pixel and a period for charging a source line and the pixel were roughly estimated in such a manner that the parasitic resistance and the parasitic capacitance were extracted from the pixel layout in FIG. 8, and only a parameter of the mobility was changed. Here, a normalized value (normalized mobility) under a condition that the field-effect mobility in the case where a stacked layer of a metal oxide with an atomic ratio In:Ga:Zn=4:2:3 or the neighborhood thereof was used as a semiconductor layer was 1 was used. The transistor size was not changed. The load of the whole pixel area is described below. A parasitic resistance Rgl of the gate line was 3.53 kΩ, a parasitic capacitance Cgl of the gate line was 518 pF, a parasitic resistance Rsl of the source line was 10.28 kΩ, a parasitic capacitance Csl of the source line was 170 pF, and a parasitic capacitance Cpix of the pixel was 99.7 fF.

Figure 42:
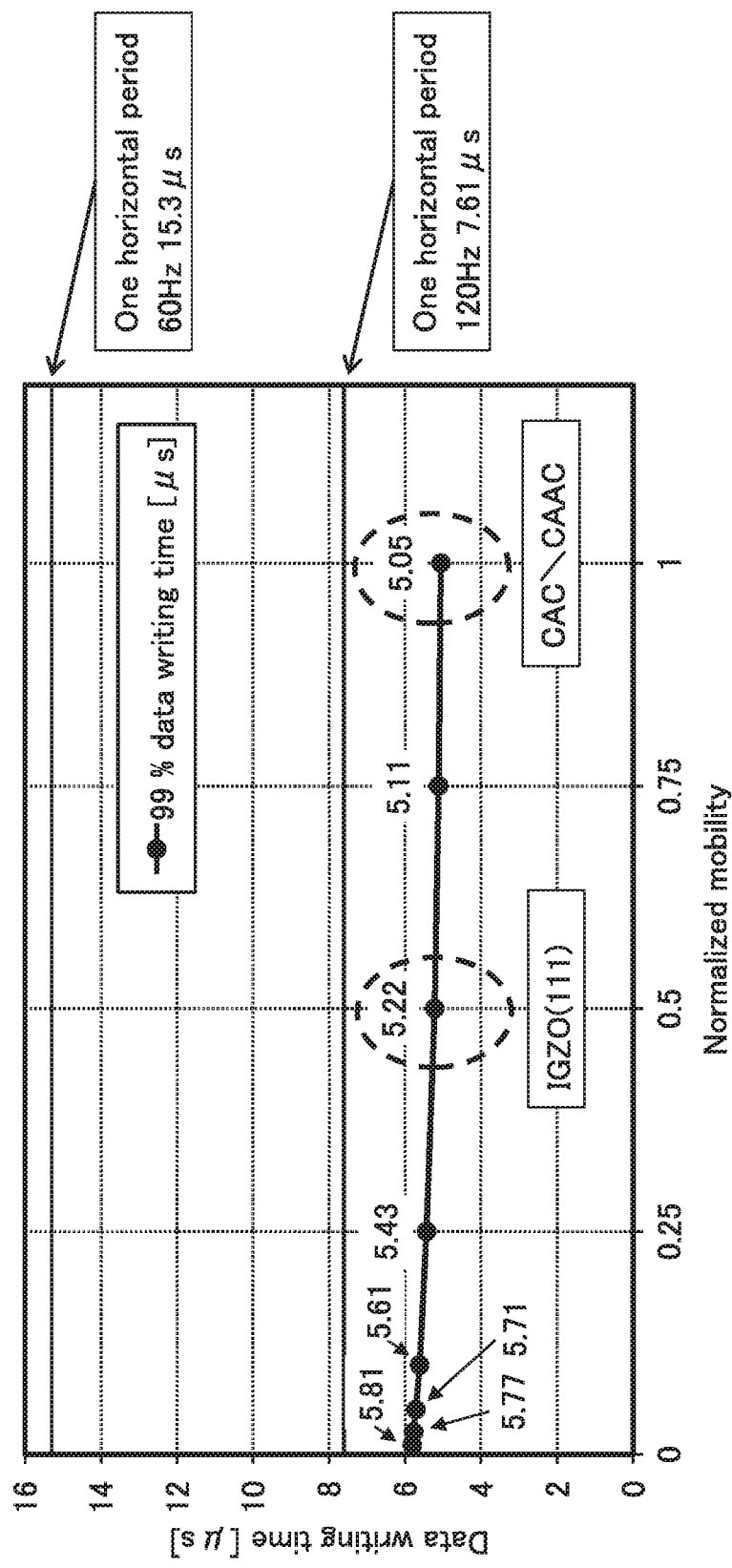
FIG. 42 Results of rough estimation of data writing time in Example 1.

The result of normalized mobility of 1 in FIG. 42 corresponds to the case where a stacked layer of a metal oxide with an atomic ratio In:Ga:Zn=4:2:3 or the neighborhood thereof is used as a semiconductor layer (denoted as "CAC\CAAC" in FIG. 42). In that case, the data writing time was 5.05 μs, which was shorter than one horizontal period 7.61 μs in 120-Hz driving; accordingly, it was estimated that 120-Hz driving could be performed.

The result of normalized mobility of 0.5 in FIG. 42 corresponds to the case where a single layer of a metal oxide with an atomic ratio In:Ga:Zn=1:1:1 or the neighborhood thereof is used as a semiconductor layer (denoted as "IGZO (111)" in FIG. 42). In that case, the data writing time was 5.22 μs, which was shorter than one horizontal period 7.61 μs in 120-Hz driving; accordingly, it was estimated that 120-Hz driving could be performed.

In FIG. 42, four gate lines are supplied with the same selection signal, so that the length of one horizontal period can be four times the length of one horizontal period in FIG. 36. Accordingly, a high-resolution display device can be operated easily with use of a transistor with a low field-effect mobility.

The result in FIG. 42 shows that 120-Hz driving can be achieved with the configuration in which writing is performed in four pixels at a time, even when IGZO(111) whose mobility is lower than that of CAC\CAAC is used for a semiconductor layer.

Next, rough estimation of data writing time in the case where hydrogenated amorphous silicon is used for a semiconductor layer is described with reference to FIG. 43.

A period for charging a gate line of a pixel and a period for charging a source line and the pixel were roughly estimated in such a manner that the parasitic resistance and the parasitic capacitance were extracted from the pixel layout in FIG. 8 and the field-effect mobility of a design parameter was changed from the actually measured value of a transistor fabricated using microcrystalline silicon. The transistor size and storage capacitance were not changed. The load of the whole pixel area is described below. A parasitic resistance Rgl of the gate line was 3.53 kΩ, a parasitic capacitance Cgl of the gate line was 518 pF, a parasitic resistance Rsl of the source line was 10.28 kΩ, a parasitic capacitance Csl of the source line was 170 pF, and a parasitic capacitance Cpix of the pixel was 99.7 fF.

Figure 43:
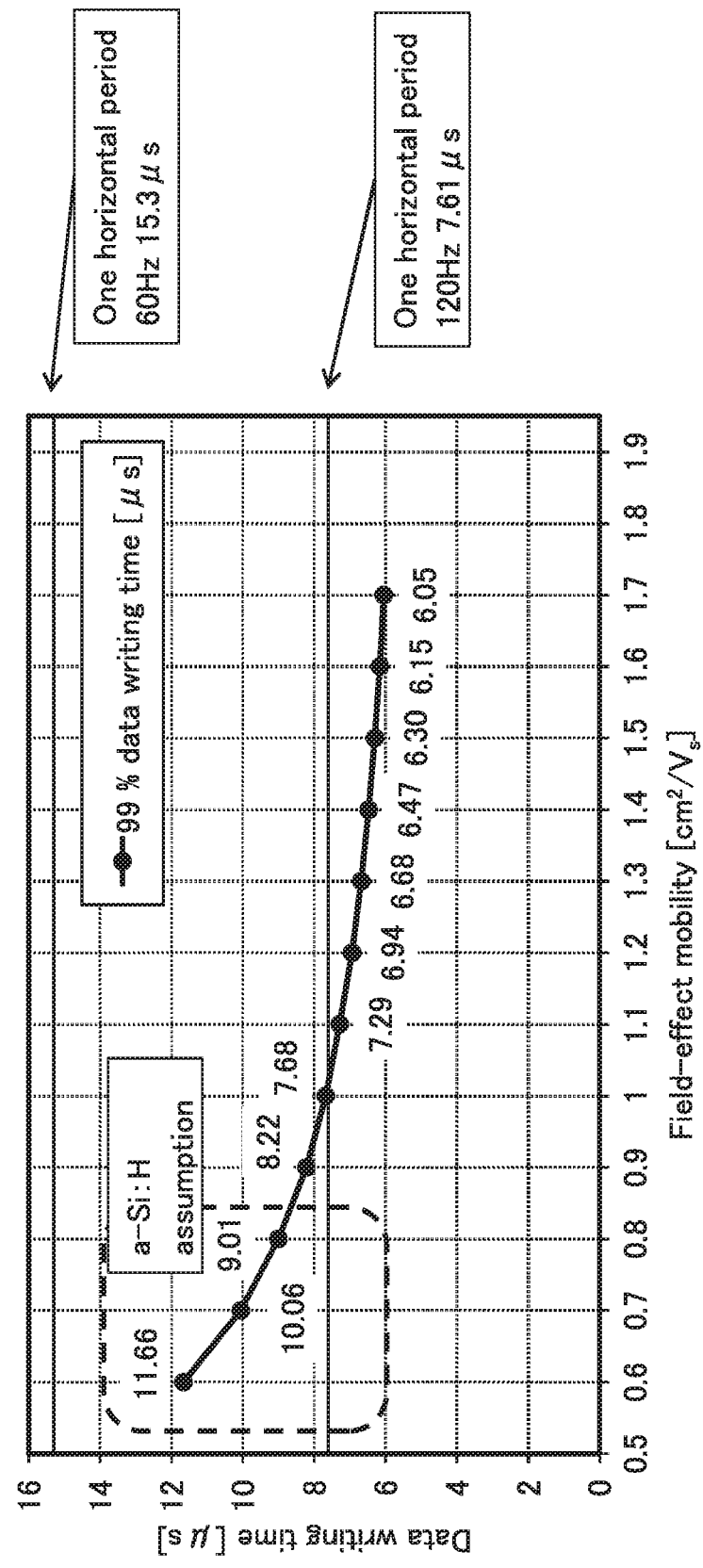
FIG. 43 Results of rough estimation of data writing time in Example 1.

The results of field-effect mobility of 0.6, 0.7, and 0.8 [$cm^2$/Vs] in FIG. 43 correspond to the case where hydrogenated amorphous silicon is used for a semiconductor layer. In that case, each data writing time was 11.66 μs, 10.06 μs, or 9.01 μs, which was shorter than one horizontal period 15.3 μs in 60-Hz driving; accordingly, it was estimated that 60-Hz driving could be performed. The data writing time was longer than one horizontal period 7.61 μs in 120-Hz driving; accordingly, it was estimated that 120-Hz driving was difficult.

The results in FIG. 37, FIG. 41, and FIG. 43 show that 60-Hz driving can be achieved with the configuration in which writing is performed in four pixels at a time, in the case where hydrogenated amorphous silicon is used for a semiconductor layer.

As described above, it was estimated that a large-sized high-resolution display, such as a display with a diagonal of 65 inches and a resolution of 8K4K, could be operated by using one embodiment of the present invention, even when hydrogenated amorphous silicon is used for a semiconductor layer of a transistor.

REFERENCE NUMERALS 10 display device
11 pixel
12a gate driver
12b gate driver
13 source driver
13a source driver
13b source driver
14 substrate
15 substrate
16 reference voltage generation circuit
16a reference voltage generation circuit
16b reference voltage generation circuit
17 display portion
18a protective circuit
18b protective circuit
19a protective circuit
19b protective circuit
20 liquid crystal element
21 conductive layer
22 liquid crystal
23 conductive layer
24a alignment film
24b alignment film
26 insulating layer
30 transistor
31 conductive layer
31a conductive layer
32 semiconductor layer
32p semiconductor layer
33 conductive layer
33a conductive layer
33b conductive layer
33c conductive layer
34 insulating layer
35 impurity semiconductor layer 37 semiconductor layer
38 opening portion
39a polarizing plate
39b polarizing plate
41 coloring layer
42 light-blocking layer
50 light
51 conductive layer
52 conductive layer
53 conductive layer
54 conductive layer
55 conductive layer
60 capacitor
71 opening portion
72 opening portion
73 opening portion
74 opening portion
81 insulating layer
82 insulating layer
84 insulating layer
90 backlight unit
121a TAB tape
121b TAB tape
131a printed board
131b printed board
132a TAB tape
132b TAB tape
200a transistor
200b transistor
200c transistor
200d transistor
200e transistor
200f transistor
211 insulating layer
212 insulating layer
212a insulating layer
212b insulating layer
212c insulating layer
212d insulating layer
215 insulating layer
216 insulating layer
216a insulating layer
221 conductive layer
222a conductive layer
222a_1 conductive layer
222a_2 conductive layer
222a_3 conductive layer
222b conductive layer
222b_1 conductive layer
222b_2 conductive layer
222b_3 conductive layer
223 conductive layer
224 insulating layer
231 semiconductor layer
231_1 semiconductor layer
231_2 semiconductor layer
231d drain region
231i channel formation region
231s source region
235 opening portion
236a opening portion
236b opening portion
237 opening portion
238a opening portion
238b opening portion
812 moving mechanism
813 moving mechanism
815 stage
816 ball screw mechanism
820 laser
821 optical system unit
822 mirror
823 microlens array
824 mask
825 laser light
826 laser light
827 laser beam
830 substrate
840 amorphous silicon layer
841 polycrystalline silicon layer
7000 display portion
7100 television device
7101 housing
7103 stand
7111 remote controller
7200 laptop personal computer
7211 housing
7212 keyboard
7213 pointing device
7214 external connection port
7300 digital signage
7301 housing
7303 speaker
7311 information terminal
7400 digital signage
7401 pillar
7411 information terminal

The invention claimed is:

1. A display device comprising:
a first wiring, a second wiring, a third wiring, a transistor, a first conductive layer, a second conductive layer, a third conductive layer, and a pixel electrode,
wherein the first wiring extends in a first direction,
wherein the second wiring and the third wiring each extend in a second direction intersecting with the first direction,
wherein a gate of the transistor is electrically connected to the first wiring,
wherein one of a source and a drain of the transistor is electrically connected to the second wiring through the first conductive layer, the second conductive layer, and the third conductive layer,
wherein the second conductive layer comprises a region overlapping with the third wiring,
wherein the first conductive layer, the third conductive layer, and the pixel electrode comprise the same material,
wherein the first wiring and the second conductive layer comprise the same material,
wherein the first wiring is supplied with a selection signal, and
wherein the second wiring and the third wiring are supplied with different signals.

2. The display device according to claim 1, further comprising a first source driver and a second source driver electrically connected to the second wiring and the third wiring.

3. The display device according to claim 1, wherein the transistor comprises a first semiconductor layer comprising amorphous silicon.

4. The display device according to claim 1, wherein the transistor comprises a first semiconductor layer comprising microcrystalline silicon or polycrystalline silicon.

5. The display device according to claim 1, wherein the transistor comprises a first semiconductor layer comprising a metal oxide.

6. The display device according to claim 5,
wherein the metal oxide contains indium, zinc, and M, and
wherein the M is aluminum, titanium, gallium, germanium, yttrium, zirconium, lanthanum, cerium, tin, neodymium, or hafnium.

7. The display device according to claim 1,
wherein the first wiring is a gate line, and
wherein the second wiring and the third wiring are a first source line and a second source line, respectively.

8. A display device comprising:
a first wiring, a second wiring, a third wiring, a transistor, a first conductive layer, a second conductive layer, a third conductive layer, a pixel electrode, a first insulating layer, and a second insulating layer,
wherein the first wiring extends in a first direction,
wherein the second wiring and the third wiring each extend in a second direction intersecting with the first direction,
wherein a gate of the transistor is electrically connected to the first wiring,
wherein one of a source and a drain of the transistor is electrically connected to the second wiring through the first conductive layer, the second conductive layer, and the third conductive layer,
wherein the second conductive layer comprises a region overlapping with the third wiring,
wherein the first conductive layer, the third conductive layer, and the pixel electrode comprise the same material,
wherein the first wiring and the second conductive layer comprise the same material,
wherein the first conductive layer is in contact with the one of the source and the drain of the transistor through a first opening portion in the second insulating layer and in contact with the second conductive layer through a second opening portion in the first insulating layer and the second insulating layer, and
wherein the third conductive layer is in contact with the second conductive layer through a third opening portion in the first insulating layer and the second insulating layer and in contact with the second wiring through a fourth opening portion of the second insulating layer.

9. The display device according to claim 8, further comprising a first source driver and a second source driver electrically connected to the second wiring and the third wiring.

10. The display device according to claim 8, wherein the transistor comprises a first semiconductor layer comprising amorphous silicon.

11. The display device according to claim 8, wherein the transistor comprises a first semiconductor layer comprising microcrystalline silicon or polycrystalline silicon.

12. The display device according to claim 8, wherein the transistor comprises a first semiconductor layer comprising a metal oxide.

13. The display device according to claim 12,
wherein the metal oxide contains indium, zinc, and M, and
wherein the M is aluminum, titanium, gallium, germanium, yttrium, zirconium, lanthanum, cerium, tin, neodymium, or hafnium.

14. The display device according to claim 8,
wherein the first wiring is a gate line, and
wherein the second wiring and the third wiring are a first source line and a second source line, respectively.

* * * * *